(12) United States Patent
Choo et al.

(10) Patent No.: US 12,550,684 B2
(45) Date of Patent: Feb. 10, 2026

(54) SEMICONDUCTOR DEVICE INCLUDING DETECTION STRUCTURE

(71) Applicant: SAMSUNG ELECTRONICS CO., LTD., Suwon-si (KR)

(72) Inventors: Gyosoo Choo, Suwon-si (KR); Daeseok Byeon, Suwon-si (KR); Sunghun Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 478 days.

(21) Appl. No.: 18/139,707

(22) Filed: Apr. 26, 2023

(65) Prior Publication Data

US 2024/0153830 A1 May 9, 2024

(30) Foreign Application Priority Data

Nov. 4, 2022 (KR) .................. 10-2022-0145751

(51) Int. Cl.
*H01L 21/66* (2006.01)
*G01R 31/26* (2020.01)
*H10B 80/00* (2023.01)

(52) U.S. Cl.
CPC .......... *H01L 22/34* (2013.01); *G01R 31/2607* (2013.01); *H10B 80/00* (2023.02)

(58) Field of Classification Search
CPC ......... H01L 22/34; H01L 22/32; H10B 80/00; G01R 31/2607
See application file for complete search history.

(56) References Cited

U.S. PATENT DOCUMENTS

| | | | |
|---|---|---|---|
| 7,683,627 | B2 | 3/2010 | Tsukuda |
| 8,624,242 | B2 | 1/2014 | Kojima et al. |
| 10,788,528 | B2 | 9/2020 | Kwon et al. |
| 10,811,327 | B2 | 10/2020 | Munder et al. |
| 11,062,966 | B2 | 7/2021 | Lee et al. |

(Continued)

FOREIGN PATENT DOCUMENTS

| | | |
|---|---|---|
| JP | 3-1439 U | 1/1991 |
| JP | 7-29955 A | 1/1995 |
| JP | 5174505 B2 | 4/2013 |

OTHER PUBLICATIONS

Communication issued on Apr. 9, 2024 by the European Patent Office for European Patent Application No. 23181201.7.

*Primary Examiner* — Thao P Le
(74) *Attorney, Agent, or Firm* — Sughrue Mion, PLLC

(57) ABSTRACT

A semiconductor device includes a semiconductor die, a detection structure, a path control circuit and a detection circuit. The semiconductor die includes a central region in which a semiconductor integrated circuit is provided and an external region surrounding the central region. The detection structure is provided in the external region. The path control circuit includes a plurality of switches that controls electrical connection of the detection structure. The detection circuit determines whether a defect is present in the semiconductor die and a location of the defect based on a difference signal. The difference signal corresponds to a difference between a forward direction test output signal and a backward direction test output signal obtained by propagating a test input signal through the detection structure in a forward direction and a backward direction, respectively, via the path control circuit.

20 Claims, 37 Drawing Sheets

(56) References Cited

U.S. PATENT DOCUMENTS

| | | |
|---|---|---|
| 11,300,610 B1 | 4/2022 | Tang |
| 11,417,408 B2 | 8/2022 | Son |
| 2019/0265291 A1 | 8/2019 | Kwon et al. |
| 2020/0091021 A1 | 3/2020 | Lee et al. |
| 2020/0144139 A1 | 5/2020 | Munder et al. |
| 2022/0036958 A1 | 2/2022 | Son |
| 2025/0300026 A1* | 9/2025 | Wakisaka .......... H01L 23/49816 |
| 2025/0301635 A1* | 9/2025 | Simsek-Ege ............ H01L 24/08 |
| 2025/0301636 A1* | 9/2025 | Simsek-Ege ........... H10B 80/00 |
| 2025/0301642 A1* | 9/2025 | Gyakushi ................ H01L 25/18 |
| 2025/0301646 A1* | 9/2025 | Yamaguchi ......... H01L 25/0657 |
| 2025/0301654 A1* | 9/2025 | Gyakushi ............... H10B 43/27 |

* cited by examiner $\triangle tPD = tPD1 - tPD2$

| DEFECT | RESISTANCE | | | | △tPD |
|---|---|---|---|---|---|
| | R1 | R2 | R3 | R4 | |
| CSG11 | RV1 | RV2 | RV2 | RV2 | PD1 |
| CSG12 | RV2 | RV1 | RV2 | RV2 | PD2 |
| CSG13 | RV2 | RV2 | RV1 | RV2 | -PD2 |
| CSG14 | RV2 | RV2 | RV2 | RV1 | -PD1 |
| NORMAL | RV2 | RV2 | RV2 | RV2 | 0 |

RV1>RV2>0  PD1>PD2>0

SEMICONDUCTOR DEVICE INCLUDING DETECTION STRUCTURE

CROSS-REFERENCE TO RELATED APPLICATION

This application claims priority to Korean Patent Application No. 10-2022-0145751, filed on Nov. 4, 2022, in the Korean Intellectual Property Office, the disclosure of which is incorporated by reference herein in its entirety.

BACKGROUND

1. Field

Example embodiments generally relate to semiconductor integrated circuits, and more particularly to a semiconductor device including a detection structure.

2. Related Art

Integrated circuits may be manufactured by repeatedly forming patterns in a wafer of semiconductor material. The wafer may be cut or diced into a plurality of semiconductor dies, and the respective semiconductor dies may be packaged into a semiconductor chip. Cracks may occur in the semiconductor die during the cutting and packaging processes. To reduce yield of defective products, the semiconductors are inspected to detect the defects such as cracks.

SUMMARY

Some example embodiments may provide a semiconductor device including a detection structure capable of detecting various defects.

According to some example embodiments, a semiconductor device includes a semiconductor die, a detection structure, a path control circuit and a detection circuit. The semiconductor die includes: a semiconductor die comprising a central region in which a semiconductor integrated circuit is provided and an external region surrounding the central region; a detection structure provided in the external region; a path control circuit comprising a plurality of switches configured to control electrical connections of the detection structure; and a detection circuit configured to determine whether a defect is present in the semiconductor die and a location of the defect based on a difference signal, the difference signal corresponding to a difference between a forward direction test output signal and a backward direction test output signal obtained by propagating a test input signal through the detection structure in a forward direction and a backward direction, respectively, via the path control circuit.

According to some example embodiments, a semiconductor device includes: a first semiconductor die stacked on a second semiconductor die, each of the first semiconductor die and the second semiconductor die comprising a central region and an external region surrounding the central region; a memory cell structure provided in the central region of the first semiconductor die; a peripheral circuit provided in the central region of the second semiconductor die and extending in a first direction and a second direction; a first detection structure provided in the central region of the second semiconductor die and surrounding each of a first sub circuit region and a second sub circuit region which are spaced apart from each other in the second direction in the peripheral circuit; a first path control circuit comprising a plurality of first switches configured to control electrical connections of the first detection structure; and a detection circuit configured to determine whether a defect is present in the semiconductor device based on a difference signal, the difference signal corresponding to a difference between a forward direction test output signal and a backward direction test output signal obtained by propagating a test input signal through the first detection structure in a forward direction and a backward direction, respectively, via the first path control circuit.

According to some example embodiments, a semiconductor device including a plurality of chips are bonded to each other, includes: a chip region; a scribe lane along an edge of the chip region; a dam structure between the chip region and the scribe lane; a detection structure extending from the chip region to the scribe lane through the dam structure, the detection structure forming an annular shape in the scribe lane; a path control circuit comprising a plurality of switches configured to control electrical connections of the detection structure; and a detection circuit provided in the chip region, wherein the detection circuit is configured to determine whether a defect is present in the scribe lane and a location of the defect based on a difference signal corresponding to a difference between a forward direction test output signal and a backward direction test output signal obtained by propagating a test input signal through the detection structure in a forward direction and a backward direction, respectively, via the path control circuit.

Semiconductor devices according to example embodiments may determine whether a defect is present in the semiconductor die and a location of the defect based on a difference between a forward direction test output signal and a backward direction test output signal obtained by propagating a test input signal through the detection structure in a forward direction and a backward direction, respectively, may detect a progressive fault due to separation phenomenon and thus may reduce shipment of defective products.

BRIEF DESCRIPTION OF DRAWINGS

The above and other objects and features will be more clearly understood from the following description, taken in conjunction with the accompanying drawings.

DETAILED DESCRIPTION

Figure 1:
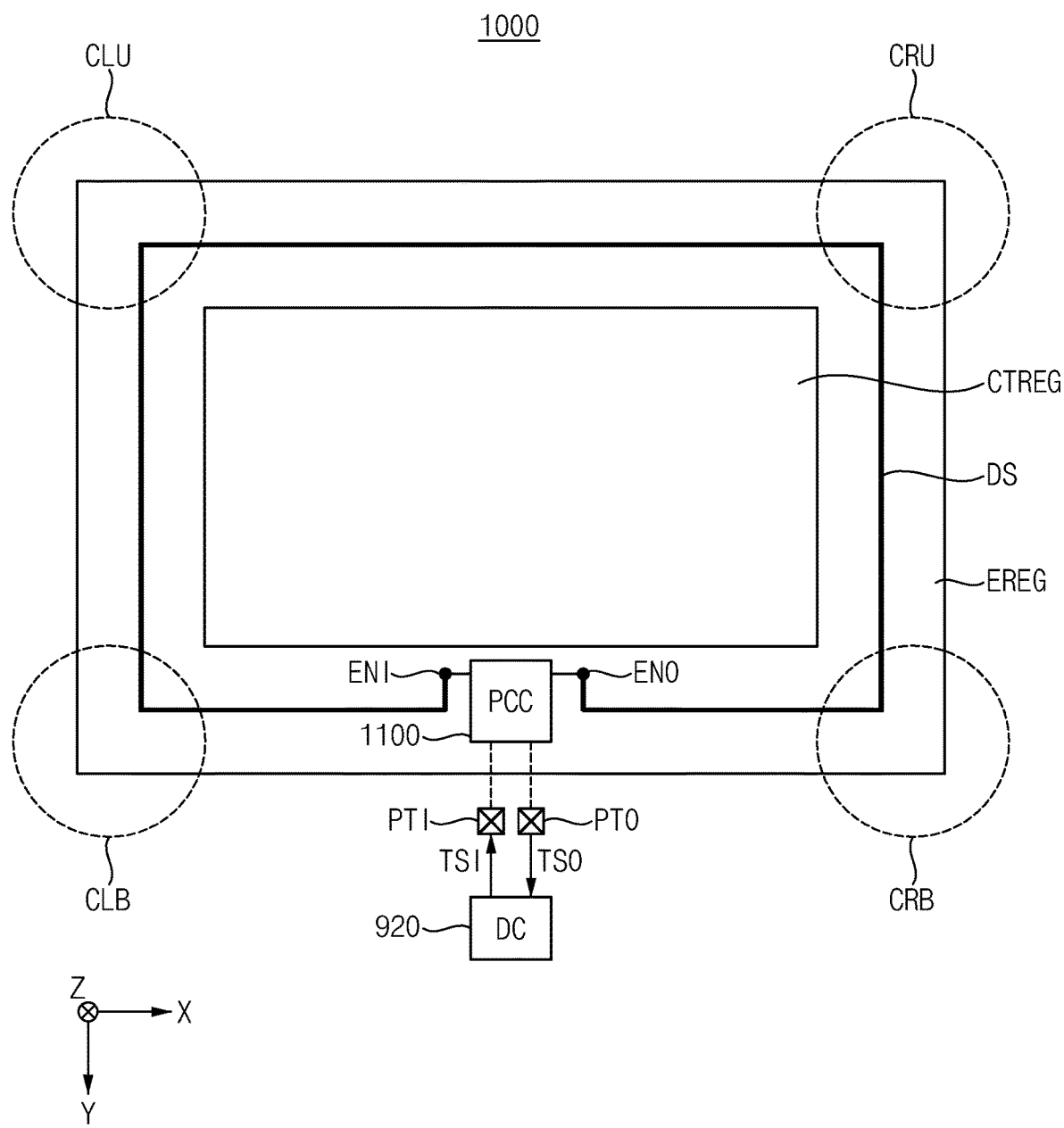
FIG. 1 is a top view illustrating a layout of a semiconductor device according to example embodiments.

Various example embodiments will be described more fully hereinafter with reference to the accompanying drawings, in which some example embodiments are shown. In the drawings, like numerals refer to like elements throughout. The repeated descriptions may be omitted. Each example embodiment provided in the following description is not excluded from being associated with one or more features of another example or another example embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be also understood that, even if a certain step or operation of manufacturing an apparatus or structure is described later than another step or operation, the step or operation may be performed later than the other step or operation unless the other step or operation is described as being performed after the step or operation.

FIG. 1 is a top view illustrating a layout of a semiconductor device according to example embodiments.

Referring to FIG. 1, a semiconductor device 1000 may include at least one semiconductor die. The semiconductor die may include a central region CTREG and an external region EREG surrounding the central region CTREG.

Various semiconductor integrated circuits may be formed in the central region CTREG depending on a kind or type of the semiconductor device 1000. For example, the semiconductor device 1000 may be a nonvolatile memory device and a memory integrated circuit may be formed in the central region CTREG of the semiconductor die.

A detection structure DS in a annular shape according to example embodiments for detecting defects such as cracks may be formed in the external region EREG. A path control circuit PCC 1100 may be electrically connected to the detection structure DS through an input end node ENI and an output end node ENO.

A detection circuit DC 920 may apply a test input signal TSI to the detection structure DS via a test input pad PTI and the path control circuit 1100, may receive a test output signal TSO responding to the test input signal TSI, from the detection structure DS via a test output pad PTO and the path control circuit 1100, and may determine whether a defect is present in the semiconductor die and a location of the defect based on the test output signal TSO.

The detection circuit 910 may determine whether the defect is present in the semiconductor die and the location of the defect based on a difference signal corresponding to a difference between a forward direction test output signal and a backward direction test output signal obtained by propagating the test input signal TSI through the detection structure DS in a forward direction and a backward direction, respectively, via the path control circuit 1100. The defect may include at least one of a short circuit, a crack, a progressive fault, a bonding fault and a separation phenomenon.

In example embodiments, the difference signal may indicate one of a difference of propagation delay of the pulse, a difference of an amplitude of the DC voltage, a difference of propagation delay of the pulse based on operating of the semiconductor device and a difference of an amplitude of the DC voltage based on the operating of the semiconductor device.

The detection structure DS may include a first conduction segment passing through a left-bottom corner region CLB of the external region EREG, a second conduction segment passing through a left-upper corner region CLU of the external region EREG, a third conduction segment passing through a right-upper corner region CRU of the external region EREG and a fourth conduction segment passing through a right-bottom corner region CRB of the external region EREG.

Hereinafter, example embodiments are described using an orthogonal set of an X direction, a Y direction and a Z direction for convenience of illustration and description. The X direction, the Y direction and the Z direction are used to indicate three perpendicular directions along the three directions, and are not limited to particular directions. The X direction corresponds to a first horizontal direction or a row direction, the Y direction corresponds to a second horizontal direction or a column direction and the Z direction corresponds to a vertical direction. Unless clearly indicated otherwise, the Z direction indicates a vertical direction perpendicular to conduction layers.

In this disclosure, "upper", "bottom", "left" and "right" are used not to represent particular fixed positions but to represent relative positions. Accordingly example embodiments may include structures of bilateral symmetry, structures of top and bottom symmetry, rotated structures and the like with respect to the defect detection structure CDST disclosed herein.

Figure 2:
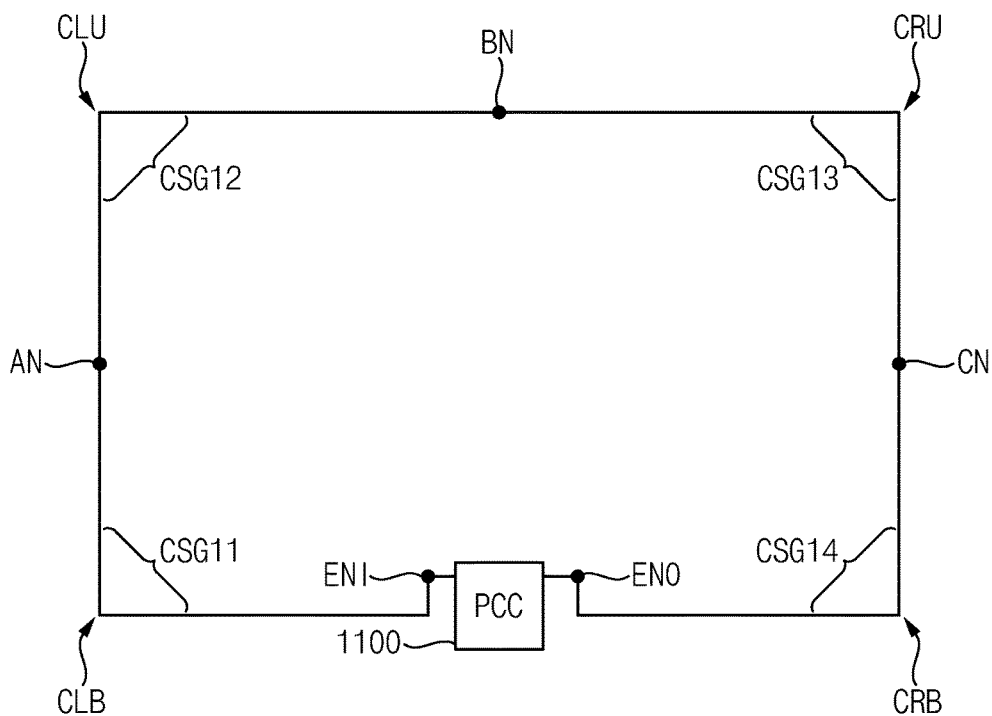
FIG. 2 is a top view illustrating the detection structure in FIG. 1 according to example embodiments.

FIG. 2 is a top view illustrating the detection structure in FIG. 1 according to example embodiments.

In FIG. 2, the path control circuit 1100 is also illustrated for convenience of explanation.

Referring to FIG. 2, the detection structure DS may include a first conduction segment CSG11, a second conduction segment CSG12, a third conduction segment CSG13 and a fourth conduction segment CSG14.

The first conduction segment CSG11 may be connected to the path control circuit 1100 through the input end node ENI and may pass through the left-bottom corner region CLB of the external region EREG. The second conduction segment VSG12 may be connected to the first conduction segment CSG11 at a first node AN and may pass through the left-upper corner region CLU of the external region EREG. The third conduction segment CSG13 may be connected to the second conduction segment CSG12 at a second node CN and may pass through the right-upper corner region CRU of the external region EREG. The fourth conduction segment CSG14 may be connected to the third conduction segment CSG13 at a third node CN, may passing through the right-bottom corner region CRB of the external region EREG, and may be connected to the path control circuit 1100 through the output end node ENO.

Figure 3:
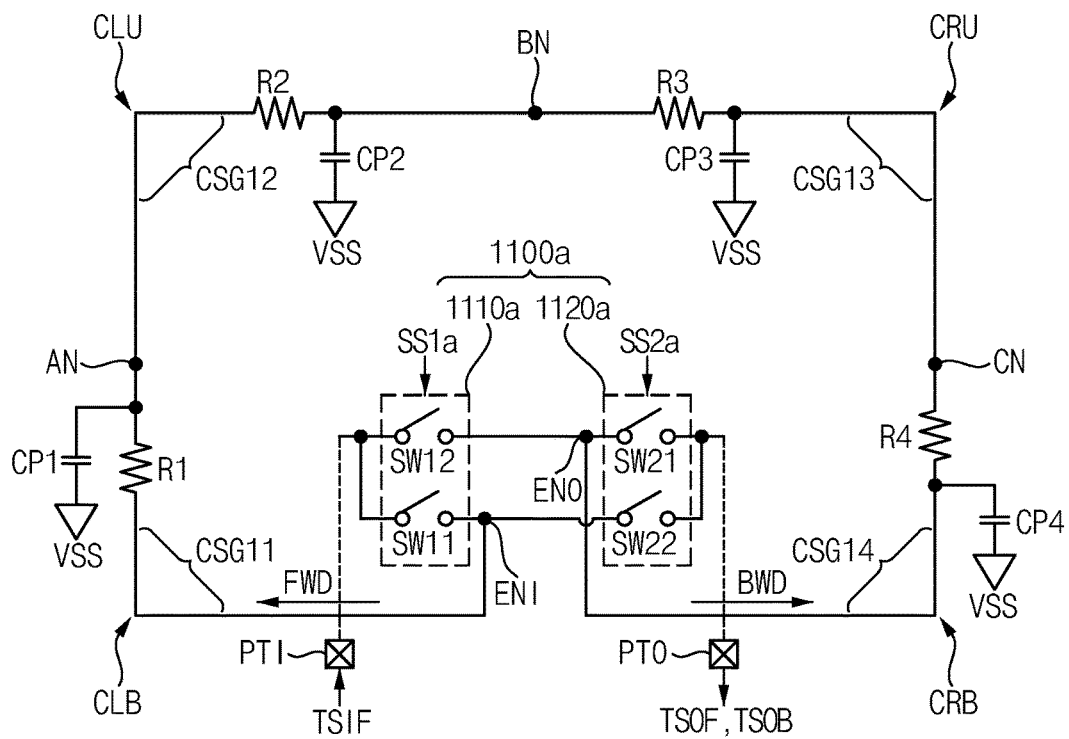
FIG. 3 illustrates an example of resistance and parasitic capacitance in the detection structure in FIG. 2.

FIG. 3 illustrates an example of resistance and parasitic capacitance in the detection structure in FIG. 2.

In FIG. 3, a path control circuit 1100a is also illustrated for convenience of explanation.

Referring to FIG. 3, resistance R1 exists in the first conduction segment CSG11 and a parasitic capacitance CP1 exists between the first conduction segment CSG11 and a ground voltage VSS. A resistance R2 exists in the second conduction segment CSG12 and a parasitic capacitance CP2 exists between the second conduction segment CSG12 and the ground voltage VSS.

A resistance R3 exists in the third conduction segment CSG13 and a parasitic capacitance CP3 exists between the third conduction segment CSG13 and the ground voltage VSS. A resistance R4 exists in the fourth conduction segment CSG14 and a parasitic capacitance CP4 exists between the fourth conduction segment CSG14 and the ground voltage VSS.

The path control circuit 1100a may include an input switch group 1110a and an output switch group 1120a. The input switch group 1110a may be connected between the test input pad PTI and the input end node ENI and the output switch group 1120a may be connected between the test output pad PTO and the output end node ENO.

The input switch group 1110a may include a first input switch SW11 and a second input switch SW12. The first input switch SW11 may be connected between the test input pad PTI and the input end node ENI. The second input switch SW12 may be connected to the test input pad PTI in parallel with the first input switch SW11 and may be connected between the test input pad PTI and the output end node ENO. A first selection signal SS1a may be applied to the first input switch SW11 and the second input switch SW12.

The output switch group 1120a may include a first output switch SW21 and a second output switch SW22. The first output switch SW21 may be connected between the test output pad PTO and the output end node ENO. The second output switch SW22 may be connected to the test output pad PTO in parallel with the first output switch SW21 and may be connected between the test output pad PTO and the input end node ENI. A second selection signal SS2a may be applied to the first output switch SW21 and the second output switch SW22.

When the first input switch SW11 is turned on, the second input switch SW12 is turned off, the first output switch SW21 is turned on, the second output switch SW22 is turned off and the test input signal TSI is applied to the test input pad PTI, the test input signal TSI propagates along a forward direction FWD via the input end node ENI, the first conduction segment CSG11, the second conduction segment CSG12, the third conduction segment CSG13, the fourth conduction segment CSG14 and the output end node ENO, and thus a forward direction test output signal TSOF is provided at the test output pad PTO.

A first propagation delay time interval tPD1 during which the forward direction test output signal TSOF passes through the detection structure DS may be represented as following equation 1 which is based on Elmore delay model.

$$tPD1 = R1*CP1 + (R1+R2)*CP2 + (R1+R2+R3)*CP3 + (R1+R2+R3+R4)*CP4 \quad \text{[equation 1]}$$

In equation 1, it may be assumed that a capacitance of each of parasitic capacitances CP1, CP2, CP3 and CP4 corresponds to C0. In this regard, equation 2 is provided.

$$tPD1 = (4*R1 + 3*R2 + 2*R3 + R4)*C0 \quad \text{[equation 2]}$$

When the first input switch SW11 is turned off, the second input switch SW12 is turned on, the first output switch SW21 is turned off, the second output switch SW22 is turned on and the test input signal TSI is applied to the test input pad PTI, the test input signal TSI propagates along a backward direction BWD via the output end node ENO, the fourth conduction segment CSG14, the third conduction segment CSG13, the second conduction segment CSG12, the first conduction segment CSG11 and the input end node EN1, and thus a backward direction test output signal TSOB is provided at the test output pad PTO.

A second propagation delay time interval tPD2 during which the backward direction test output signal TSOB passes through the detection structure DS may be represented as following equation 3 which is based on Elmore delay model.

$$tPD2=R4*CP4+(R4+R3)*CP3+(R4+R3+R2)*CP2+(R4+R3+R2+R1)*CP1 \quad \text{[equation 3]}$$

In equation 3, it may be assumed that a capacitance of each of parasitic capacitances CP1, CP2, CP3 and CP4 corresponds to C0. In this regard, equation 4 is provided.

$$tPD2=(4*R4+3*R3+2*R2+R1)*C0 \quad \text{[equation 4]}$$

When equation 4 is subtracted from equation 2, a difference signal ΔtPD is provided as following equation 5.

$$\Delta tPD=3*(R1-R4)*C0+(R2-R3)*C0 \quad \text{[equation 5]}$$

When a defect such as a crack occurs, resistance increases, and thus the detection circuit 920 may determine whether the defect is present in the semiconductor die and the location of the defect based on a sign and a magnitude of the difference signal ΔtPD.

Figures 4, 5A:
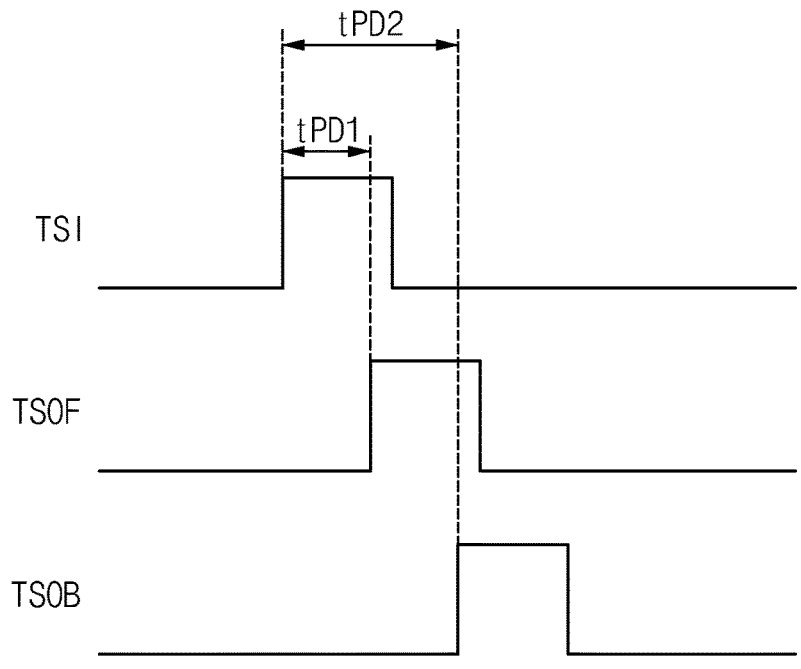
FIG. 4 illustrates examples of a test input signal, a forward test output signal and a backward test output signal which are input to and/or output from the detection structure in FIG. 3.
FIG. 5A is a table illustrating a result of simulating a case in which a crack occurs in the detection structure in FIG. 3.

FIG. 4 illustrates examples of a test input signal, a forward test output signal and a backward test output signal which are input to and/or output from the detection structure in FIG. 3.

As mentioned with reference to FIG. 3, when the test input signal TSI propagates through the detection structure DS along the forward direction FWD, the forward direction test output signal TSOF is provided at the test output pad PTO, and the forward direction test output signal TSOF may have the first propagation delay time interval tPD1. When the test input signal TSI propagates through the detection structure DS along the back direction BWD, the backward direction test output signal TSOB is provided at the test output pad PTO, and the backward direction test output signal TSOB may have the second propagation delay time interval tPD2.

Therefore, the difference signal ΔtPD may be obtained by subtracting the second propagation delay time interval tPD2 from the first propagation delay time interval tPD1.

In FIG. 4, it is assumed that the test input signal TSI is a pulse and the difference signal ΔtPD corresponds to a difference between the first propagation delay time interval tPD1 and the second propagation delay time interval tPD2. For example, the test input signal TSI may be a DC voltage.

When the test input signal TSI is applied to the test input pad PTI using a time domain and a voltage domain, the detection circuit 920 may determine whether the defect is present, the location of the defect and a type of the defect based on voltage difference of the forward direction test output signal TSOF and the backward direction test output signal TSOB, and propagation delay difference of the forward direction test output signal TSOF and the backward direction test output signal TSOB. For example, when the test input signal TSI is a pulse, the detection circuit 920 may determine whether the defect is present, the location of the defect and a type of the defect based on a difference of pulse duration or pulse amplitude of the forward direction test output signal TSOF and the backward direction test output signal TSOB.

For example, the difference signal ΔtPD may include one of a difference of propagation delay of the pulse, a difference of an amplitude of the DC voltage, a difference of propagation delay of the pulse based on operating of the semiconductor device 1000 and a difference of an amplitude of the DC voltage based on the operating of the semiconductor device 1000.

For example, the test input signal TSI may correspond to one of a signal that is generated at an inside of the semiconductor device 1000 and a signal that is at an outside of the semiconductor device 1000 and is applied to the detection structure DS via the path control circuit 1100.

FIG. 5A is a table illustrating a result of simulating a case in which a crack occurs in the detection structure in FIG. 3.

In FIG. 5A, it may be assumed that a resistance of each of the resistances R1, R2, R3 and R4 of the first conduction segment CSG11, the second conduction segment CSG12, the third conduction segment CSG13 and the fourth conduction segment CSG14 has a second resistance value RV2 in a normal situation in which a defect (e.g., a crack) is not present and that a resistance of each of the resistances R1, R2, R3 and R4 of the first conduction segment CSG11, the second conduction segment CSG12, the third conduction segment CSG13 and the fourth conduction segment CSG14 has a first resistance value RV1 in a situation in which the defect is present in one of the first conduction segment CSG11, the second conduction segment CSG12, the third conduction segment CSG13 and the fourth conduction segment CSG14. Here, the first resistance value RV1 is greater than the second resistance value RV2.

Referring to FIG. 5A, when the crack occurs in the first conduction segment CSG11, the difference signal ΔtPD has a positive first value PD1, when the crack occurs in the second conduction segment CSG12, the difference signal ΔtPD has a positive second value PD2, when the crack occurs in the third conduction segment CSG13, the difference signal ΔtPD has a negative second value −PD2, and when the crack occurs in the fourth conduction segment CSG14, the difference signal ΔtPD has a negative first value −PD1. In addition, when the defect is not present in the first conduction segment CSG11, the second conduction segment CSG12, the third conduction segment CSG13 and the fourth conduction segment CSG14, the difference signal ΔtPD corresponds to zero, or is below a threshold value. The first value PD1 may be greater than the second value PD2.

Therefore, the detection circuit 920 may determine whether the defect is present in each of the first conduction segment CSG11, the second conduction segment CSG12, the third conduction segment CSG13 and the fourth conduction segment CSG14 based on a sign of the difference signal ΔtPD, and the detection circuit 920 may specify a second conduction segment, in which the crack occurs, from among the first conduction segment CSG11, the second conduction segment CSG12, the third conduction segment CSG13 and the fourth conduction segment CSG14 based on a sign and a magnitude of the difference signal ΔtPD.

When the forward direction FWD and the backward direction BWD are interchanged in FIG. 3, a sign and a magnitude of the difference signal ΔtPD may be interchanged.

Figure 5B:
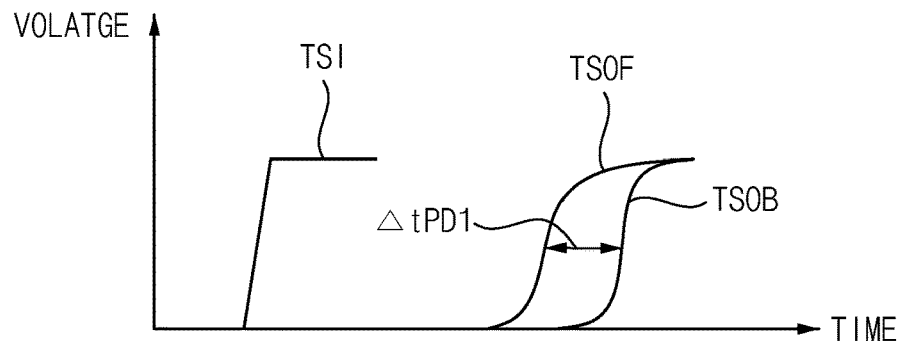
FIGS. 5B and 5C illustrate examples of a test input signal, a forward test output signal and a backward test output signal in the simulation in FIG. 5A.
Figure 5C:
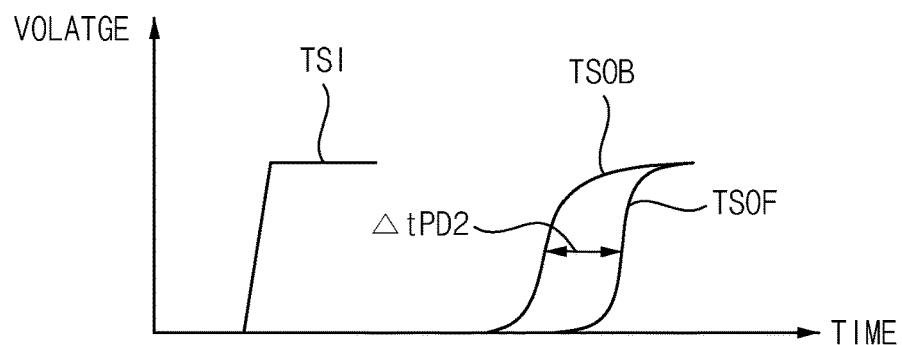

FIGS. 5B and 5C illustrate examples of a test input signal, a forward test output signal and a backward test output signal in the simulation in FIG. 5A.

Referring to FIG. 5B, the forward test output signal TSOF prior to the backward test output signal TSOB is output at the test output pad TPO, in response to the test input signal TSI. A difference signal ΔtPD1 corresponding to a difference between the forward test output signal TSOF and the backward test output signal TSOB (i.e., TSOB-TSOF) has a positive value.

Referring to FIG. 5C, the backward test output signal TSOB prior to the forward test output signal TSOF is output at the test output pad TPO, in response to the test input signal TSI. A difference signal ΔtPD2 corresponding to a difference between the forward test output signal TSOF and the backward test output signal TSOB (i.e., TSOB-TSOF) has a negative value.

Figure 6:
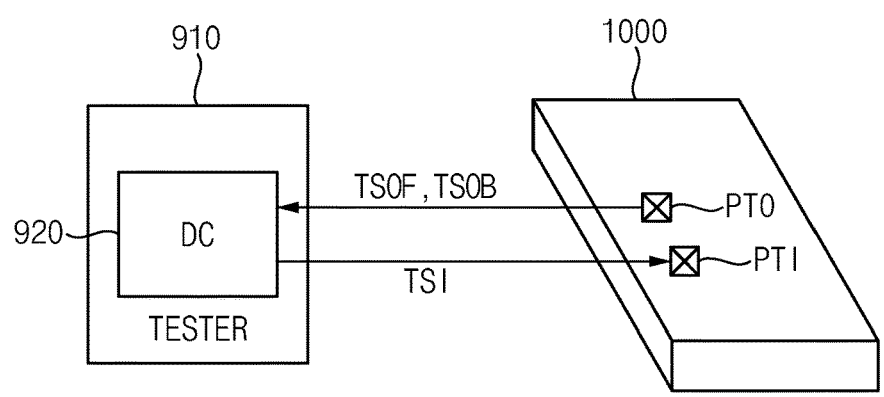
FIG. 6 is a block diagram illustrating a test system according to example embodiments.

FIG. 6 is a block diagram illustrating a test system according to example embodiments.

Referring to FIG. 6, a test system 900 may include a tester 910 and a semiconductor device 1000.

The semiconductor device 1000 may include the detection structure and the path control circuit as described above.

The tester 910 may include a detection circuit 920. The detection circuit 920 may apply the test input signal TSI to the test input pad PTI, and receive the forward test output signal TSOF and the backward test output signal TSOB through the test output pad PTO, where the forward test output signal TSOF corresponds to the test input signal TSI after passing through the detection structure along the forward direction and the backward test output signal TSOB corresponds to the test input signal TSI after passing through the detection structure along the backward direction. The detection circuit 920 may determine whether the defect is present in the semiconductor die and the location of the defect based on a difference between the forward test output signal TSOF and the backward test output signal TSOB.

Figure 7:
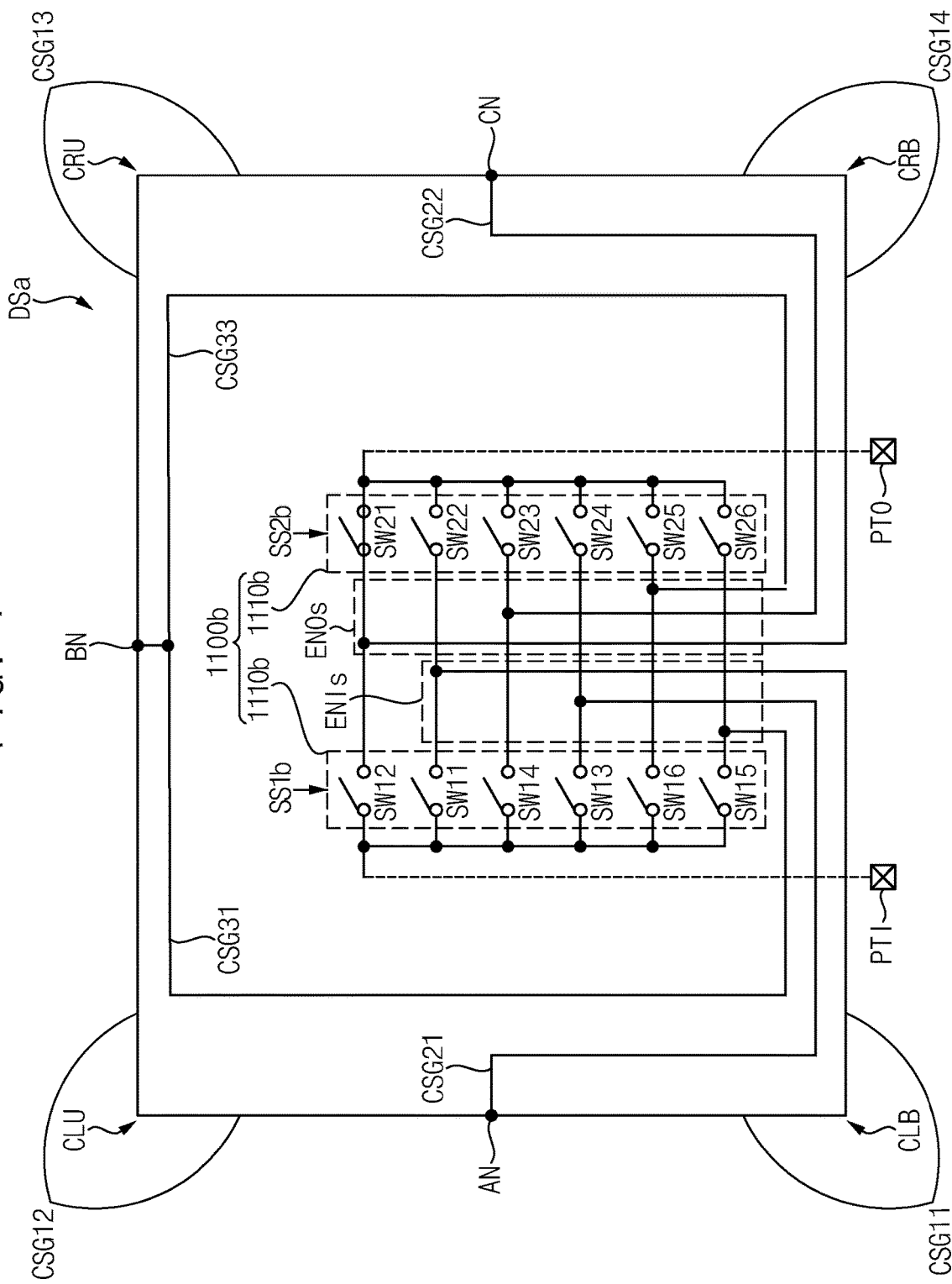
FIG. 7 is a top view illustrating a detection structure according to example embodiments.

FIG. 7 is a top view illustrating a detection structure according to example embodiments.

In FIG. 7, a path control circuit 1100b is also illustrated for convenience of explanation.

Referring to FIG. 7, a detection structure DSa may include a first conduction segment CSG11, a second conduction segment CSG12, a third conduction segment CSG13 and a fourth conduction segment CSG14. The detection structure DSa may further include a fifth conduction segment CSG21, a sixth conduction segment CSG22, a seventh conduction segment CSG31 and an eighth conduction segment CSG32.

Descriptions with respect to the first conduction segment CSG11, the second conduction segment CSG12, the third conduction segment CSG13 and the fourth conduction segment CSG14 are substantially similar to those provided with respect to FIG. 2 and will not be repeated.

The fifth conduction segment CSG21 may be connected between a corresponding input end node of input end nodes ENIs and the first node AN in parallel with the first conduction segment CSG11. The fifth conduction segment CSG21 may pass through the left-bottom corner region CLB.

The sixth conduction segment CSG22 may be connected between a corresponding output end node of output end nodes ENOs and the third node CN in parallel with the fourth conduction segment CSG14. The sixth conduction segment CSG22 may pass through the right-bottom corner region CRB.

The seventh conduction segment CSG31 may be connected between a corresponding input end node of input end nodes ENIs and the second node BN in parallel with the first conduction segment CSG11 and the second conduction segment CSG12. The seventh conduction segment CSG31 may pass through the left-bottom corner region CLB and the left-upper corner region CLU.

The eighth conduction segment CSG32 may be connected between a corresponding output end node of output end nodes ENOs and the second node BN in parallel with the fourth conduction segment CSG14 and the third conduction segment CSG13. The eighth conduction segment CSG32 may pass through the right-bottom corner region CRB and the right-upper corner region CRU.

The path control circuit 1100b may include an input switch group 1110b and an output switch group 1120b. The input switch group 1110b may be connected to the test input pad PTI, the input end nodes ENIs and the output end nodes ENOs and the output switch group 1120b may be connected to the test output pad PTO, the output end nodes ENOs and the input end nodes ENIs.

The input switch group 1110b may include first through sixth input switches SW11, SW12, SW13, SW14, SW15 and SW16. The first input switch SW11, the third input switch SW13 and the fifth input switch SW15 may be connected between the test input pad PTI and the input end nodes ENIs and the second input switch SW12, the fourth input switch SW14 and the sixth input switch SW16 may be connected between the test input pad PTI and the output end nodes ENOs. Each of the first through sixth input switches SW11, SW12, SW13, SW14, SW15 and SW16 may be turned on/turned off in response to a first selection signal SS1b. The third through sixth input switches SW13, SW14, SW15 and SW16 may be referred to as additional input switches.

The first input switch SW11 may be connected to the first conduction segment CSG11 through the input end nodes ENIs, the third input switch SW13 may be connected to the fifth conduction segment CSG21 through the input end nodes ENIs and the fifth input switch SW15 may be connected to the seventh conduction segment CSG31 through the input end nodes ENIs. The second input switch SW12 may be connected to the fourth conduction segment CSG14 through the output end nodes ENOs, the fourth input switch SW14 may be connected to the sixth conduction segment CSG22 through the output end nodes ENOs and the sixth input switch SW16 may be connected to the eighth conduction segment CSG32 through the output end nodes ENOs.

The output switch group 1120b may include first through sixth input switches SW21, SW22, SW23, SW24, SW25 and SW26. The first output switch SW21, the third output switch SW23 and the fifth output switch SW25 may be connected between the test output pad PTO and the output end nodes ENOs and the second output switch SW22, the fourth output switch SW24 and the sixth output switch SW26 may be connected between the test output pad PTO and the input end nodes ENIs. Each of the first through sixth output switches SW21, SW22, SW23, SW24, SW25 and SW26 may be turned on/turned off in response to a second selection signal SS2b. The third through sixth output switches SW23, SW24, SW25 and SW26 may be referred to as additional output switches.

The first output switch SW21 may be connected to the fourth conduction segment CSG1 through the output end nodes ENOs, the third output switch SW23 may be connected to the sixth conduction segment CSG22 through the output end nodes ENOs and the fifth output switch SW25 may be connected to the eighth conduction segment CSG32 through the output end nodes ENOs. The second output switch SW22 may be connected to the first conduction segment CSG11 through the input end nodes ENIs, the fourth output switch SW24 may be connected to the fifth conduction segment CSG21 through the input end nodes ENIs and the sixth output switch SW26 may be connected to the seventh conduction segment CSG31 through the input end nodes ENIs.

Figure 8:
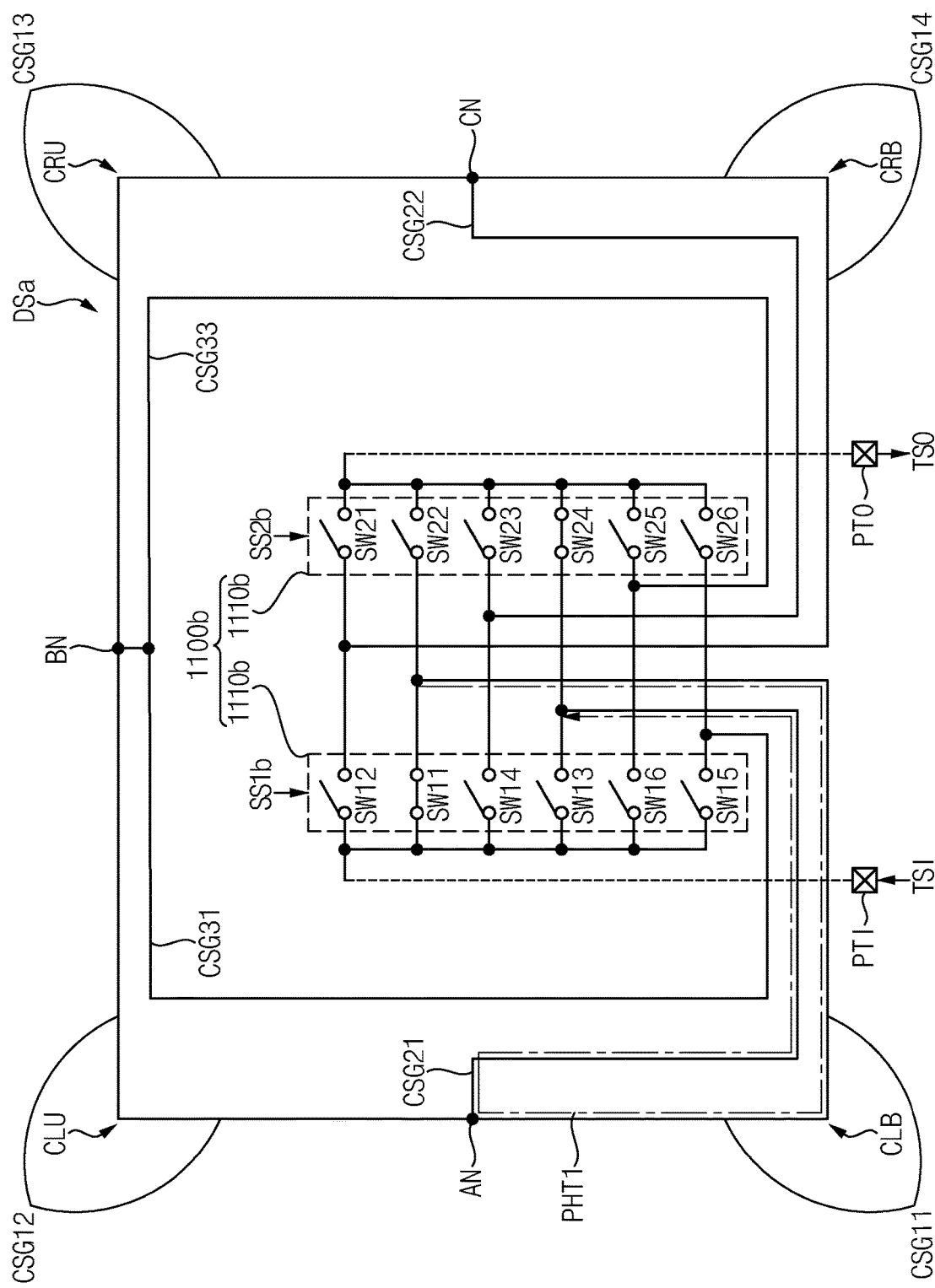
FIG. 8 illustrates an example operation of the detection structure and the path control circuit of FIG. 7 according to example embodiments.

FIG. 8 illustrates an example operation of the detection structure and the path control circuit of FIG. 7 according to example embodiments.

Referring to FIG. 8, when the second through sixth input switches SW12, SW13, SW14, SW15 and SW16 are turned off and the first input switch SW11 is turned on, in response to the first selection signal SS1b and when the first through third output switches and the fifth and sixth output switches SW21, SW22, SW23, SW25 and SW26 are turned off and the fourth output switch SW24 is turned on, in response to the second selection signal SS2b, the test input signal TSI applied to the test input pad PTI passes through a path PTH1 including the first conduction segment CSG11, the first node AN and the fifth conduction segment CSG21, and the test output signal TSO is provided at the test output pad PTO.

The detection circuit 920 in FIG. 1 may determine whether the defect is present in a first region including the first conduction segment CSG11 based on a propagation delay time interval of the test output signal TSO and the test input signal TSI.

Figure 9:
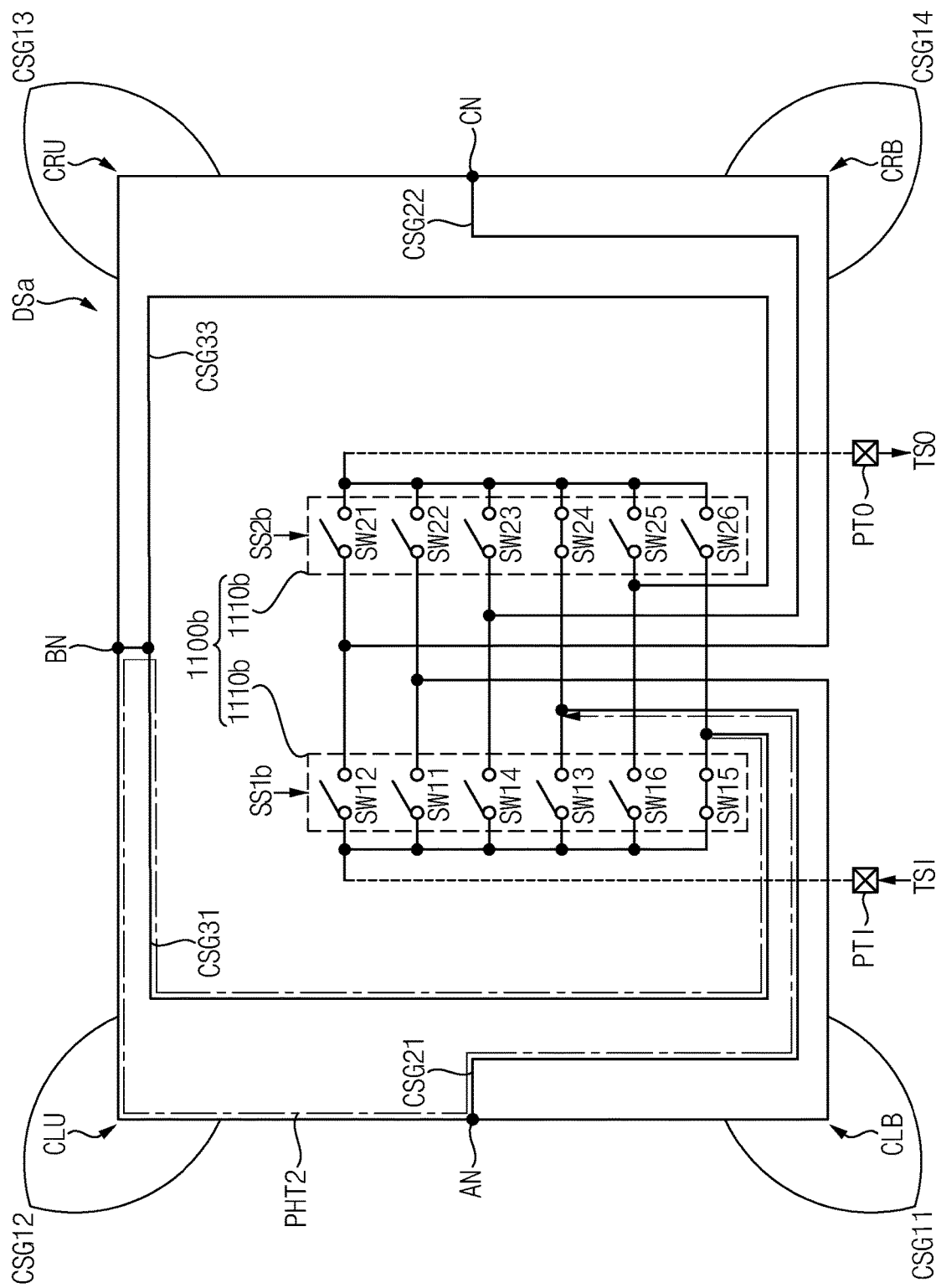
FIG. 9 illustrates an example operation of the detection structure and the path control circuit of FIG. 7 according to example embodiments.

FIG. 9 illustrates an example operation of the detection structure and the path control circuit of FIG. 7 according to example embodiments.

Referring to FIG. 9, when the first through fourth input switches and the sixth input switch SW11, SW12, SW13, SW14 and SW16 are turned off and the fifth input switch SW15 is turned on, in response to the first selection signal SS1b and when the first through third output switches and the fifth and sixth output switches SW21, SW22, SW23, SW25 and SW26 are turned off and the fourth output switch SW24 is turned on, in response to the second selection signal SS2b, the test input signal TSI applied to the test input pad PTI passes through a path PTH2 including the seventh conduction segment CSG31, the second node BN, the second conduction segment CSG21 and the fifth conduction segment CSG21, and the test output signal TSO is provided at the test output pad PTO.

The detection circuit 920 in FIG. 1 may determine whether the defect is present in a second region including the second conduction segment CSG12 based on a propagation delay time interval of the test output signal TSO and the test input signal TSI.

Figure 10:
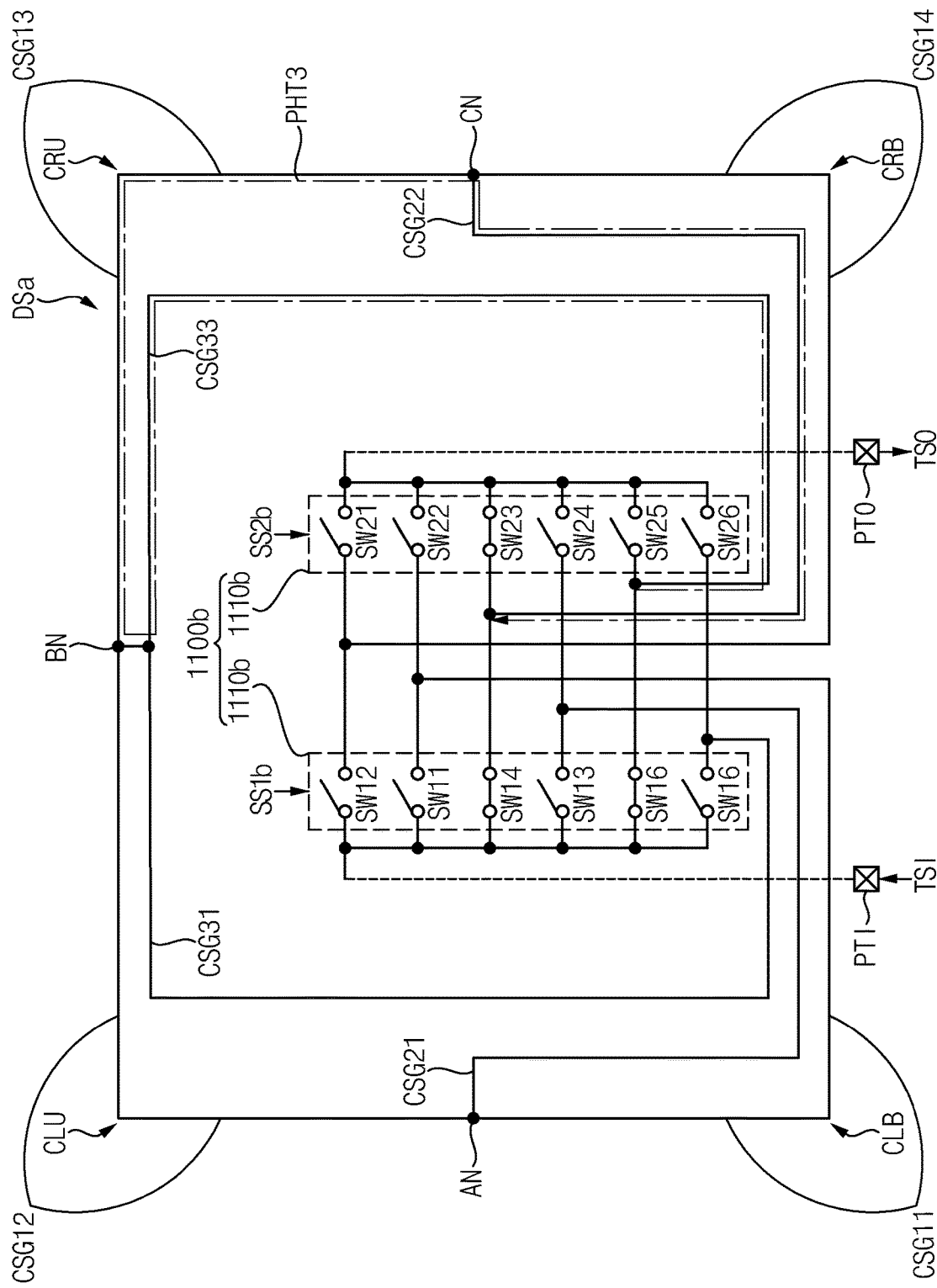
FIG. 10 illustrates an example operation of the detection structure and the path control circuit of FIG. 7 according to example embodiments.

FIG. 10 illustrates an example operation of the detection structure and the path control circuit of FIG. 7 according to example embodiments.

Referring to FIG. 10, when the first through fourth input switches and the sixth input switch SW11, SW12, SW13, SW14 and SW16 are turned off and the fifth input switch SW15 is turned on, in response to the first selection signal SS1b and when the first and second output switches and fourth through sixth output switches SW21, SW22, SW24, SW25 and SW26 are turned off and the third output switch SW23 is turned on, in response to the second selection signal SS2b, the test input signal TSI applied to the test input pad PTI passes through a path PTH3 including the eighth conduction segment CSG32, the second node BN, the third conduction segment CSG13 and the sixth conduction segment CSG22, and the test output signal TSO is provided at the test output pad PTO.

The detection circuit 920 in FIG. 1 may determine whether the defect is present in a third region including the third conduction segment CSG13 based on a propagation delay time interval of the test output signal TSO and the test input signal TSI.

Figure 11:
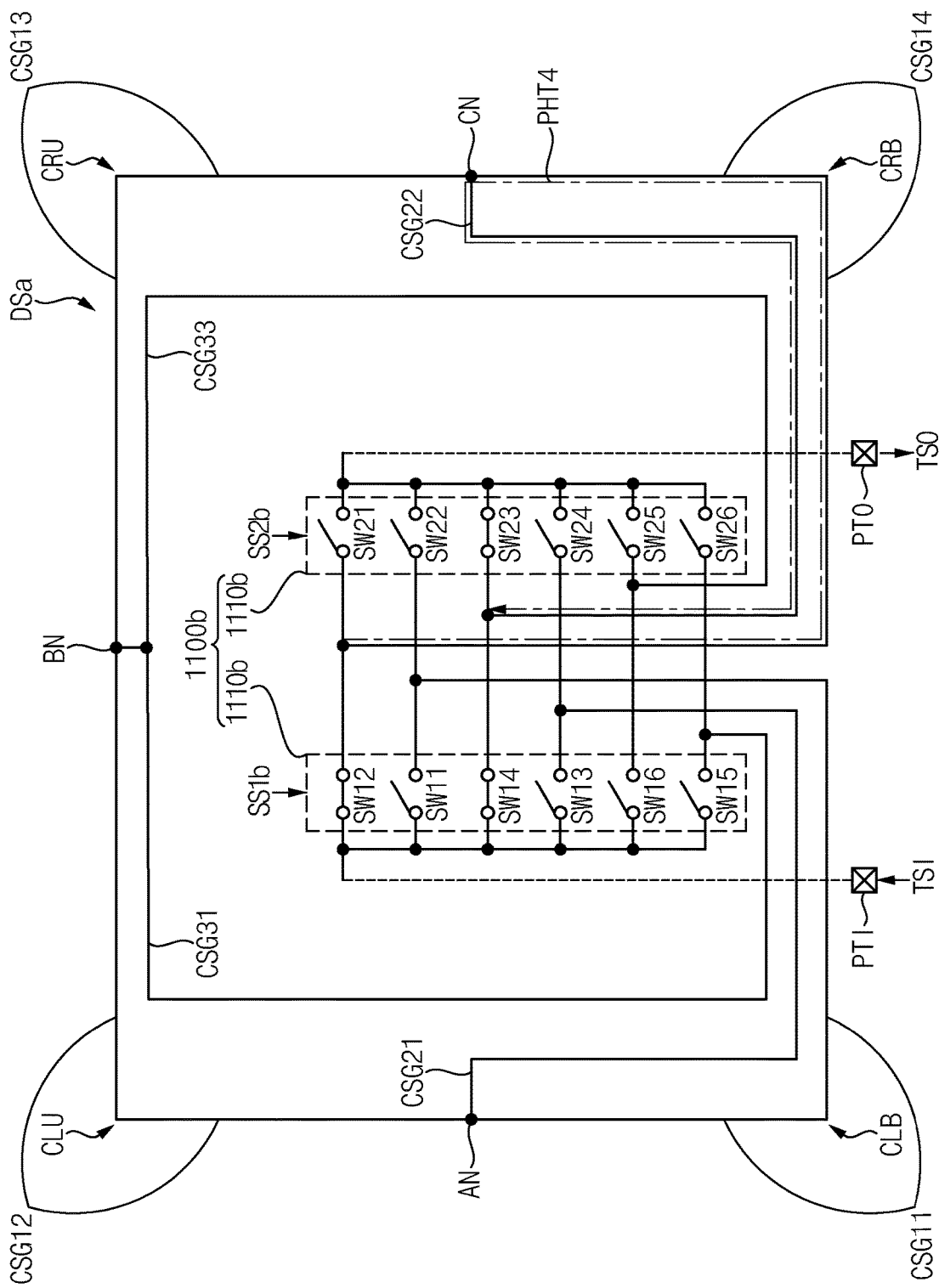
FIG. 11 illustrates an example operation of the detection structure and the path control circuit of FIG. 7 according to example embodiments.

FIG. 11 illustrates an example operation of the detection structure and the path control circuit of FIG. 7 according to example embodiments.

Referring to FIG. 11, when the first input switch and the third through the sixth input switch SW11, SW13, SW14, SW15 and SW16 are turned off and the second input switch SW12 is turned on, in response to the first selection signal SS1b and when the first and second output switches and fourth through sixth output switches SW21, SW22, SW24, SW25 and SW26 are turned off and the third output switch SW23 is turned on, in response to the second selection signal SS2b, the test input signal TSI applied to the test input pad PTI passes through a path PTH4 including the fourth conduction segment CSG14, the third node CN, and the sixth conduction segment CSG22, and the test output signal TSO is provided at the test output pad PTO.

The detection circuit 920 in FIG. 1 may determine whether the defect is present in a fourth region including the fourth conduction segment CSG14 based on a propagation delay time interval of the test output signal TSO and the test input signal TSI.

Figure 12:
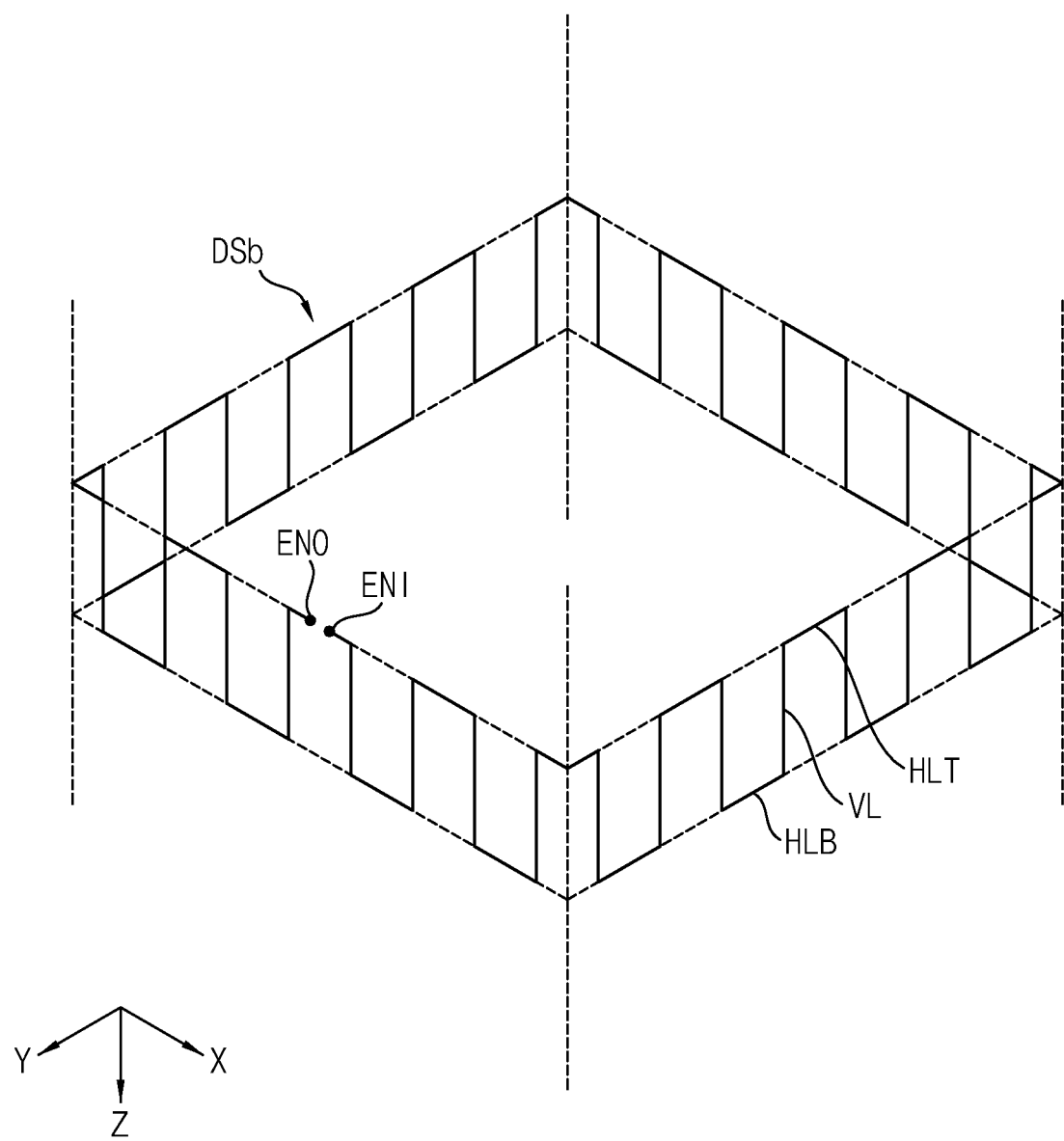
FIG. 12 is a perspective view of a three-dimensional detection structure according to example embodiments.

FIG. 12 is a perspective view of a three-dimensional detection structure according to example embodiments.

Referring to FIG. 12, a three-dimensional detection structure DSb may include a single conduction loop. As will be described below, the semiconductor die may include a first conduction layer and a second conduction layer that is provided under the first conduction layer. The conduction layers may include a metal layer in which metal line segments are patterned and/or a polysilicon layer in which polysilicon line segments are patterned. The three-dimensional detection structure DSb may extend in the vertical direction Z through the first conduction layer and the second conduction layer.

The three-dimensional detection structure DSb may include a plurality of top horizontal line segments HLT formed in the first conduction layer, a plurality of bottom horizontal line segments HLB formed in the second conduction layer and a plurality of vertical line segments VL connecting the top horizontal line segments HLT and the bottom horizontal line segments HLB respectively to form the three-dimensional detection structure DSb. The top horizontal line segments HLT, the bottom horizontal line segments HLB and the vertical line segments VL may be disposed alternatingly along the three-dimensional detection structure DSb, and may connect an input end node ENI and an output end node ENO in the annular shape to surround the central region of the semiconductor die.

In some example embodiments, the input end node ENI and the output end node ENO may be connected to input-output pads formed on a surface of the semiconductor die so that the three-dimensional detection structure DSb may be connected to an external tester through the input-output pads. In some example embodiments, the input end node ENI and the output end node ENO may be connected to a detection circuit formed in a portion of the central region of the semiconductor die (i.e., an internal detection circuit).

FIGS. 13, 14, 15 and 16 are cross-sectional diagrams illustrating a vertical structure of a three-dimensional detection structure according to example embodiments.

Figure 13:
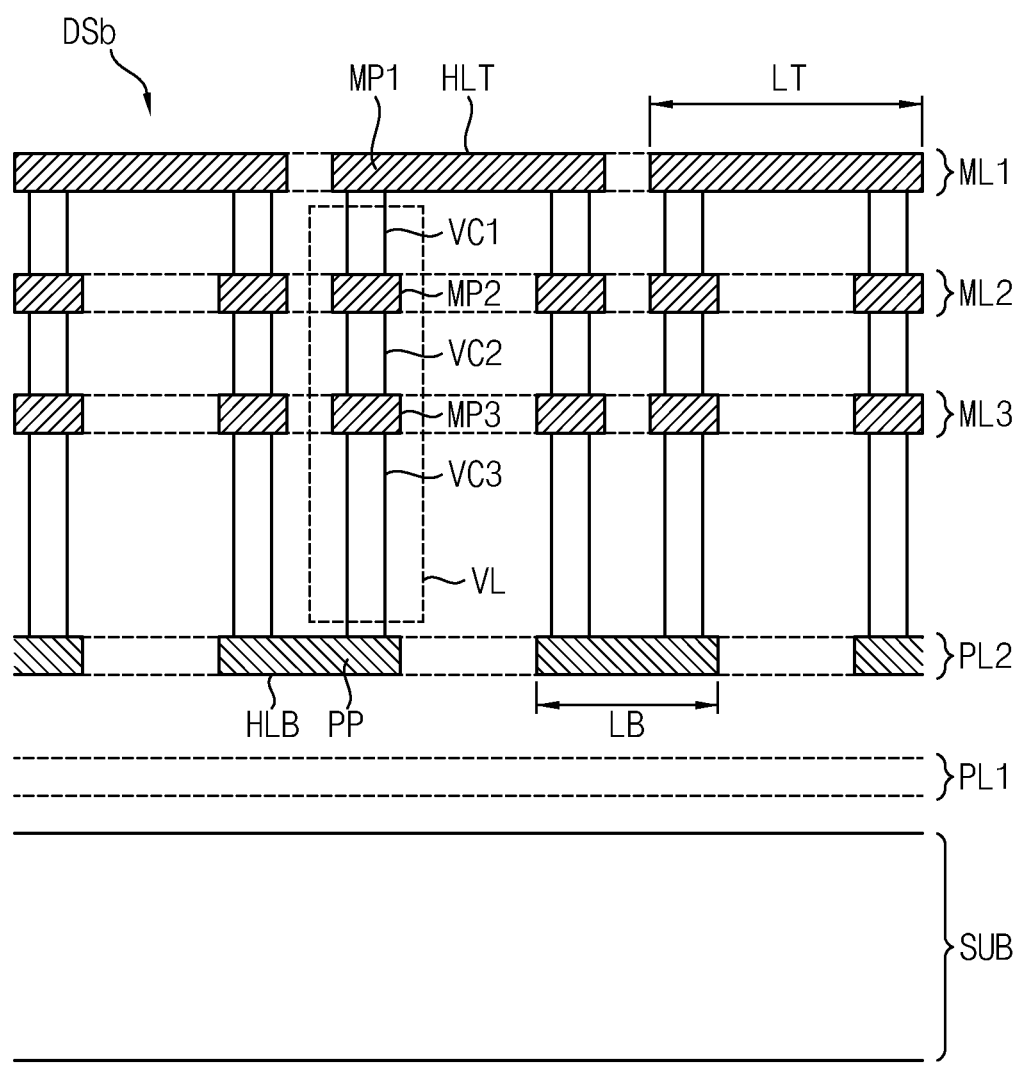
FIGS. 13, 14, 15 and 16 are cross-sectional diagrams illustrating a vertical structure of a three-dimensional detection structure according to example embodiments.

Referring to FIG. 13, a semiconductor die may include a semiconductor substrate SUB and a dielectric layer in which upper structures are formed. The dielectric layer may include a plurality of conduction layers ML1, ML2, ML3, PL1 and PL2 in which conduction line patterns are formed. The conduction layers may include one or more metal layers ML1, ML2 and ML3 and one or more polysilicon layers PL1 and PL2. The polysilicon layers may include a polysilicon layer PL1 in which gates of transistors in the semiconductor integrated circuit are formed. The semiconductor integrated circuit may be a semiconductor memory device, and the polysilicon layers may further include a bit-line polysilicon layer PL2 in which bit-lines in the semiconductor integrated circuit are formed.

The three-dimensional detection structure DSb may include a plurality of top horizontal line segments HLT formed in the first conduction layer ML1, a plurality of bottom horizontal line segments HLB formed in the second conduction layer PL2 and a plurality of vertical line segments VL connecting the top horizontal line segments HLT and the bottom horizontal line segments HLB respectively to form the three-dimensional detection structure DSb.

As shown in FIG. 13, the first conduction layer ML1 may correspond to an uppermost metal layer among the metal layers ML1, ML2 and ML3 that are formed over the semiconductor substrate SUB, and the second conduction layer PL2 may correspond to the bit-line polysilicon layer that is formed between the semiconductor substrate SUB and the metal layers ML1, ML2 and ML3. The top horizontal line segments HLT may include metal line patterns MP1 formed in the uppermost metal layer ML1, and the bottom horizontal line segments HLB may include polysilicon line patterns PP formed in the bit-line polysilicon layer PL2.

The vertical line segments VL may include vertical contacts VC1, VC2 and VC3 to provide an electrical connection between the metal line patterns MP1 in the uppermost metal layer ML1 and the polysilicon line patterns PP in the bit-line polysilicon layer PL2. The vertical line segments VL may further include conduction line patterns MP2 and MP3 in the respective intermediate conduction layers ML2 and ML3. In some example embodiments, the conduction line pattern in one or both of the intermediate conduction layers ML2 and ML3 may be omitted. For example, the metal line patterns MP2 in the intermediate metal layer ML2 may be omitted, and the two vertical contacts VC1 and VC2 may be combined as a longer vertical contact.

Hereinafter, the descriptions substantially similar to those provided above with respect to FIG. 13 may be omitted.

Figure 14:
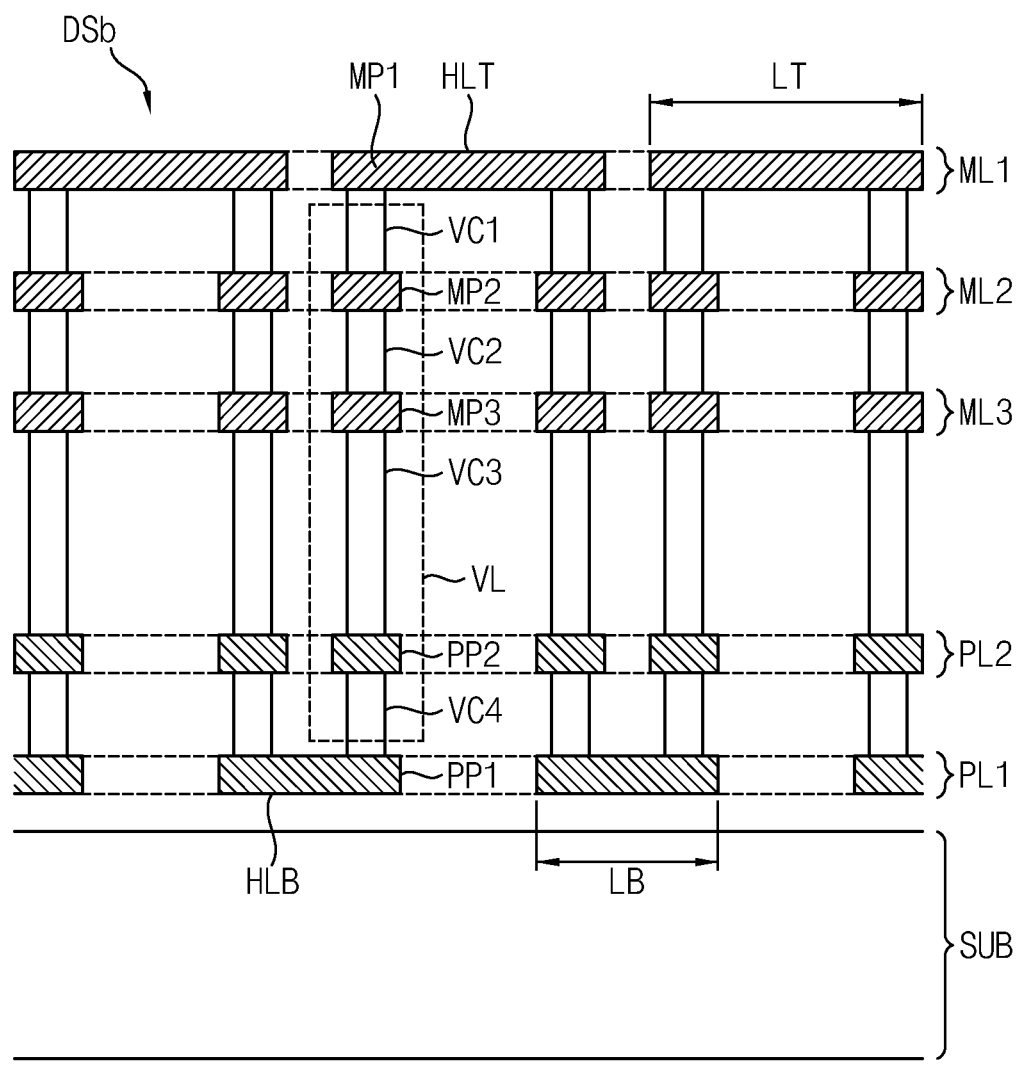

Referring to FIG. 14, the three-dimensional detection structure DSb may include a plurality of top horizontal line segments HLT formed in the first conduction layer ML1, a plurality of bottom horizontal line segments HLB formed in the second conduction layer PL1, and a plurality of vertical line segments VL connecting the top horizontal line segments HLT and the bottom horizontal line segments HLB respectively to form the three-dimensional detection structure DSb.

As shown in FIG. 14, the first conduction layer ML1 may correspond to an uppermost metal layer among the metal layers ML1, ML2 and ML3 that are formed over the semiconductor substrate SUB, and the second conduction layer PL1 may correspond to the gate polysilicon layer that is formed between the semiconductor substrate SUB and the metal layers ML1, ML2 and ML3. The top horizontal line segments HLT may include metal line patterns MP1 formed in the uppermost metal layer ML1, and the bottom horizontal line segments HLB may include polysilicon line patterns PP1 formed in the gate polysilicon layer PL1.

Figure 15:
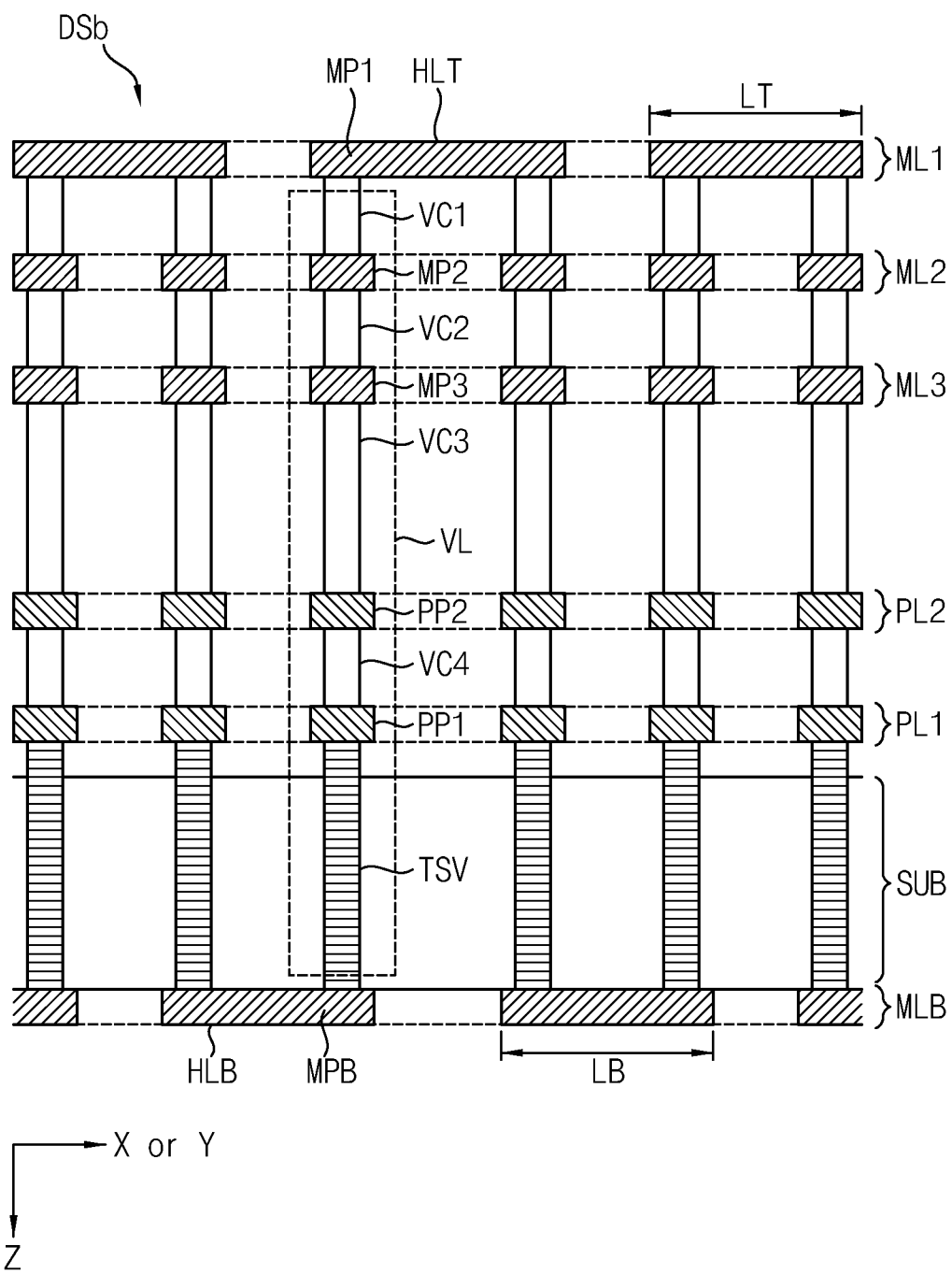

Referring to FIG. 15, the three-dimensional detection structure DSb may include a plurality of top horizontal line segments HLT formed in the first conduction layer ML1, a plurality of bottom horizontal line segments HLB formed in the second conduction layer MLB, and a plurality of vertical line segments VL connecting the top horizontal line segments HLT and the bottom horizontal line segments HLB respectively to form the three-dimensional detection structure DSb.

As shown in FIG. 15, the first conduction layer ML1 may correspond to an uppermost metal layer among the metal layers ML1, ML2 and ML3 that are formed over the semiconductor substrate SUB, and the second conduction layer MLB may correspond to a metal layer that is formed on a bottom surface of the semiconductor substrate SUB. The top horizontal line segments HLT may include metal line patterns MP1 formed in the uppermost metal layer ML1, and the bottom horizontal line segments HLB may include metal line patterns MPB formed in the metal layer MLB on the bottom surface of the semiconductor substrate SUB.

As described with reference to FIGS. 13, 14 and 15, the three-dimensional crack detection structure according to example embodiments may extend in the vertical direction Z to the various depths. Using the three-dimensional crack detection structure, the crack penetration of various types may be detected more thoroughly.

Figure 16:
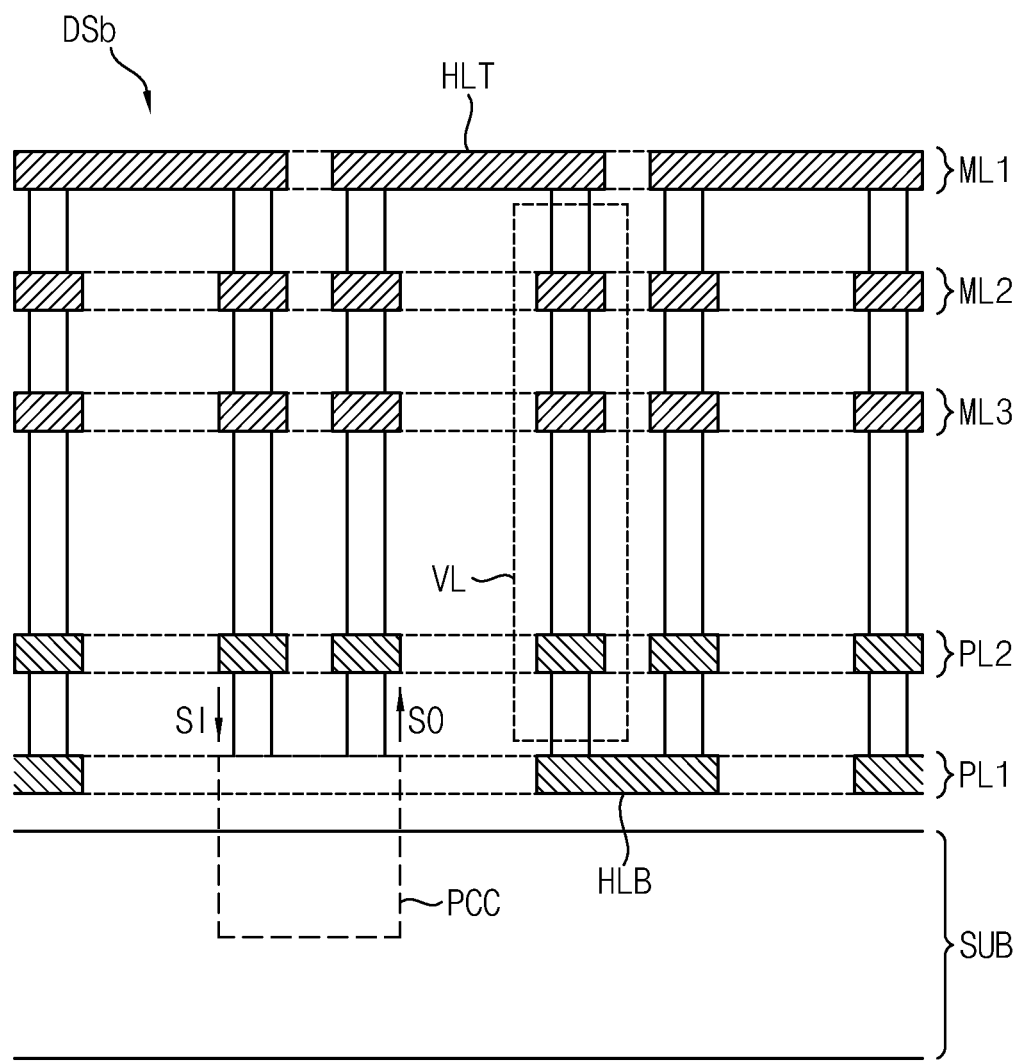

Compared with the three-dimensional detection structure DSb of FIG. 14, a portion of the bottom horizontal line segments HLB in the gate polysilicon layer PL1 may be omitted and a path selection circuit PS may be formed in the omitted region as illustrated in FIG. 16. The path control circuit PCC may include transistors formed using the semiconductor substrate SUB and the transistors may be used as the switches as described above.

Figure 17:
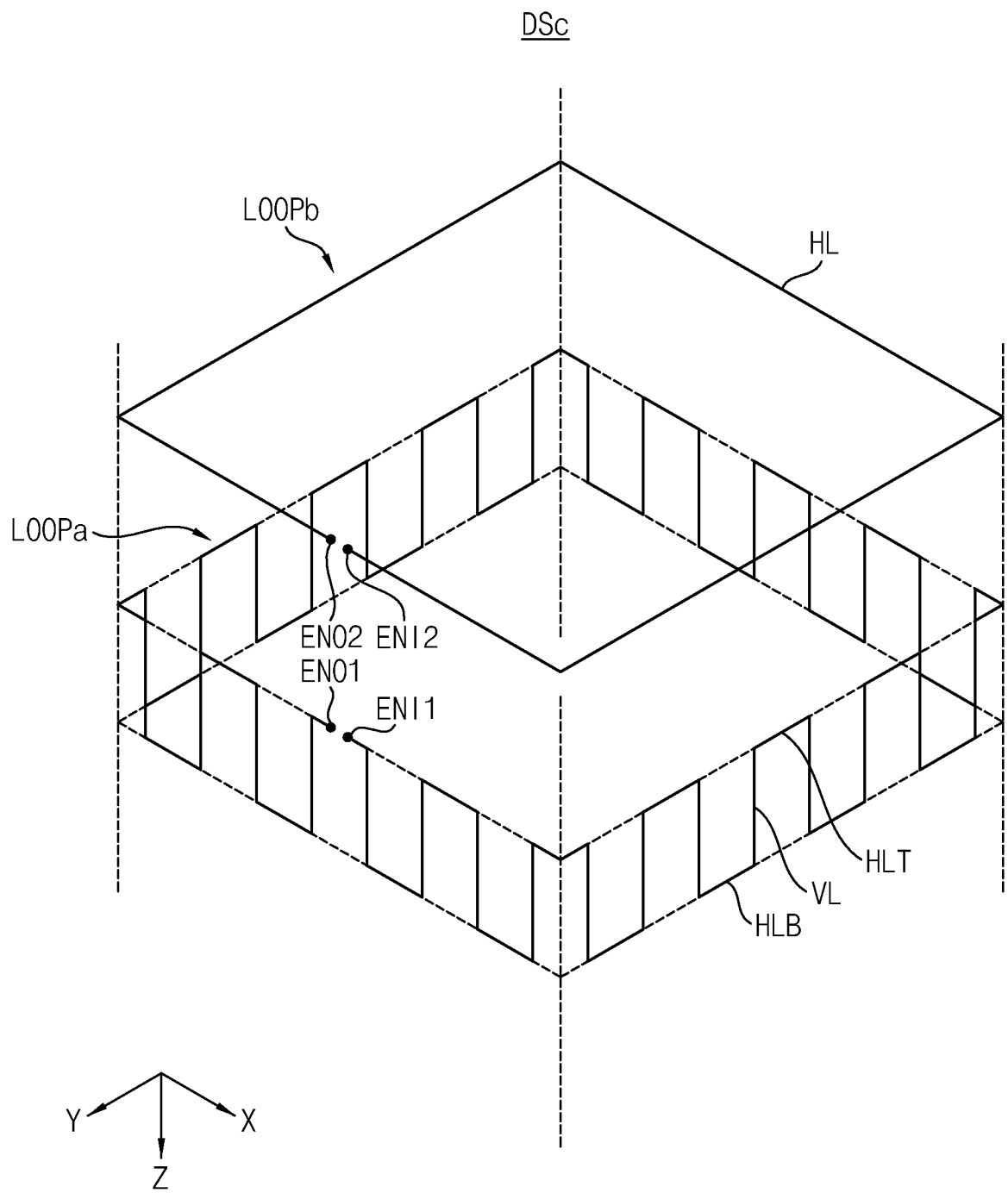
FIG. 17 is a perspective view of a three-dimensional crack detection structure according to example embodiments.

FIG. 17 is a perspective view of a three-dimensional crack detection structure according to example embodiments.

Referring to FIG. 17, a three-dimensional outer crack detection structure DSc may include a first conduction loop LOOPa and a second conduction loop LOOPb. As will be described below, the semiconductor die may include a first conduction layer, a second conduction layer under the first conduction layer, and a third conduction layer under the second conduction layer. The conduction layers may include a metal layer in which metal line segments are patterned and/or a polysilicon layer in which polysilicon line segments are patterned. The first conduction loop LOOPa may extend in the vertical direction Z between the second conduction layer and the third conduction layer in a three-dimensional shape. The second conduction loop LOOPb may be formed in the first conduction layer in a two-dimensional shape.

The first conduction loop LOOPa may include a plurality of first top horizontal line segments HLT formed in the second conduction layer, a plurality of bottom horizontal line segments HLB formed in the third conduction layer and a plurality of vertical line segments VL connecting the first top horizontal line segments HLT and the bottom horizontal line segments HLB respectively to form the first conduction loop LOOPa. The second conduction loop LOOPb may include a plurality of second top horizontal line segments HL formed on the first conduction layer. The first top horizontal line segments HLT, the bottom horizontal line segments HLB and the vertical line segments VL may be disposed alternatively along the first conduction loop LOOPa and connect a first input end node ENI1 and a first output end node ENO1 in a ring shape to surround the central region of the semiconductor die. The second top horizontal line segments HL may connect a second input end node ENI2 and a second output end node ENI2 in a ring shape to surround the central region of the semiconductor die.

In some example embodiments, the input end nodes ENI1 and ENI2, and the output end nodes ENO1 and ENO2 may be connected to input-output pads formed on a surface of the semiconductor die so that the conduction loops LOOPa and LOOPb may be connected to an external tester through the input-output pads. In some example embodiments, the input end nodes ENI1 and ENI2 and the output end nodes ENO1 and ENO2 may be connected to a crack test circuit such as a crack detector formed in a portion of the central region of the semiconductor die.

Figure 18:
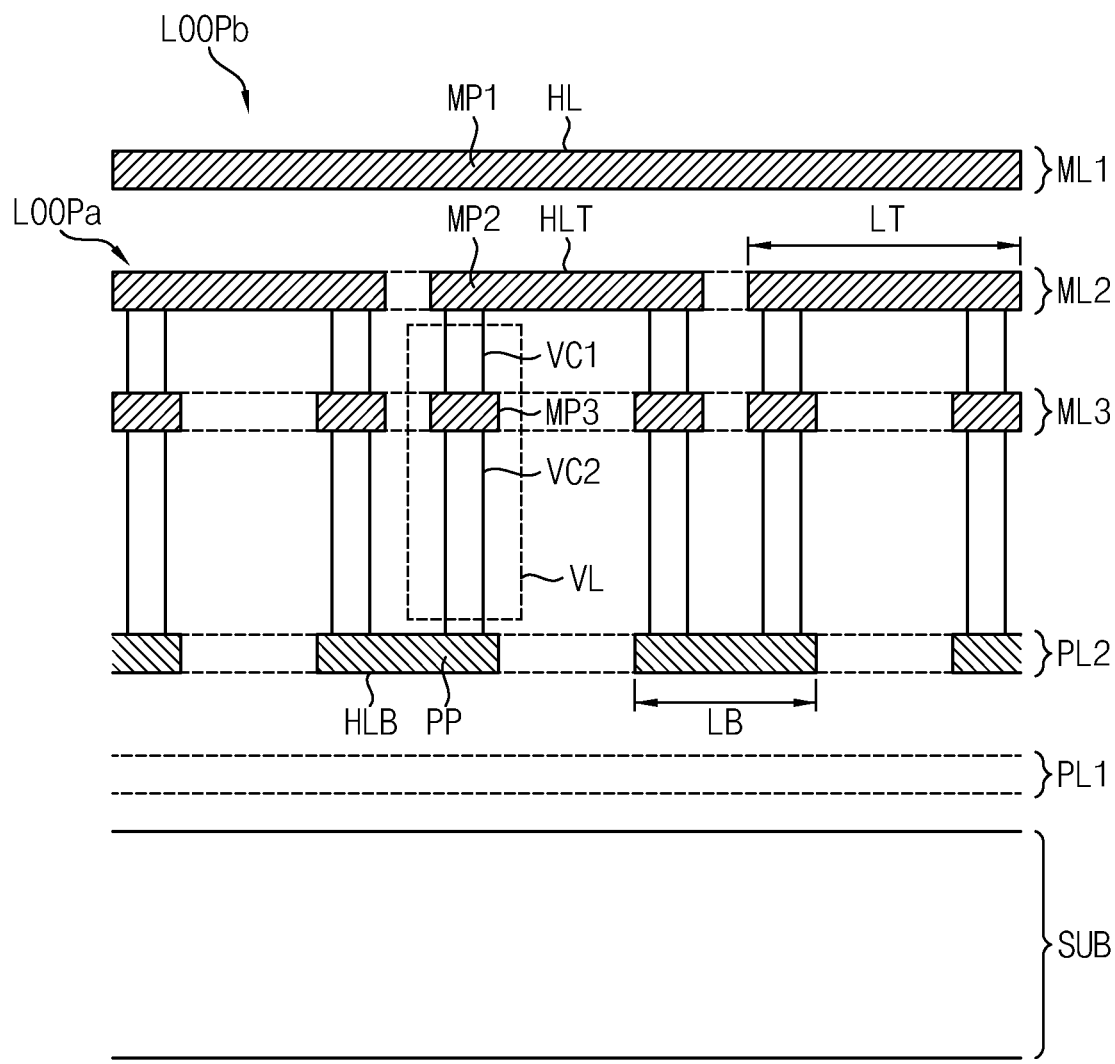
FIGS. 18 and 19 are cross-sectional diagrams illustrating a vertical structure of a three-dimensional detection structure according to example embodiments.
Figure 19:
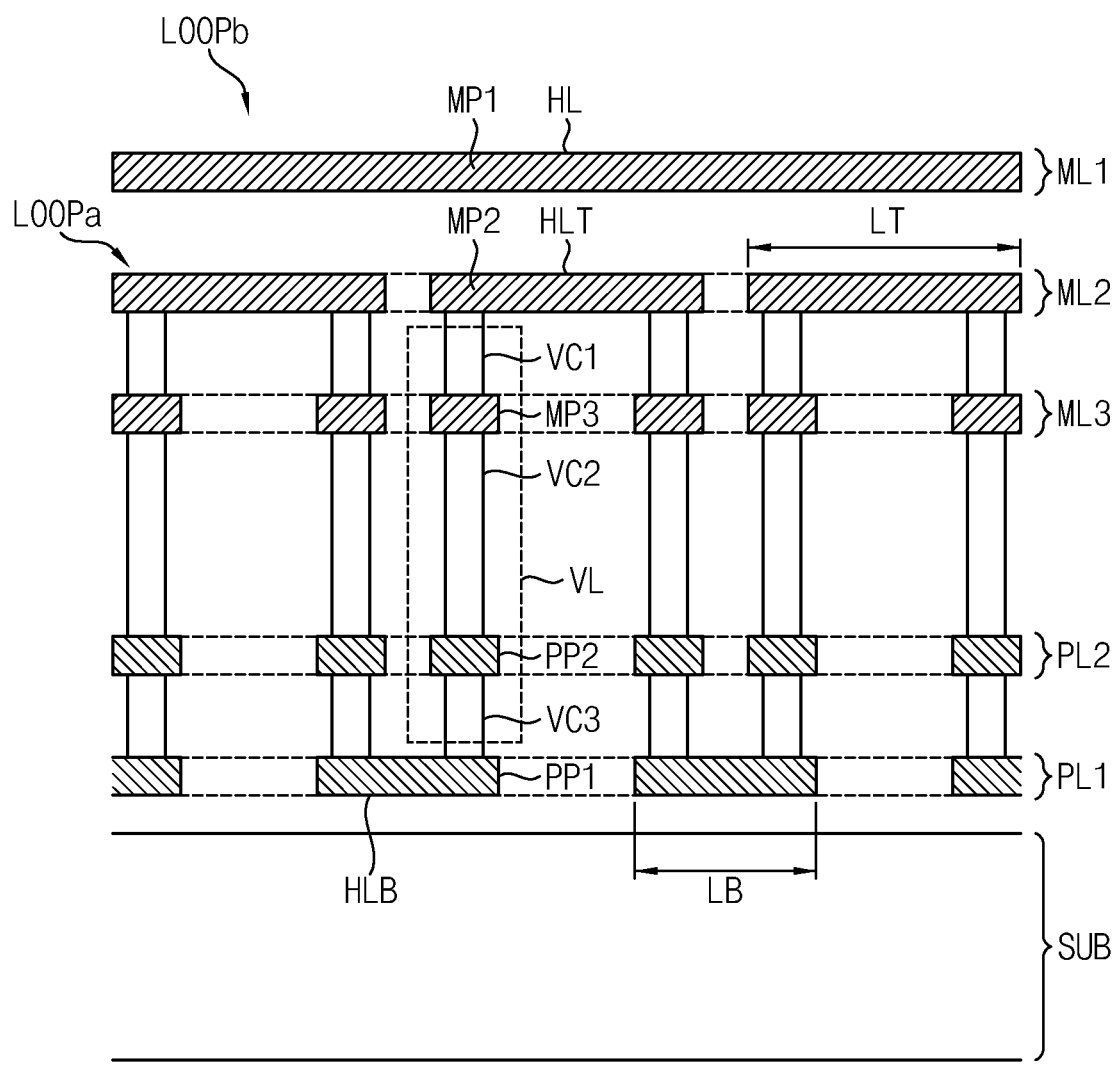

FIGS. 18 and 19 are cross-sectional diagrams illustrating a vertical structure of a three-dimensional detection structure according to example embodiments. Hereinafter, descriptions substantially similar to those provided above with respect to FIGS. 12 through 17 may be omitted.

Referring to FIG. 18, the first conduction loop LOOPa may include a plurality of first top horizontal line segments HLT formed in the second conduction layer ML2, a plurality of bottom horizontal line segments HLB formed in the second conduction layer PL2 and a plurality of vertical line segments VL connecting the first top horizontal line segments HLT and the bottom horizontal line segments HLB respectively to form the first conduction loop LOOPa. The second conduction loop LOOPb may include a plurality of second top horizontal line segments HL formed in the first conduction layer ML1 over the second conduction layer ML2.

As shown in FIG. 18, the first conduction layer ML1 may correspond to an uppermost metal layer among the metal layers ML1, ML2 and ML3 that are formed over the semiconductor substrate SUB, the second conduction layer ML2 may be a metal layer under the uppermost metal layer ML1, and the third conduction layer PL2 may correspond to the bit-line polysilicon layer that is formed between the semiconductor substrate SUB and the metal layers ML1, ML2 and ML3. The first top horizontal line segments HLT may include metal line patterns MP2 formed in the second metal layer ML2, and the bottom horizontal line segments HLB may include polysilicon line patterns PP formed in the bit-line polysilicon layer PL2. The second top horizontal line segments HL may include metal line patterns MP1 formed in the first metal layer ML1.

Referring to FIG. 19, the first conduction loop LOOPa may include a plurality of first top horizontal line segments HLT formed in the second conduction layer ML2, a plurality of bottom horizontal line segments HLB formed in the second conduction layer PL1 and a plurality of vertical line segments VL connecting the first top horizontal line segments HLT and the bottom horizontal line segments HLB respectively to form the first conduction loop LOOPa. The second conduction loop LOOPb may include a plurality of second top horizontal line segments HL formed in the first conduction layer ML1 over the second conduction layer ML2.

As shown in FIG. 19, the first conduction layer ML1 may correspond to an uppermost metal layer among the metal layers ML1, ML2 and ML3 that are formed over the semiconductor substrate SUB, the second conduction layer ML2 may be a metal layer under the uppermost metal layer ML1, and the third conduction layer PL1 may correspond to the gate polysilicon layer that is formed between the semiconductor substrate SUB and the metal layers ML1, ML2 and ML3. The first top horizontal line segments HLT may include metal line patterns MP2 formed in the metal layer ML2, and the bottom horizontal line segments HLB may include polysilicon line patterns PP1 formed in the gate polysilicon layer PL1. The second top horizontal line segments HL may include metal line patterns MP1 formed in the first metal layer ML1.

As described with reference to FIGS. 18 and 19, the three-dimensional detection structure according to example embodiments may extend in the vertical direction Z to the various depths. Using the three-dimensional detection structure, the crack penetration of various types may be detected more thoroughly.

Figure 20:
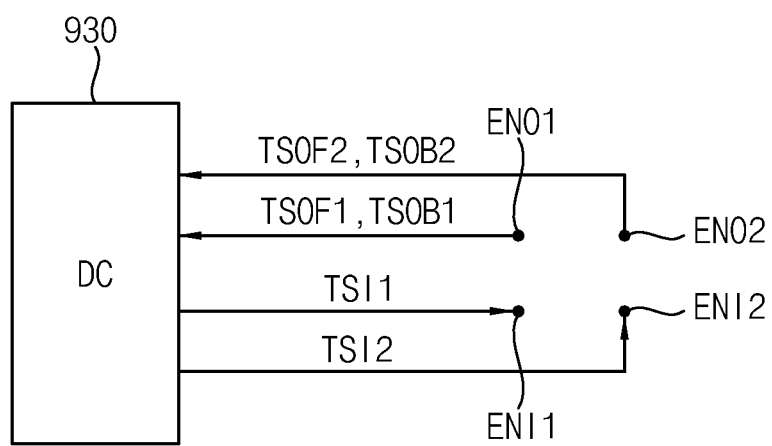
FIG. 20 is a diagram for describing a method of detecting a crack in a semiconductor device according to example embodiments.

FIG. 20 is a diagram for describing a method of detecting a crack in a semiconductor device according to example embodiments.

The semiconductor device may include a three-dimensional detection structure. For example, the semiconductor device may include the first conduction loop LOOPa and the second conduction loop LOOPb, as described above.

As described above, a detection circuit 930 may be included in an external tester or in an internal circuit of the semiconductor device. The detection circuit 930 may apply a first test input signal TSI1 to the first conduction loop LOOPa along a forward direction and a backward direction through a first test input pad PTI1 and then receive a first forward test output signal TSOF1 and a first backward test output signal TSOB1 through a first test output pad PTO1. In addition, the detection circuit 930 may apply a second test input signal TSI2 to the second conduction loop LOOPb along a forward direction and a backward direction through a second test input pad PTI2 and then receive a second forward test output signal TSOF2 and a second backward test output signal TSOB2 through a second test output pad PTO2.

The detection circuit 930 may determine whether a defect (i.e., a crack) occurs in the first conduction loop LOOPa and a position of the defect based on a propagation time interval difference of the first forward test output signal TSOF1 and the first backward test output signal TSOB1, and may determine whether a defect (i.e., a crack) occurs in the second conduction loop LOOPb and a position of the defect based on a propagation time interval difference of the second forward test output signal TSOF2 and the second backward test output signal TSOB2.

Figure 21:
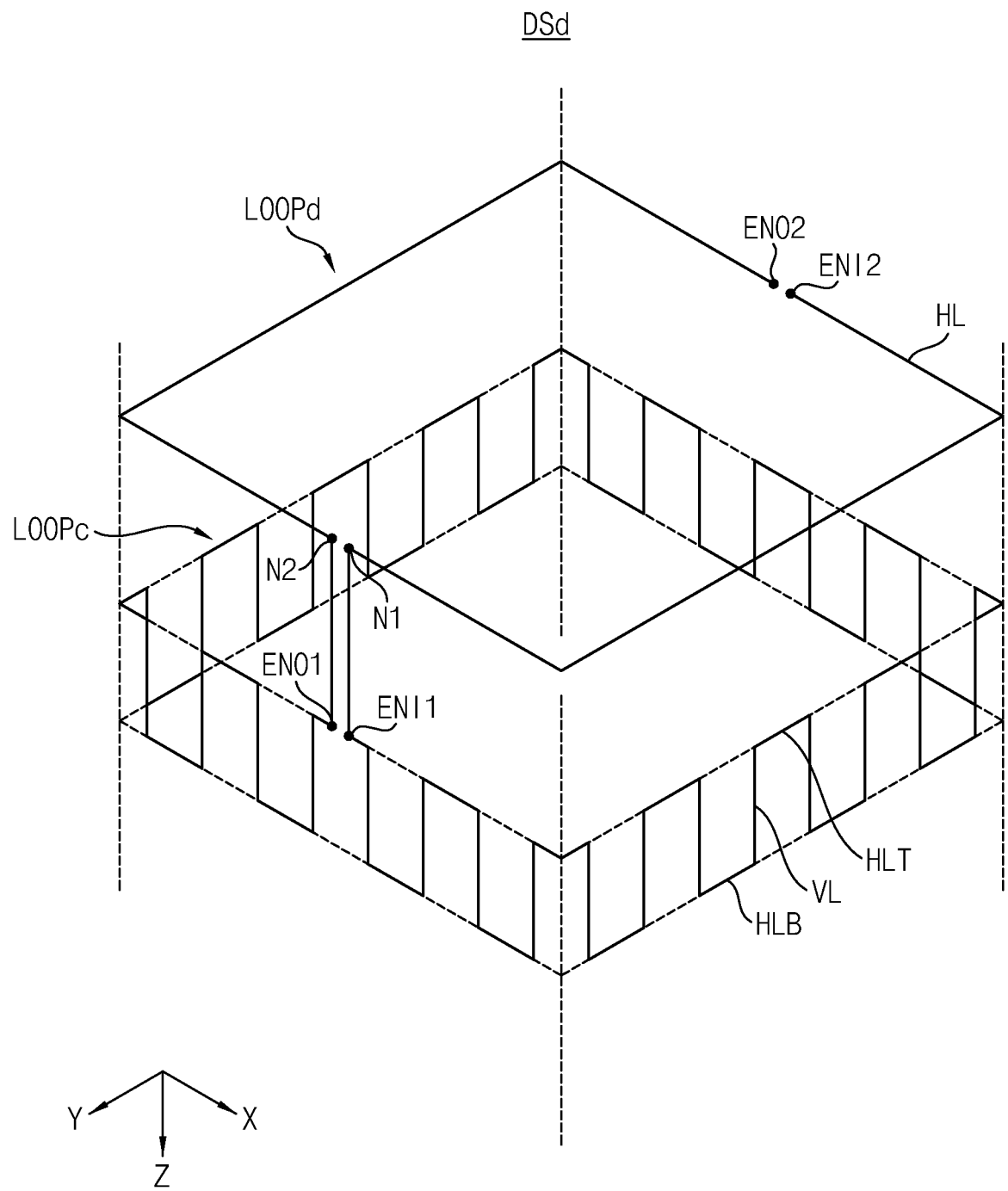
FIG. 21 is a perspective view of a three-dimensional detection structure according to example embodiments.

FIG. 21 is a perspective view of a three-dimensional detection structure according to example embodiments.

Referring to FIG. 21, a three-dimensional detection structure DSd may include a first conduction loop LOOPc and a second conduction loop LOOPd. As described above, the semiconductor die may include a first conduction layer, a second conduction layer under the first conduction layer and a third conduction layer under the second conduction layer. The conduction layers may include a metal layer in which metal line segments are patterned and/or a polysilicon layer in which polysilicon line segments are patterned. The first conduction loop LOOPc may extend in the vertical direction Z between the second conduction layer and the third conduction layer in a three-dimensional shape. The second conduction loop LOOPd may be formed in the first conduction layer in a two-dimensional shape.

The first conduction loop LOOPc may include a plurality of first top horizontal line segments HLT formed in the second conduction layer, a plurality of bottom horizontal line segments HLB formed in the third conduction layer and a plurality of vertical line segments VL connecting the first top horizontal line segments HLT and the bottom horizontal line segments HLB respectively to form the first conduction loop LOOPc. The second conduction loop LOOPd may include a plurality of second top horizontal line segments HL formed on the first conduction layer. The first top horizontal line segments HLT, the bottom horizontal line segments HLB and the vertical line segments VL may be disposed alternatively along the first conduction loop LOOPc and connect a first input end node ENI1 and a first output end node ENO1 in a ring shape to surround the central region of the semiconductor die. The second top horizontal line segments HL may connect a second input end node ENI2 and a second output end node ENI2 in a ring shape to surround the central region of the semiconductor die. As illustrated in FIG. 21, the end nodes ENI1 and ENO1 of the first conduction loop LOOPc may be connected to intermediate nodes of the second conduction loop LOOPd such that the first and second conduction loops LOOPc and LOOPd may form a combined conduction loop.

In some example embodiments, the second input end node ENI2 and the second output end node ENO2 may be connected to input-output pads formed on a surface of the semiconductor die so that the combined conduction loop may be connected to an external tester through the input-output pads. In some example embodiments, the second input end node ENI2 and the second output end node ENO2 may be connected to a path control circuit formed in a portion of the central region of the semiconductor die.

Figure 22:
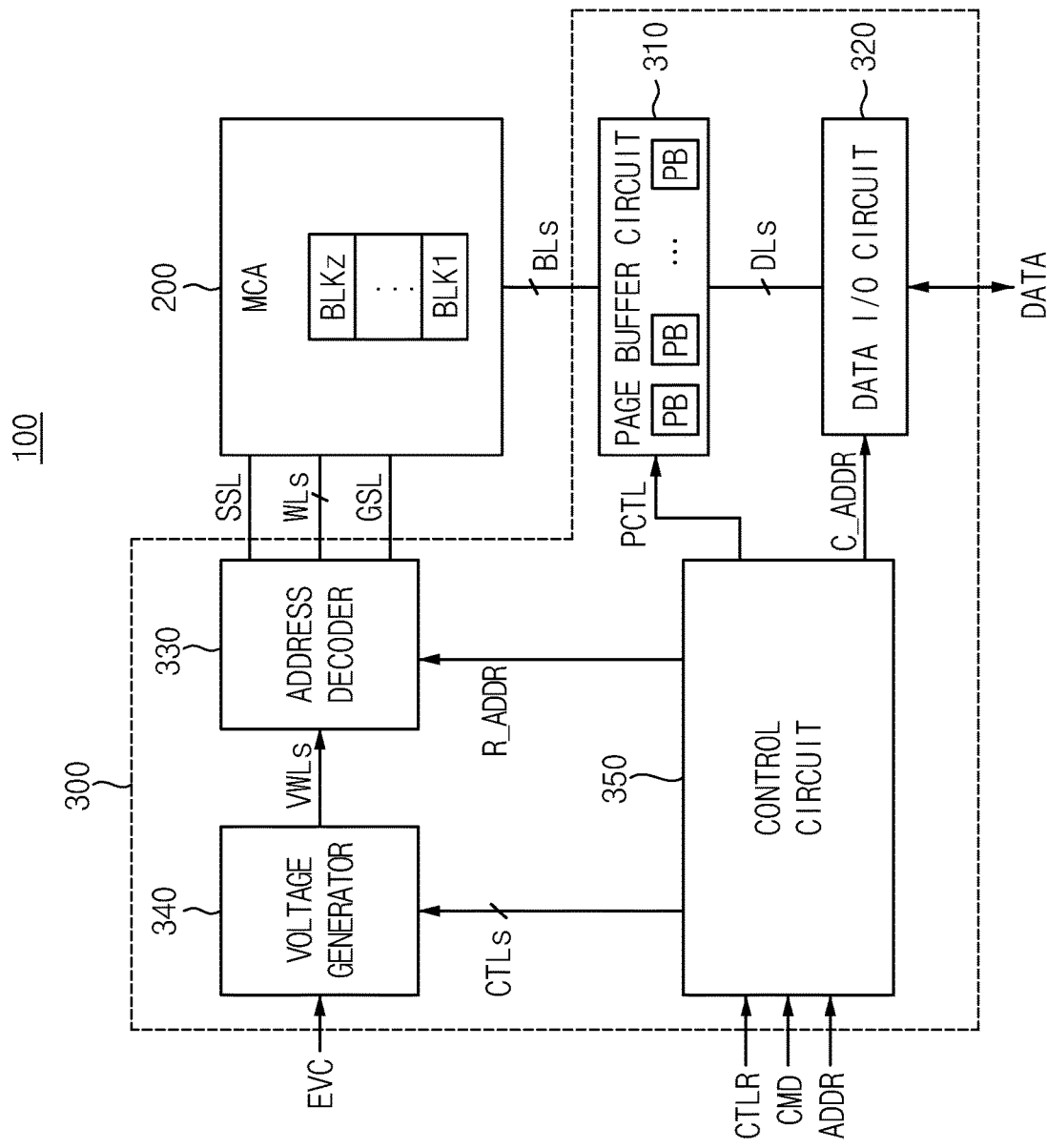
FIG. 22 is a block diagram illustrating a semiconductor device according to example embodiments.

FIG. 22 is a block diagram illustrating a semiconductor device according to example embodiments.

Hereinafter, it is assumed that a semiconductor device corresponds to a nonvolatile memory device.

Referring to FIG. 22, a nonvolatile memory device 100 may include a memory cell array 200 and a peripheral circuit 300. The peripheral circuit 300 may include a page buffer circuit 310, a data input/output (I/O) circuit 320, a control circuit 350, a voltage generator 340, and an address decoder 330.

The memory cell array 200 may be coupled to the address decoder 330 through a string selection line SSL, a plurality of word-lines WLs, and a ground selection line GSL.

In addition, the memory cell array 200 may be coupled to the page buffer circuit 310 through a plurality of bit-lines BLs. The memory cell array 200 may include a plurality of nonvolatile memory cells coupled to the plurality of word-lines WLs and the plurality of bit-lines BLs.

The memory cell array 200 may include a plurality of memory blocks BLK1 through BLKz, and each of the memory blocks BLK1 through BLKz may have a three-dimensional (3D) structure. Here, z is an integer greater than two. The memory cell array 200 may include a plurality of (vertical) cell strings (e.g., NAND strings) and each of the cell strings includes a plurality of memory cells stacked with respect to each other.

The control circuit 350 may receive a command CMD, an address ADDR, and a control signal CTRL from an external memory controller and may control, for example, an erase loop, a program loop and a read operation of the nonvolatile memory device 100. The program loop may include a program operation and a program verification operation and the erase loop may include an erase operation and an erase verification operation.

In example embodiments, the control circuit 350 may generate control signals CTLs, which are used for controlling the voltage generator 340, based on the command CMD, may generate a page buffer control signal PCTL for controlling the page buffer circuit 310, and may generate a row address R_ADDR and a column address C_ADDR based on the address ADDR. The control circuit 350 may provide the row address R_ADDR to the address decoder 330, may provide the column address C_ADDR to the data I/O circuit 320, may provide the control signals CTLs to the voltage generator 340 and may provide the page buffer control signal PCTL to the page buffer circuit 310.

The address decoder 330 may be coupled to the memory cell array 200 through the string selection line SSL, the plurality of word-lines WLs, and the ground selection line GSL. During program operation or read operation, the address decoder 330 may determine one of the plurality of word-lines WLs as a selected word-line based on the row address R_ADDR and may determine the plurality of word-lines WLs except the selected word-line as unselected word-lines.

The voltage generator 340 may generate word-line voltages VWLs associated with operations of the nonvolatile memory device 100 using an external voltage EVC provided from the memory controller based on control signals CTLs from the control circuit 350. The word-line voltages VWLs may be applied to the plurality of word-lines WLs through the address decoder 330.

For example, during the erase operation, the voltage generator 340 may apply an erase voltage to a well of a selected memory block and may apply a ground voltage to all word-lines of the selected memory block. During the erase verification operation, voltage generator 340 may apply an erase verification voltage to all word-lines of the selected memory block or may apply the erase verification voltage to the word-lines of the selected memory block on a word-line basis.

For example, during the program operation, the voltage generator 340 may apply a program voltage to the selected word-line and may apply a program pass voltage to the unselected word-lines. In addition, during the program verification operation, the voltage generator 340 may apply a program verification voltage to the selected word-line and may apply a verification pass voltage to the unselected word-lines. In addition, during the read operation, the voltage generator 340 may apply a read voltage to the selected word-line and may apply a read pass voltage to the unselected word-lines.

The page buffer circuit 310 may be coupled to the memory cell array 200 through the plurality of bit-lines BLs. The page buffer circuit 310 may include a plurality of page buffers PB. The page buffer circuit 310 may temporarily store data to be programmed in a selected page or data read out from the selected page of the memory cell array 200.

In example embodiments, page buffer units included in each of the plurality of page buffers PB (and cache latches included in each of the plurality of page buffers PB may be spaced apart from each other, and may have separate structures. Accordingly, the degree of freedom of wirings on the page buffer units may be increased, and the complexity of a layout may be reduced. In addition, because the cache latches are adjacent to data I/O lines, the distance between the cache latches and the data I/O lines may be reduced, and thus, data I/O speed may be increased.

The data I/O circuit 320 may be coupled to the page buffer circuit 310 through a plurality of data lines DLs. During the program operation, the data I/O circuit 320 may receive program data DATA from the memory controller and provide the program data DATA to the page buffer circuit 310 based on the column address C_ADDR received from the control circuit 450. During the read operation, the data I/O circuit 320 may provide read data DATA to the memory controller based on the column address C_ADDR received from the control circuit 350.

Figure 23:
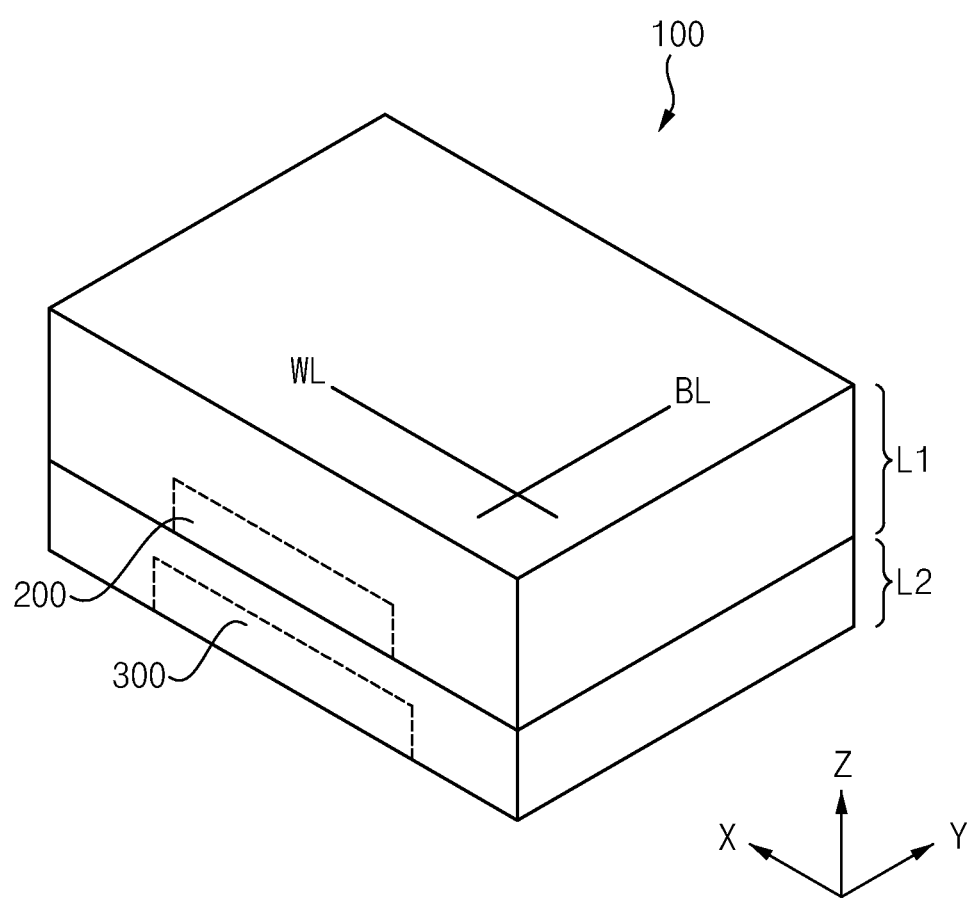
FIG. 23 schematically illustrates a structure of the nonvolatile memory device of FIG. 22 according to example embodiments.

FIG. 23 schematically illustrates a structure of the nonvolatile memory device of FIG. 22 according to example embodiments.

Referring to FIG. 23, the nonvolatile memory device 100 may include a first semiconductor layer L1 and a second semiconductor layer L2. The first semiconductor layer L1 may be stacked in a vertical direction Z with respect to the second semiconductor layer L2. The second semiconductor layer L2 may be disposed under the first semiconductor layer L1 in the vertical direction Z, and accordingly, the second semiconductor layer L2 may be close to a substrate. For example, among the first semiconductor layer L1 and the second semiconductor layer L2, the second semiconductor layer L2 may be disposed closer to a substrate.

In example embodiments, the memory cell array 200 in FIG. 22 may be formed (or provided) on the first semiconductor layer L1, and the peripheral circuit 300 in FIG. 22 may be formed (or provided) on the second semiconductor layer L2.

Accordingly, the nonvolatile memory device 100 may have a structure in which the memory cell array 200 is disposed on the peripheral circuit 300, that is, a cell over periphery (COP) structure. The COP structure may effectively reduce an area in a horizontal direction and increase the degree of integration of the nonvolatile memory device 100.

In example embodiments, the second semiconductor layer L2 may include a substrate, and by forming transistors on the substrate and metal patterns for wiring transistors, the peripheral circuit 300 may be formed in the second semiconductor layer L2. After the peripheral circuit 300 is formed on the second semiconductor layer L2, the first semiconductor layer L1 including the memory cell array 200 may be formed, and the metal patterns for connecting the word-lines WL and the bit-lines BL of the memory cell array 200 to the peripheral circuit 300 formed in the second semiconductor layer L2 may be formed. For example, the word-lines WL may extend in a first direction X and the bit-lines BL may extend in a second direction Y.

Figure 24:
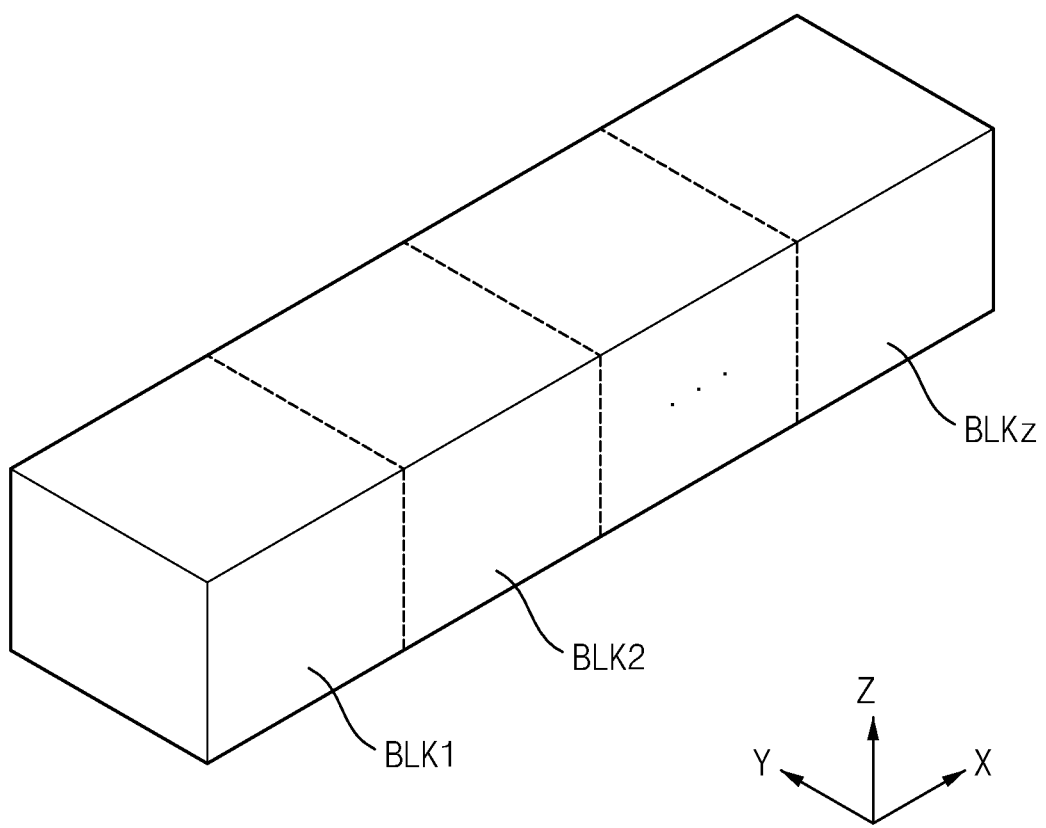
FIG. 24 is a block diagram illustrating an example of the memory cell array in FIG. 22 according to example embodiments.

FIG. 24 is a block diagram illustrating an example of the memory cell array in FIG. 22 according to example embodiments.

Referring to FIG. 24 the memory cell array 200 may include a plurality of memory blocks BLK1 to BLKz which extend along a plurality of directions including a first direction X, a second direction Y and a vertical direction, in which z is a positive integer. In an example embodiment, the memory blocks BLK1 to BLKz are selected by the address decoder 330 in FIG. 22. For example, the address decoder 330 may select a memory block BLK corresponding to a block address among the memory blocks BLK1 to BLKz.

Figure 25:
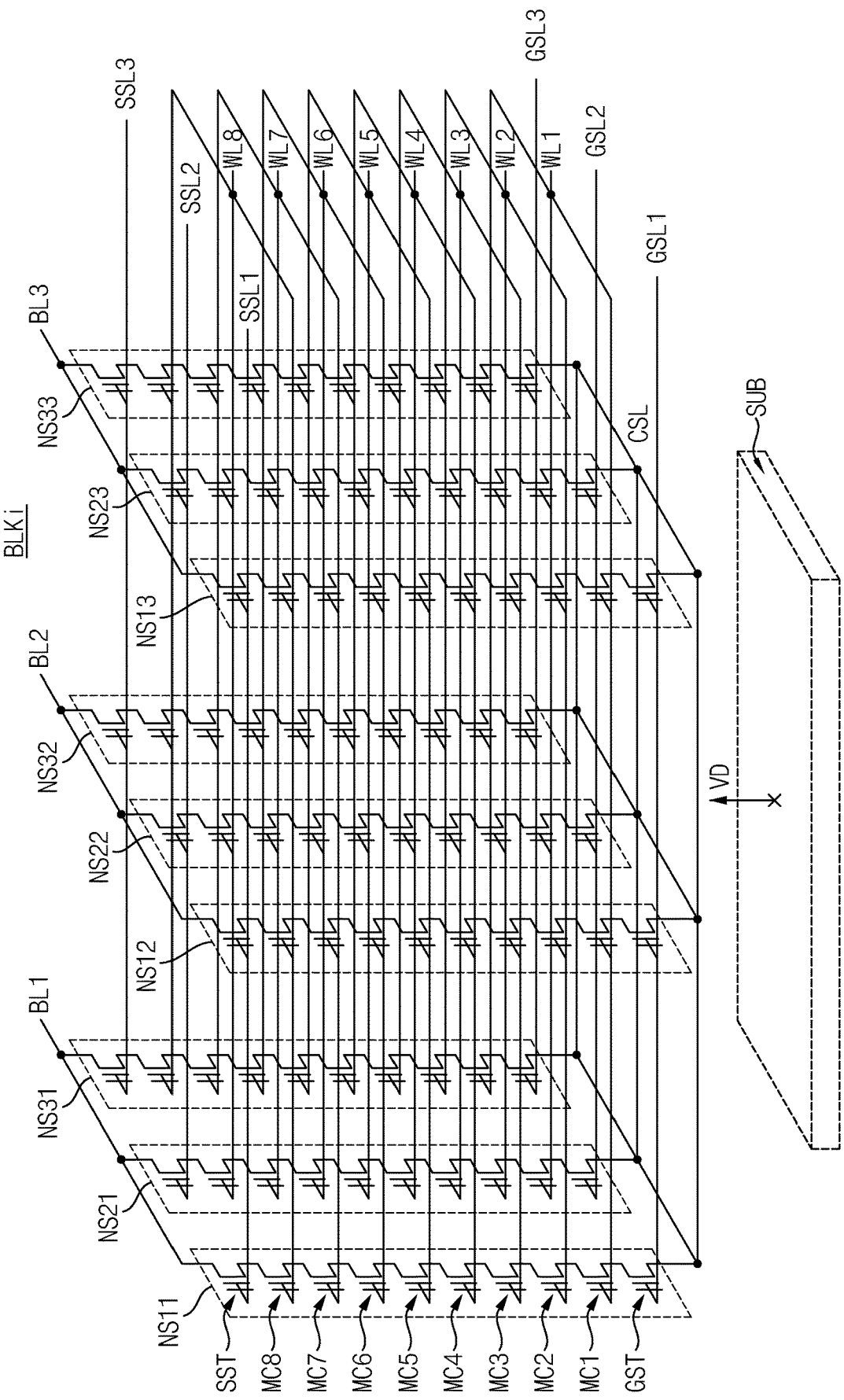
FIG. 25 is a circuit diagram illustrating one of the memory blocks of FIG. 24 according to example embodiments.

FIG. 25 is a circuit diagram illustrating one of the memory blocks of FIG. 24 according to example embodiments.

The memory block BLKi of FIG. 25 may be formed on a substrate SUB in a three-dimensional structure (or a vertical structure). For example, a plurality of memory cell strings included in the memory block BLKi may be formed in the vertical direction VD substantially perpendicular to the substrate SUB. Here, i corresponds to one of 1 to z.

Referring to FIG. 25, the memory block BLKi may include cell strings (or, NAND strings) NS11 to NS33 coupled between bit-lines BL1, BL2 and BL3 and a common source line CSL. Each of the cell strings NS11 to NS33 may include a string selection transistor SST, a plurality of memory cells MC1 to MC8, and a ground selection transistor GST. In FIG. 25, each of the cell strings NS11 to NS33 is illustrated to include eight memory cells MC1 to MC8. However, example embodiments of the present disclosure are not limited thereto. For example, in some example embodiments, each of the cell strings NS11 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., WL1) at the same vertical level may be commonly connected, and the ground selection lines GSL1 to GSL3 and the string selection lines SSL1 to SSL3 may be separated.

Figure 26:
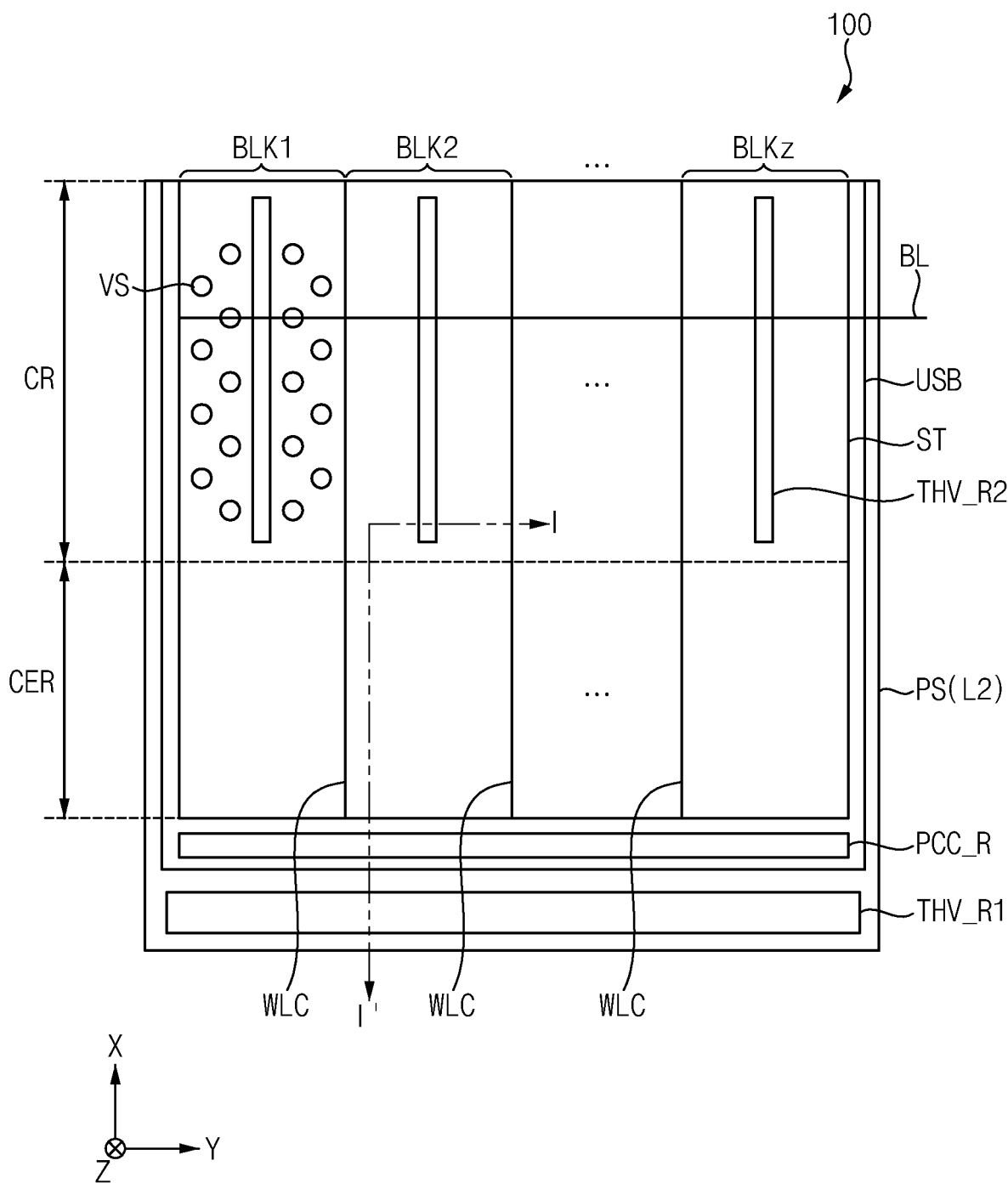
FIG. 26 is a layout diagram of a nonvolatile memory device according to example embodiments.
Figure 27:
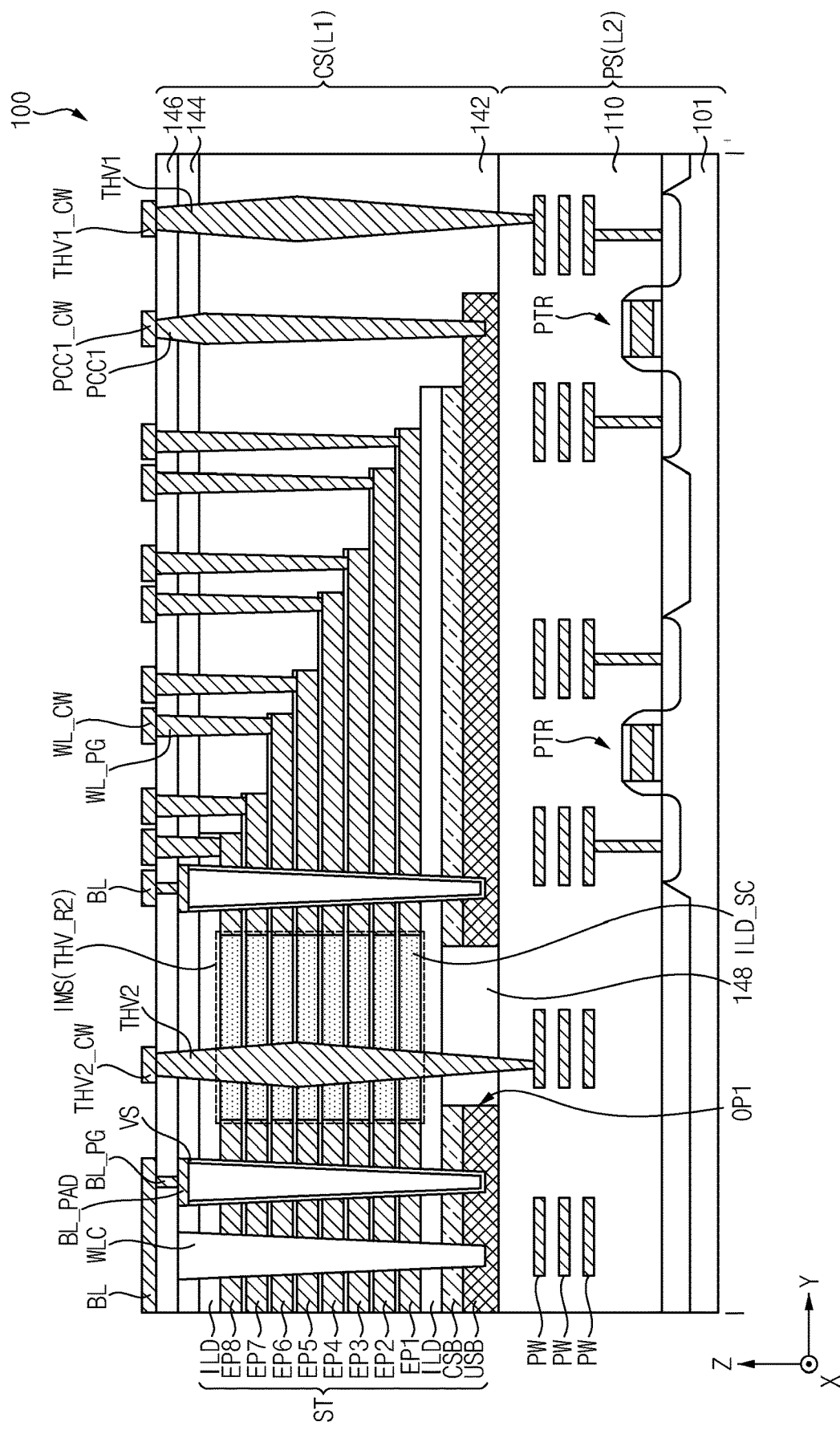
FIG. 27 is a cross-sectional view taken along a line A-A' of FIG. 26.

FIG. 26 is a layout diagram of a nonvolatile memory device according to example embodiments. FIG. 27 is a cross-sectional view taken along a line A-A' of FIG. 26.

Referring to FIG. 26, a nonvolatile memory device 100 include a peripheral logic structure PS, a horizontal conductive substrate USB, and an electrode structure ST. The peripheral logic structure PS may correspond to the second semiconductor layer L2 in FIG. 23 and the stacked structure ST may correspond to the first semiconductor layer L1 in FIG. 23. The stacked structure ST includes a cell array region CR and a cell extension region CER.

A memory cell array (e.g., 200 in FIG. 22) including a plurality of memory cells may be formed in the cell array region CR. In an example embodiment, a vertical structure VS and a bit-line BL, which will be described below, may be formed in the cell array region CR.

The cell extension region CER may be around the cell array region CR. In an example embodiment, the cell array region CR and the cell extension region CER may extend along a direction in which a word-line cut region WLC extends. In example embodiment, the cell array region CR and the cell extension region CER may extend along the first direction X. A plurality of electrode pads EP1 to EP8, which will be described below, may be stacked stepwise in the cell extension region CER.

The electrode structure ST may include memory blocks (e.g., BLK1 to BLKz) separated by the word-line cut region WLC.

In an example embodiment, the cell extension region CER may be on one side of the cell array region CR, as illustrated in FIG. 26. In an example embodiment, the cell extension region CER may be disposed on both sides of the cell array region CR with the cell array region CR interposed therebetween.

In an example embodiment, a single electrode structure ST may be on the peripheral logic structure PS. In an example embodiment, two or more electrode structures ST may be on the peripheral logic structure PS.

A first penetration electrode region THV_R1 may be defined by a peripheral logic structure PS that does not overlap a horizontal conductive substrate USB in the vertical direction Z. The first penetration electrode region THV_R1 may extend in the second direction Y.

A second penetration electrode region THV_R2 may be defined by the electrode structure ST. In an example embodiment, the second penetration electrode region THV_R2 may be defined as a region extending in the first direction X. In an example embodiment, the second penetration electrode region THV_R2 may be defined only in the cell array region CR and not defined in the cell extension region CER. In an example embodiment, the second penetration electrode region THV_R2 may be defined in all the memory blocks BLK1 to BLKz.

A plate contact plug region PCC_R may be defined on the horizontal conductive substrate USB that does not overlap the electrode structure ST. The plate contact plug region PCC_R may extend along the second direction Y. The plate contact plug region PCC_R may be defined to be closer to the electrode structure ST than the first penetration electrode region THV_R1.

The first penetration electrode region THV_R1 and the second penetration electrode region THV_R2 may be regions in which the penetration electrodes (THV1 and THV2 of FIG. 27) are disposed. The plate contact plug region PCC_R may be a region in which the plate contact plug (PCC1 of FIG. 27) is disposed. This will be described more specifically below in the description of FIG. 27.

Referring to FIGS. 26 and 27, the nonvolatile memory device 100 may include a peripheral logic structure PS and a cell array structure CS.

The peripheral logic structure PS may include a pass transistor PTR, a lower connection wiring body PW, and a peripheral logic insulation film 110. The pass transistor PTR may be on a substrate 101. The pass transistor PTR may be included in the page buffer circuit 310 in FIG. 22 or may be included in the address decoder 330 in FIG. 22.

The substrate 101 may be bulk silicon or silicon-on-insulator (SOI). In an example embodiment, the substrate 101 may be a silicon substrate or may include other material. The peripheral logic insulation film 110 may be formed on the substrate 101. The peripheral logic insulation film 110 may include, e.g., silicon oxide, silicon nitride, silicon oxynitride, or a low dielectric constant material.

The lower connection wiring body PW may be in the peripheral logic insulation film 110. The lower connection wiring body PW may be connected to the pass transistor PTR.

The cell array structure CS may include a horizontal conductive substrate USB on the peripheral logic structure PS, and an electrode structure ST on the horizontal conductive substrate USB.

The horizontal conductive substrate USB may be on the peripheral logic structure PS. The horizontal conductive substrate USB may include a first opening OP1. The first opening OP1 may expose or be open to a part of the peripheral logic structure PS.

The horizontal conductive substrate USB may be a common source plate. In an example embodiment, the horizontal conductive substrate USB may serve as the common source line CSL of FIG. 25. The horizontal conductive substrate USB may include a conductive semiconductor film, a metal silicide film, or a metal film.

In an example embodiment, the horizontal conductive substrate USB may be formed as a plurality of layers or a single layer.

A filling insulation film 148 may be on the peripheral logic structure PS. The filling insulation film 148 may fill the first opening OP1. The electrode structure ST may be on the horizontal conductive substrate USB. The electrode structure ST may cover a part of the horizontal conductive substrate USB. In an example embodiment, the horizontal conductive substrate USB may include a first region that overlaps the electrode structure ST in the vertical direction Z, and a second region that does not overlap the electrode structure ST in the vertical direction Z. The second region of the horizontal conductive substrate USB may include the plate contact plug region PCC_R in FIG. 26.

The electrode structure ST may include a plurality of electrode pads EP1, EP2, EP3, EP4, EP5, EP6, EP7 and EP8 stacked in the vertical direction Z. The electrode structure ST may include an inter-electrode insulation film ILD between the plurality of electrode pads EP1, EP2, EP3, EP4, EP5, EP6, EP7 and EP8.

The electrode structure ST may include an insulating mold part IMS. The insulating mold part IMS may overlap the first opening OP1 of the horizontal conductive substrate USB in the vertical direction Z. The insulating mold part IMS may include the second penetration electrode region THV_R2 in FIG. 26. The insulating mold part IMS may include an inter-electrode insulation film ILD and a sacrificial mold insulation film ILD_SC having an etching selection ratio. The inter-electrode insulation film ILD and the sacrificial mold insulation film ILD_SC may be alternately stacked. For example, the inter-electrode insulation film ILD may include silicon oxide, and the sacrificial mold insulation film ILD_SC may include silicon nitride.

The word-line cut region WLC may be disposed in the electrode structure ST. The word-line cut region WLC may extend in the first direction X. Each word-line cut region WLC may be spaced apart from each other in the second direction Y. Each word-line cut region WLC may completely cut the electrode structure ST. The electrode structure ST cut by the two adjacent word-line cut region WLC may form one of the memory blocks BLK1 to BLKz.

A plurality of vertical structures VS may be on the horizontal conductive substrate USB. The plurality of vertical structures VS may penetrate the electrode structure ST. The plurality of vertical structures VS may be electrically connected to the horizontal conductive substrate USB. The vertical structures VS may include side wall parts that extend in the vertical direction Z, and a bottom part that connects the side wall parts of the vertical structure VS. The side wall parts of the vertical structures VS may have a pipe shape having a hollow space inside, e.g., a cylindrical shape or a macaroni shape.

A first interlayer insulation film 142 may be on the peripheral logic structure PS. The first interlayer insulation film 142 may cover the electrode structure ST and the horizontal conductive substrate USB. A second interlayer insulation film 144 and a third interlayer insulation film 146 may be sequentially formed on the first interlayer insulation film 142. A part of the word-line cut region WLC may extend to the second interlayer insulation film 144.

The bit-lines BL may be on the stacked structure ST. The bit-lines BL may extend in the second direction Y. The bit lines BL may be electrically connected to at least one of the plurality of vertical structures VS.

The bit-lines BL may be on a third interlayer insulation film 146. The bit-lines BL may be electrically connected to the vertical structures VS via a bit-line pad BL_PAD and a bit-line plug BL_PG. The bit-lines BL, the bit-line pad BL_PAD, and the bit-line plug BL PG each include a conductive material.

A plurality of electrode plugs WL_PG may be in the first to third interlayer insulation films 142, 144 and 146. The plurality of electrode plugs WL_PG may be in the cell extension region CER.

Each electrode plug WL_PG may be electrically connected to the respective electrode pads EP1 to EP8. The respective electrode plugs WL_PG may connect the respective electrode pads EP1 to EP8 and a word line connection wiring WL_CW.

A first penetration electrode THV1 may be in the first penetration electrode region THV_R1. The first penetration electrode THV1 may extend in the vertical direction Z. The first penetration electrode THV1 may be in the first to third interlayer insulation films 142, 144 and 146 and the peripheral logic insulation film 110. The first penetration electrode THV1 may not penetrate the electrode structure ST. The first penetration electrode THV1 may be connected to a lower connection wiring body PW and a first penetration electrode connection wiring THV1_CW.

A first plate contact plug PCC1 may be in a plate contact plug region PCC_R. The first plate contact plug PCC1 may extend in the vertical direction Z. The first plate contact plug PCC1 may be in the first to third interlayer insulation films 142, 144 and 146. The first plate contact plug PCC1 may not penetrate the stacked structure ST.

The first plate contact plug PCC1 may be connected to the horizontal conductive substrate USB. The first plate contact plug PCC1 may be electrically connected to the horizontal conductive substrate USB in the second region of the horizontal conductive substrate USB. The first plate contact plug PCC1 may be connected to the first plate contact connection wiring PCC1_CW. A part of the first plate contact plug PCC1 may be in the horizontal conductive substrate USB.

A second penetration electrode THV2 may be in the second penetration electrode region THV_R2. The second penetration electrode THV2 may extend in the vertical direction Z. The second penetration electrode THV2 may be in the insulating mold part IMS, the filling insulation film 148, and the peripheral logic insulation film 110. The second penetration electrode THV2 may penetrate the stacked structure ST, e.g., the insulating mold part IMS. The second penetration electrode THV2 may be in the cell array region CR. The second penetration electrode THV2 may pass through the first opening OP1. The second penetration electrode THV2 may be connected to the lower connection wiring body PW and the second penetration electrode connection wiring THV2_CW.

Figure 28:
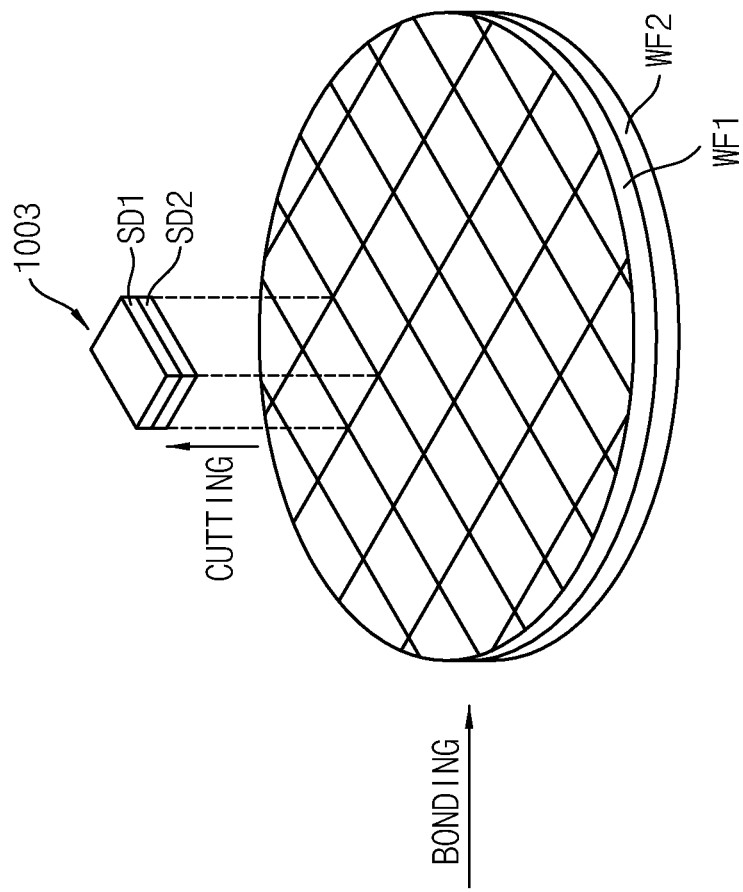
FIG. 28 is a diagram for describing manufacturing processes of a stacked semiconductor device according to example embodiments.
Figure 28:
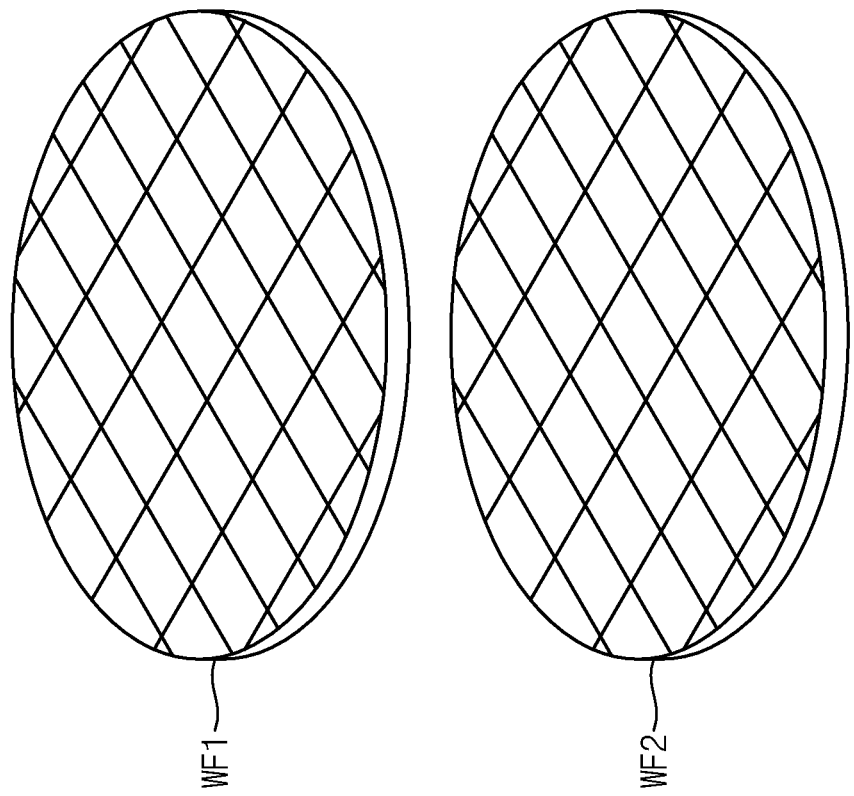

FIG. 28 is a diagram for describing manufacturing processes of a stacked semiconductor device according to example embodiments.

Referring to FIG. 28, respective integrated circuits may be formed in a first wafer WF1 and a second wafer WF2. The same circuits may be integrated in the first wafer WF1 and the second wafer WF2 or different circuits may be integrated in the first wafer WF1 and the second wafer WF2. For example, a memory cell array may be formed in the first wafer WF1 and other circuits may be formed in the second wafer WF2. Even though FIG. 28 illustrates the vertical stacking of the two wafers WF1 and WF2 (e.g., wafer WF1 is stacked on wafer WF2), three or more wafers may be stacked vertically.

After the integrated circuits are formed in the first and second wafers WF1 and WF2, the first wafer WF1 and the second wafer WF2 are bonded. The bonded wafers WF1 and WF2 are cut and divided into a plurality of chips where each chip corresponds to a semiconductor device 1003 including a first semiconductor die SD1 and a second semiconductor die SD2 that are stacked vertically (e.g., the first semiconductor die SD1 is stacked on the second semiconductor die SD2, etc.). Each cut portion of the first wafer WF1 corresponds to the first semiconductor die SD1 and each cut portion of the second wafer WF2 corresponds to a second semiconductor die SD2.

According to example embodiments, each semiconductor device 1003 may include first and second semiconductor dies SD1 and SD2 that are stacked in the vertical direction. Each of the semiconductor dies SD1 and SD2 includes a central region and an external region surrounding the central region. A semiconductor integrated circuit is formed in the central region of the first semiconductor die SD1. A three-dimensional detection structure is formed in the external region of the first semiconductor die SD1 and the second semiconductor die SD2. In some example embodiments, the three-dimensional detection structure may include a single conduction loop, or may include two conduction loops as described above.

Figure 29:
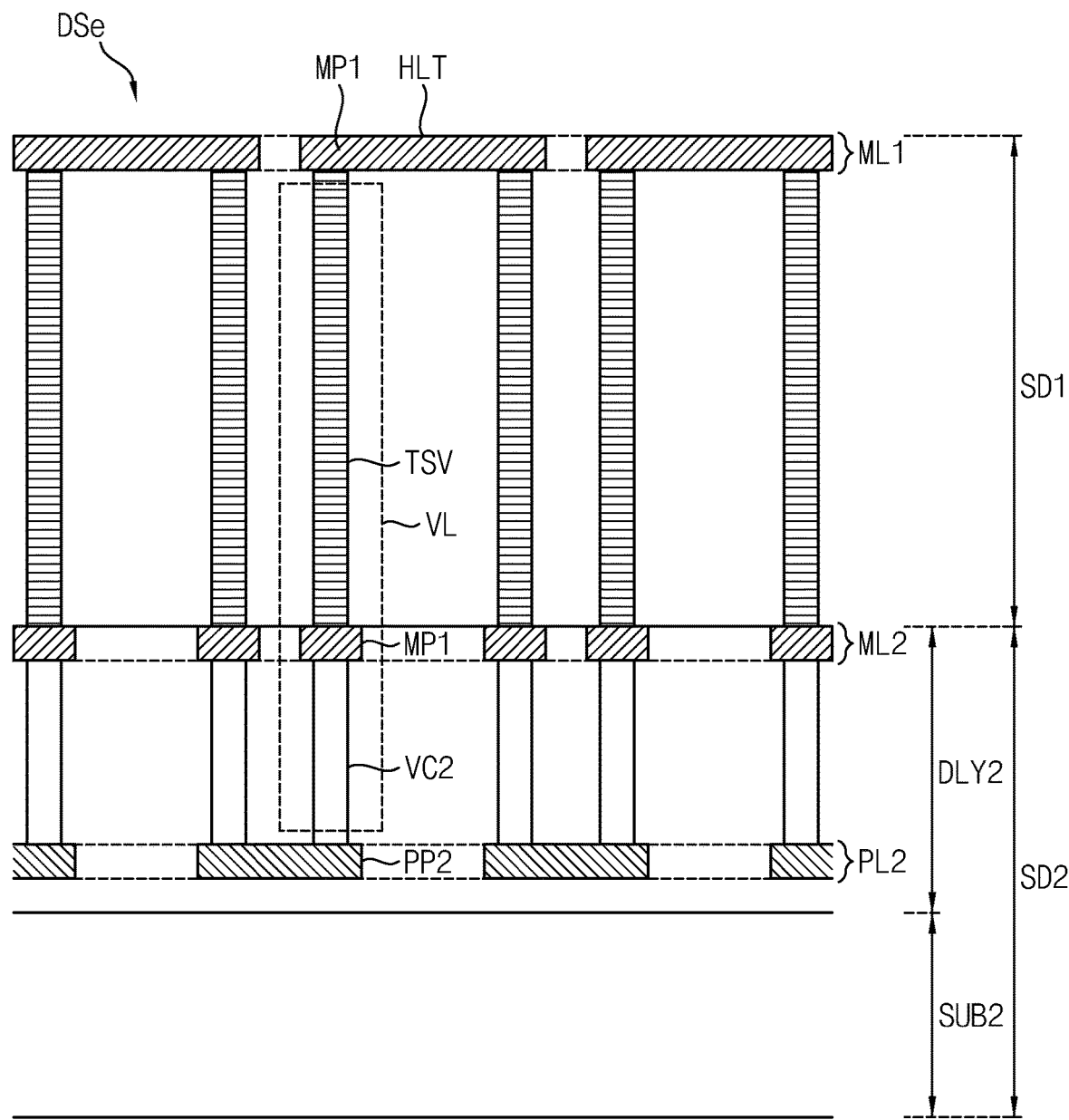
FIGS. 29 and 30 are cross-sectional diagrams illustrating a vertical structure of a three-dimensional detection structure according to example embodiments.
Figure 30:
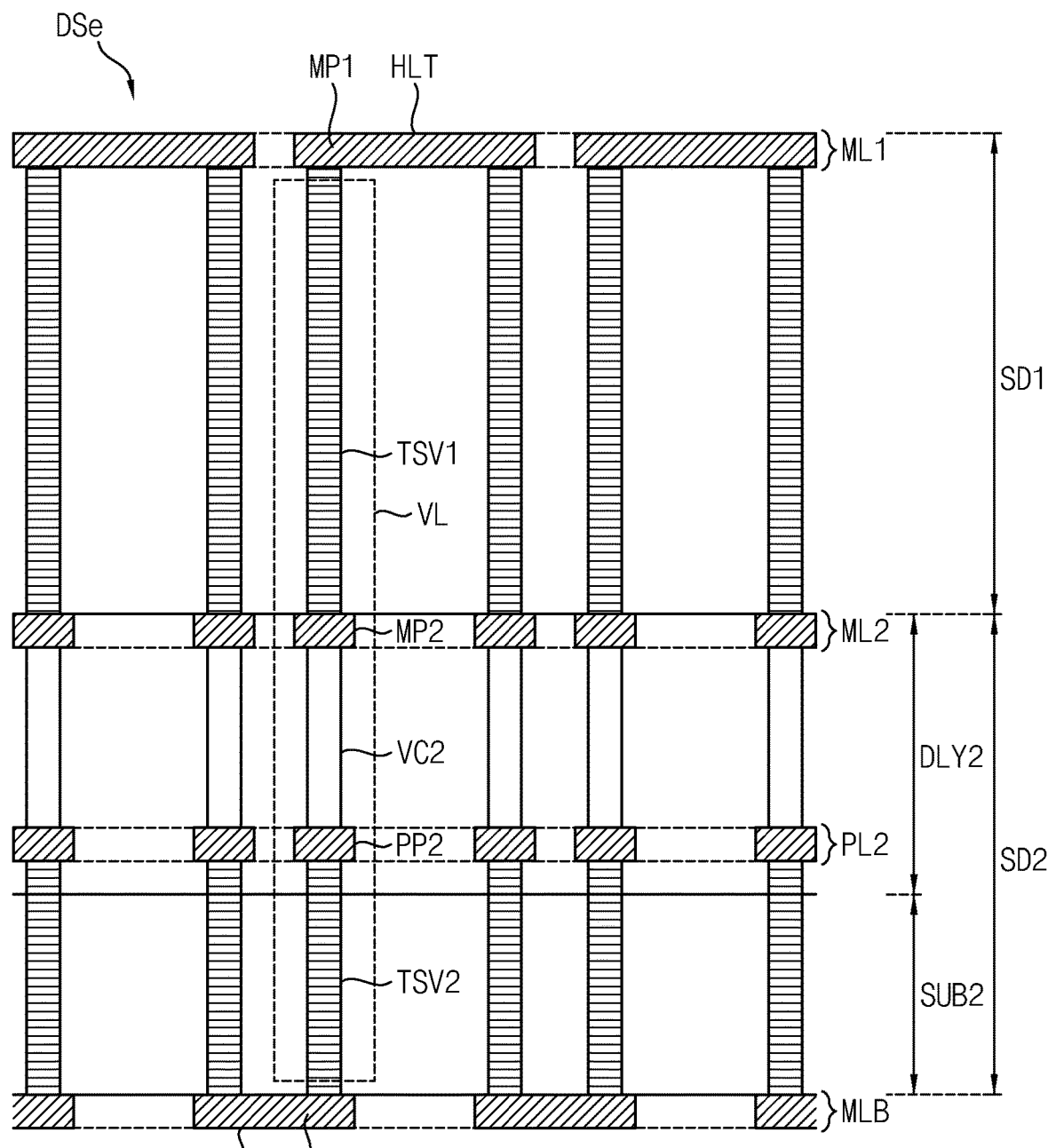

FIGS. 29 and 30 are cross-sectional diagrams illustrating a vertical structure of a three-dimensional detection structure according to example embodiments.

Referring to FIG. 29, a three-dimensional detection structure DSe may be formed in a first semiconductor die SD1 and a second semiconductor die SD2. A memory cell structure may be formed in the first semiconductor die SD1 and a peripheral circuit may be formed in the second semiconductor die SD2. The second semiconductor die SD2 may include a semiconductor substrate SUB2 and a dielectric layer DLY2 in which upper structures of the second semiconductor substrate SUB2 are formed. The first and second semiconductor dies SD1 and SD2 may include a plurality of conduction layers. For example, the first semiconductor die SD1 may include a first metal layer ML1, and the dielectric layer DLY2 may include a second metal layer ML2 and a second polysilicon layer PL2. The metal layers ML1 and ML2 may be the uppermost metal layers in the respective semiconductor dies SD1 and SD2. The polysilicon layer PL2 may include a gate polysilicon layer in which gates of transistors in the semiconductor integrated circuits are formed.

The three-dimensional detection structure DSe may include a plurality of top horizontal line segments HLT formed in the first conduction layer ML1 of the first semiconductor die SD1 (that is, the uppermost semiconductor die in the stacked structure), a plurality of bottom horizontal line segments HLB formed in the second conduction layer PL2 of the second semiconductor die SD2 (that is, the lowest semiconductor die in the stacked structure) and a plurality of vertical line segments VL connecting the top horizontal line segments HLT and the bottom horizontal line segments HLB respectively to form the three-dimensional detection structure DSe.

As shown in FIG. 29, the first conduction layer ML1 may correspond to an uppermost metal layer among the metal layer of the first semiconductor die SD1, and the second conduction layer PL2 may correspond to the polysilicon layer of the second semiconductor die SD2. The top horizontal line segments HLT may include metal line patterns MP1 formed in the metal layer ML1 of the first semiconductor die SD1, and the bottom horizontal line segments HLB may include polysilicon line patterns PP2 formed in the polysilicon layer PL2 of the second semiconductor die SD2.

The vertical line segments VL may include vertical contacts VC1, TSV and VC2 to connect the metal line patterns MP1 in the metal layer ML1 and the polysilicon line patterns PP in the polysilicon layer PL2. As illustrated in FIG. 29, the vertical contacts may include the through-substrate vias TSV penetrating the first semiconductor die SD1. The vertical line segments VL may further include conduction line patterns MP2 formed in the intermediate conduction layers ML2.

Referring to FIG. 30, a three-dimensional detection structure DSe may include a plurality of top horizontal line segments HLT formed in the first conduction layer ML1 of the first semiconductor die SD1 (that is, the uppermost semiconductor die in the stacked structure), a plurality of bottom horizontal line segments HLB formed in the second conduction layer MLB of the second semiconductor die SD2 (that is, the lowest semiconductor die in the stacked structure) and a plurality of vertical line segments VL connecting the top horizontal line segments HLT and the bottom horizontal line segments HLB respectively to form the three-dimensional detection structure DSe.

As shown in FIG. 30, the first conduction layer ML1 may correspond to an uppermost metal layer among the metal layer of the first semiconductor die SD1, and the second conduction layer PL2 may correspond to the metal layer on the bottom surface of the second semiconductor die SD2. The top horizontal line segments HLT may include metal line patterns MP1 formed in the metal layer ML1 of the first semiconductor die SD1, and the bottom horizontal line segments HLB may include metal line patterns MPB formed in the metal layer MLB on the bottom surface of the second semiconductor die SD2.

The vertical line segments VL may include vertical contacts TSV1, VC2 and TSV2 to connect the metal line patterns MP1 in the metal layer ML1 and the metal line patterns MPB in the metal layer MLB. As illustrated in FIG. 30, the vertical contacts may include the through-substrate vias TSV1 and TSV2 penetrating the first semiconductor die SD1 and the second semiconductor die SD2, respectively. The vertical line segments VL may further include conduction line patterns MP2 and PP2 respectively formed in the intermediate conduction layers ML2 and PL2.

As described with reference to FIGS. 29 and 30, the three-dimensional detection structure DSe according to example embodiments may extend in the vertical direction Z to the various depths. Using the three-dimensional detection structure, the crack penetration of various types may be detected thoroughly.

Figure 31:
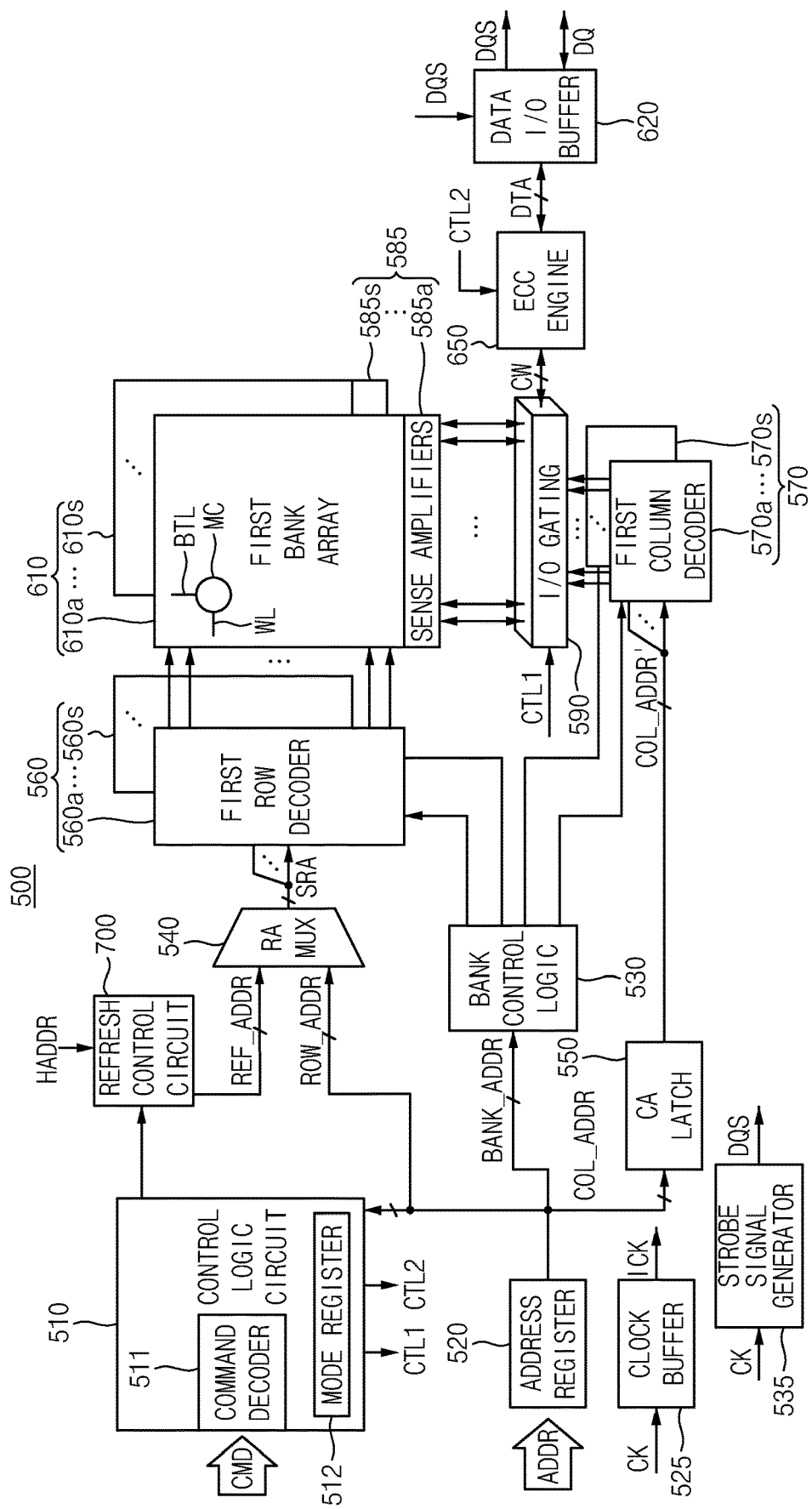
FIG. 31 is a block diagram illustrating an example of the semiconductor device in FIG. 1 according to example embodiments.

FIG. 31 is a block diagram illustrating an example of the semiconductor device in FIG. 1 according to example embodiments.

Referring to FIG. 31, the semiconductor device 500 may be a volatile memory device and may include the control logic circuit 510, an address register 520, a bank control logic 530, a refresh control circuit 700, a row address multiplexer 540, a column address latch 550, a row decoder 560, a column decoder 570, a memory cell array 610, a sense amplifier unit 585, an I/O gating circuit 590, an error correction code (ECC) engine 650, a clock buffer 625, a strobe signal generator 235 and a data I/O buffer 620.

The memory cell array 610 may include first through sixteenth bank arrays 610a~610s. The row decoder 560 may include first through sixteenth row decoders 560a-560s respectively coupled to the first through sixteenth bank arrays 610a~610s, the column decoder 570 may include first through sixteenth column decoders 570a~570s respectively coupled to the first through sixteenth bank arrays 610a~610s, and the sense amplifier unit 585 may include first through sixteenth sense amplifiers 585a~585s respectively coupled to the first through sixteenth bank arrays 610a~610s.

The first through sixteenth bank arrays 610a~610s, the first through sixteenth row decoders 560a~560s, the first through sixteenth column decoders 570a~570s and first through sixteenth sense amplifiers 585a~258s may form first through sixteenth banks. Each of the first through sixteenth bank arrays 610a~610s includes a plurality of memory cells MC formed at intersections of a plurality of word-lines WL and a plurality of bit-lines BL.

The address register 520 may receive the address ADDR including a bank address BANK_ADDR, a row address ROW_ADDR and a column address COL_ADDR from an external memory controller. The address register 520 may provide the received bank address BANK_ADDR to the bank control logic 530, may provide the received row address ROW_ADDR to the row address multiplexer 540, and may provide the received column address COL_ADDR to the column address latch 550.

The bank control logic 530 may generate bank control signals in response to the bank address BANK_ADDR. One of the first through sixteenth row decoders 560a~560s corresponding to the bank address BANK_ADDR is activated in response to the bank control signals, and one of the first through sixteenth column decoders 570a~570s corresponding to the bank address BANK_ADDR is activated in response to the bank control signals.

The row address multiplexer 540 may receive the row address ROW_ADDR from the address register 520, and may receive a refresh row address REF_ADDR from the refresh control circuit 700. The row address multiplexer 540 may selectively output the row address ROW_ADDR or the refresh row address REF_ADDR as a row address SRA. The row address SRA that is output from the row address multiplexer 240 is applied to the first through sixteenth row decoders 560a~560s.

The refresh control circuit 700 may sequentially increase or decrease the refresh row address REF_ADDR in a normal refresh mode under control the control logic circuit 510.

The activated one of the first through sixteenth row decoders 560a~560s, by the bank control logic 530, may decode the row address SRA that is output from the row address multiplexer 540, and may activate a word-line corresponding to the row address SRA. For example, the activated bank row decoder applies a word-line driving voltage to the word-line corresponding to the row address.

The column address latch 550 may receive the column address COL_ADDR from the address register 520, and may temporarily store the received column address COL_ADDR. In some example embodiments, in a burst mode, the column address latch 550 may generate column addresses COL_ADDR' that increment from the received column address COL_ADDR. The column address latch 550 may apply the temporarily stored or generated column address COL_ADDR' to the first through sixteenth column decoders 570a~570s.

The activated one of the first through sixteenth column decoders 570a-570s activates a sense amplifier corresponding to the bank address BANK_ADDR and the column address COL_ADDR through the I/O gating circuit 590.

The I/O gating circuit 590 may include a circuitry for gating input/output data, and may further include input data mask logic, read data latches for storing data that is output from the first through sixteenth bank arrays 610a~610s, and write drivers for writing data to the first through sixteenth bank arrays 610a~610s.

Codeword CW read from a selected one bank array of the first through sixteenth bank arrays 610a~610s is sensed by a sense amplifier coupled to the selected one bank array from which the data is to be read, and is stored in the read data latches. The codeword CW stored in the read data latches may be provided to the data I/O buffer 620 as data DTA after ECC decoding is performed on the codeword CW by the ECC engine 650. The data I/O buffer 620 may convert the data DTA into the data signal DQ and may transmit the data signal DQ along with the data strobe signal DQS to the memory controller.

The data signal DQ to be written in a selected one bank array of the first through sixteenth bank arrays 610a~610s may be provided to the data I/O buffer 620 from the memory controller. The data I/O buffer 620 may convert the data signal DQ to the data DTA and may provide the data DTA to the ECC engine 650. The ECC engine 650 may perform an ECC encoding on the data DTA to generate parity bits, and the ECC engine 650 may provide the codeword CW including data DTA and the parity bits to the I/O gating circuit 590. The I/O gating circuit 590 may write the codeword CW in a sub-page in the selected one bank array through the write drivers.

The data I/O buffer 620 may provide the data signal DQ from the memory controller to the ECC engine 650 by converting the data signal DQ to the data DTA in a write operation of the semiconductor device 500, may convert the data DTA to the data signal DQ from the ECC engine 650 and may transmit the data signal DQ and the data strobe signal DQS to the memory controller in a read operation of the semiconductor device 500.

The ECC engine 650 may perform an ECC encoding on the data DTA and may perform an ECC decoding on the codeword CW based on a second control signal CTL2 from the control logic circuit 510.

The clock buffer 525 may receive the clock signal CK, may generate an internal clock signal ICK by buffering the clock signal CK, and may provide the internal clock signal ICK to circuit components processing the command CMD and the address ADDR.

The strobe signal generator 535 may receive the clock signal CK, may generate the data strobe signal DQS based on the clock signal CK and may provide the data strobe signal DQS to the data I/O buffer 620.

The control logic circuit 510 may control operations of the semiconductor device 500. For example, the control logic circuit 510 may generate control signals for the semiconductor device 500 in order to perform a write operation, a read operation, a normal refresh operation. The control logic circuit 510 may include a command decoder 511 that decodes the command CMD received from the memory controller and a mode register 512 that sets an operation mode of the semiconductor device 500.

For example, the command decoder 511 may generate the control signals corresponding to the command CMD by decoding a write enable signal, a row address strobe signal, a column address strobe signal, a chip select signal, etc. The control logic circuit 510 may provide a first control signal CTL1 to the I/O gating circuit 590, and a second control signal CTL2 to the ECC engine 650.

Figure 32:
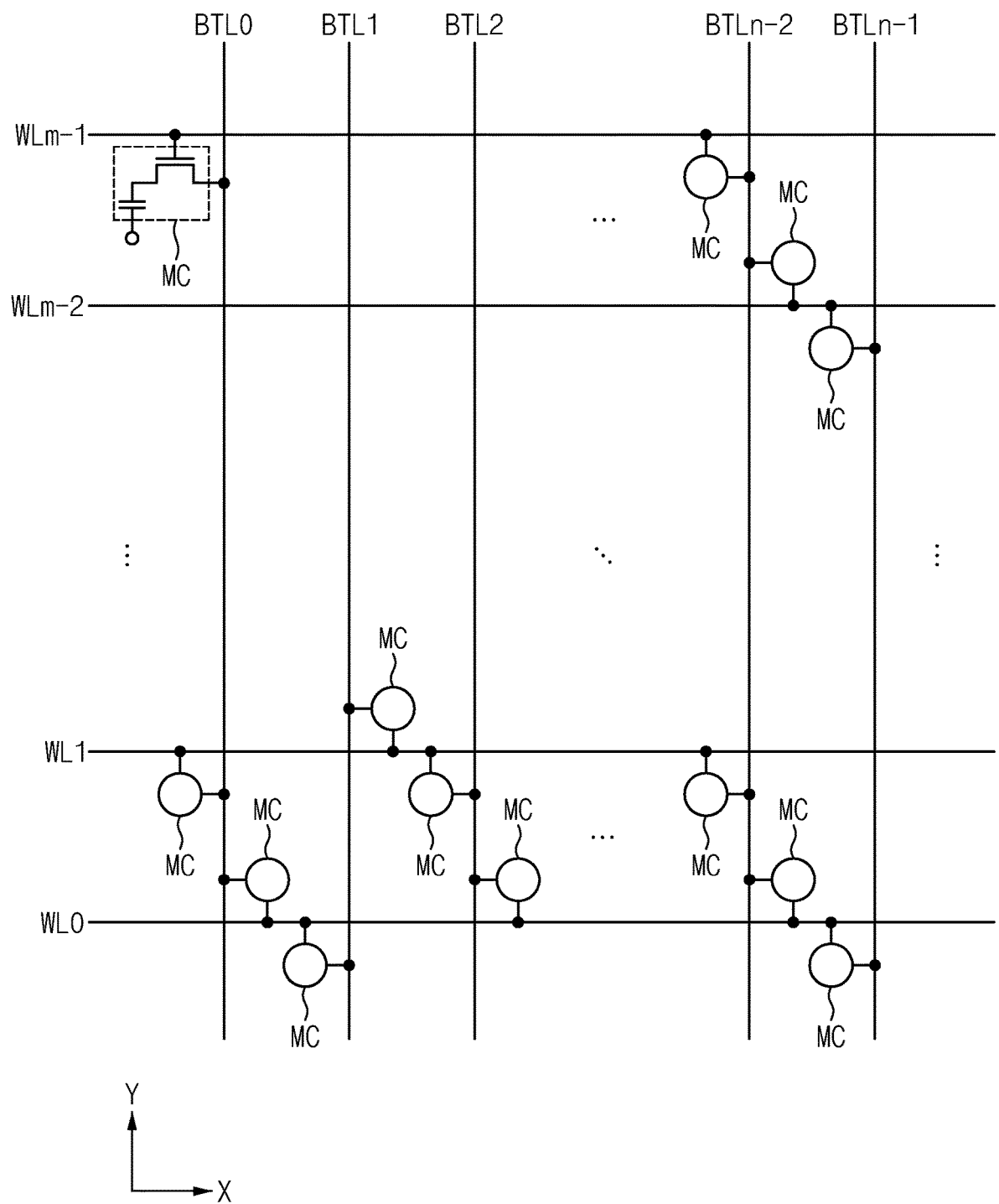
FIG. 32 illustrates an example of the first bank array in the semiconductor device of FIG. 31.

FIG. 32 illustrates an example of the first bank array in the semiconductor device of FIG. 31.

Referring to FIG. 32, the first bank array 310a includes a plurality of word-lines WL0~WLm−1 (m is a natural number greater than two), a plurality of bit-lines BL0~BLn−1 (n is a natural number greater than two), and a plurality of memory cells MCs disposed at intersections between the word-lines WL0~WLm−1 and the bit-lines BL0~BLn−1. Each of the memory cells MCs includes a cell transistor coupled to each of the word-lines WL0~WLm−1 and each of the bit-lines BL0~BLn−1 and a cell capacitor coupled to the cell transistor. Each of the memory cells MCs may have a DRAM cell structure. Each of the word-lines WL0~WLm−1 extends in a first direction D1 and each of the bit-lines BL1~BLn−1 extends in a second direction D2 crossing the first direction D1.

The word-lines WL0~WLm−1 coupled to the plurality of memory cells MCs may be referred to as rows of the first bank array 310a and the bit-lines BL0~BLn−1 coupled to the plurality of memory cells MCs may be referred to as columns of the first bank array 310a.

Figure 33:
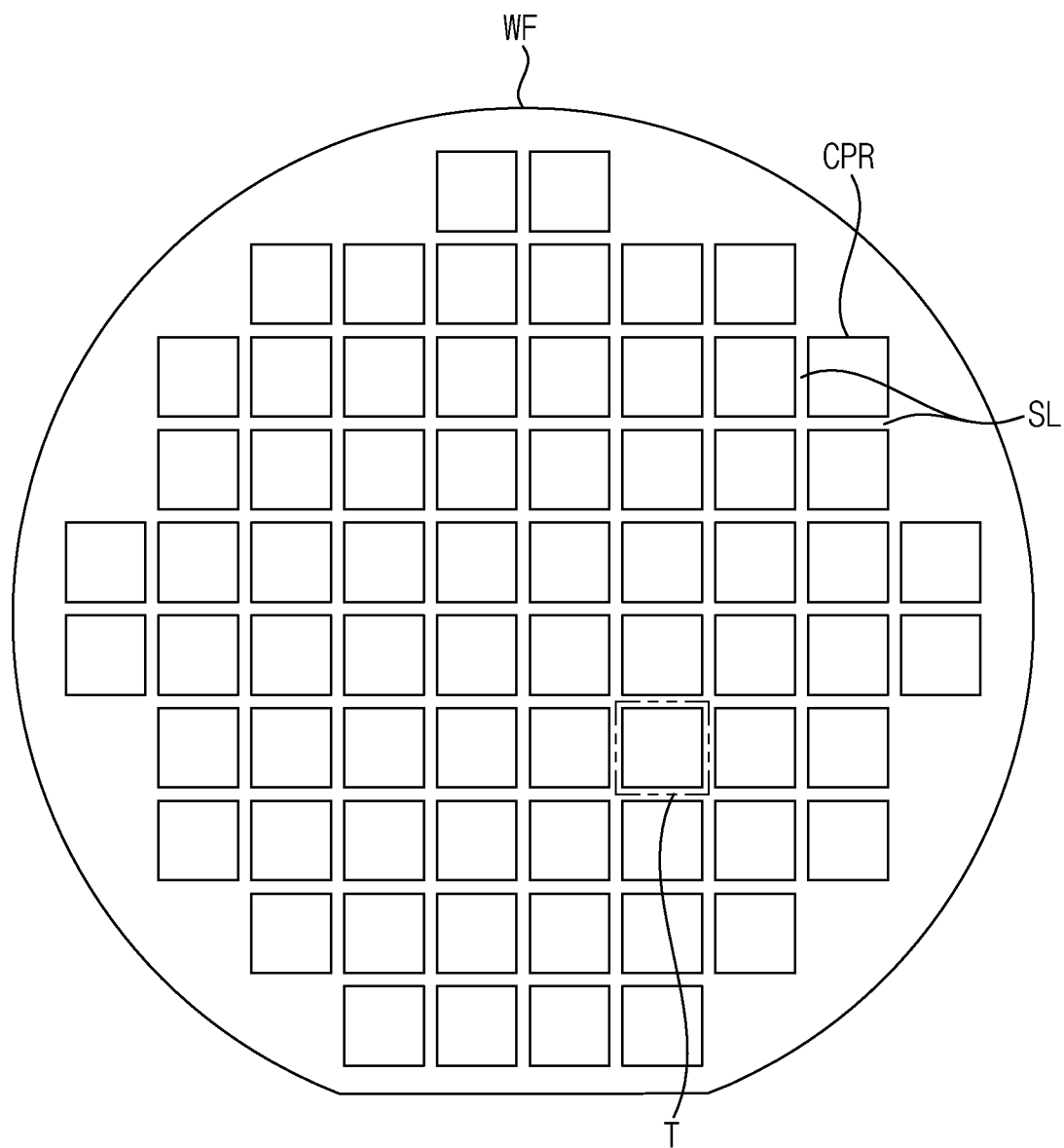
FIG. 33 is a plan view for explaining a semiconductor device according to example embodiments.
Figure 34:
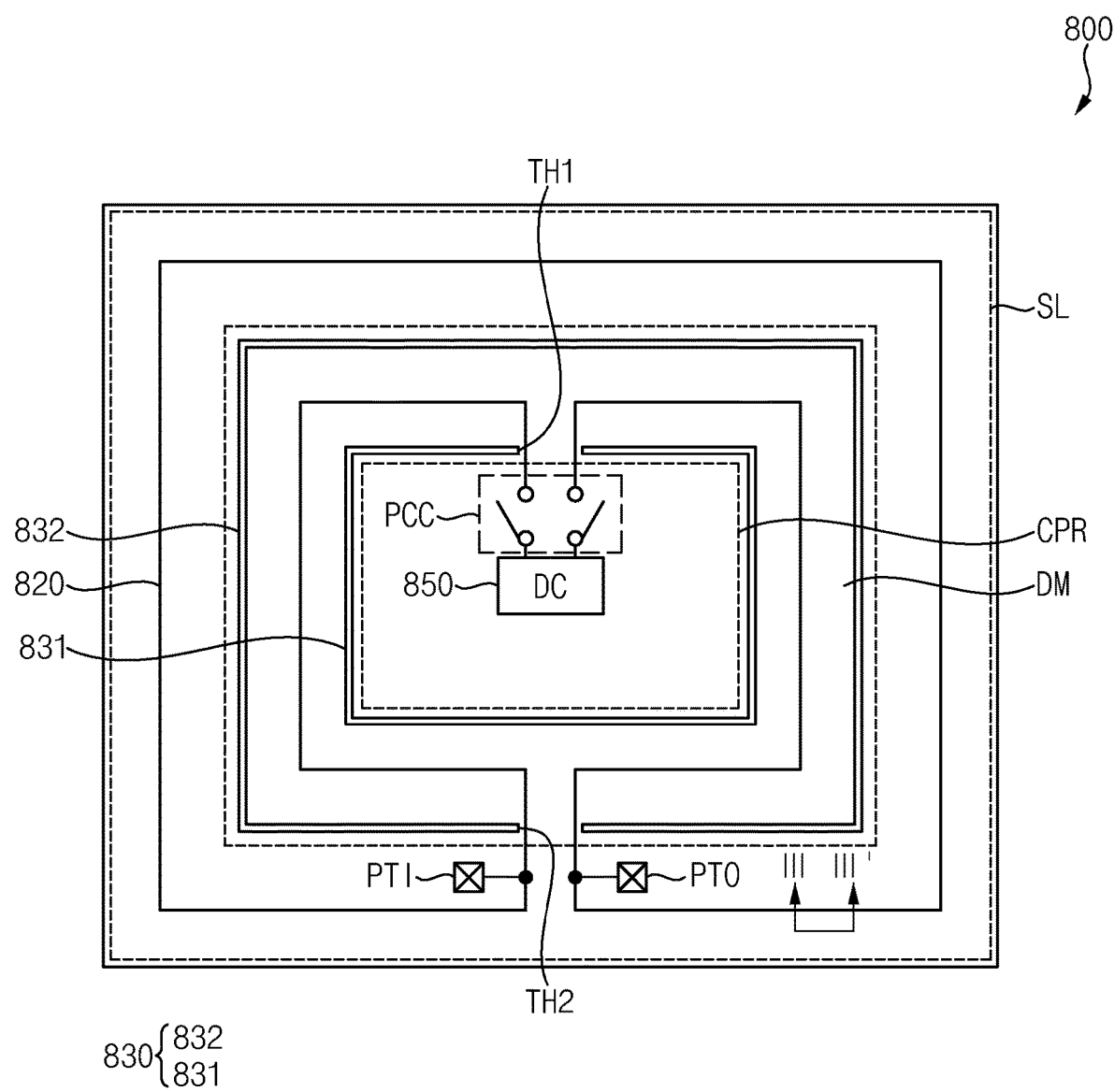
FIG. 34 is a plan view illustrating a semiconductor device according to example embodiments.
Figure 35:
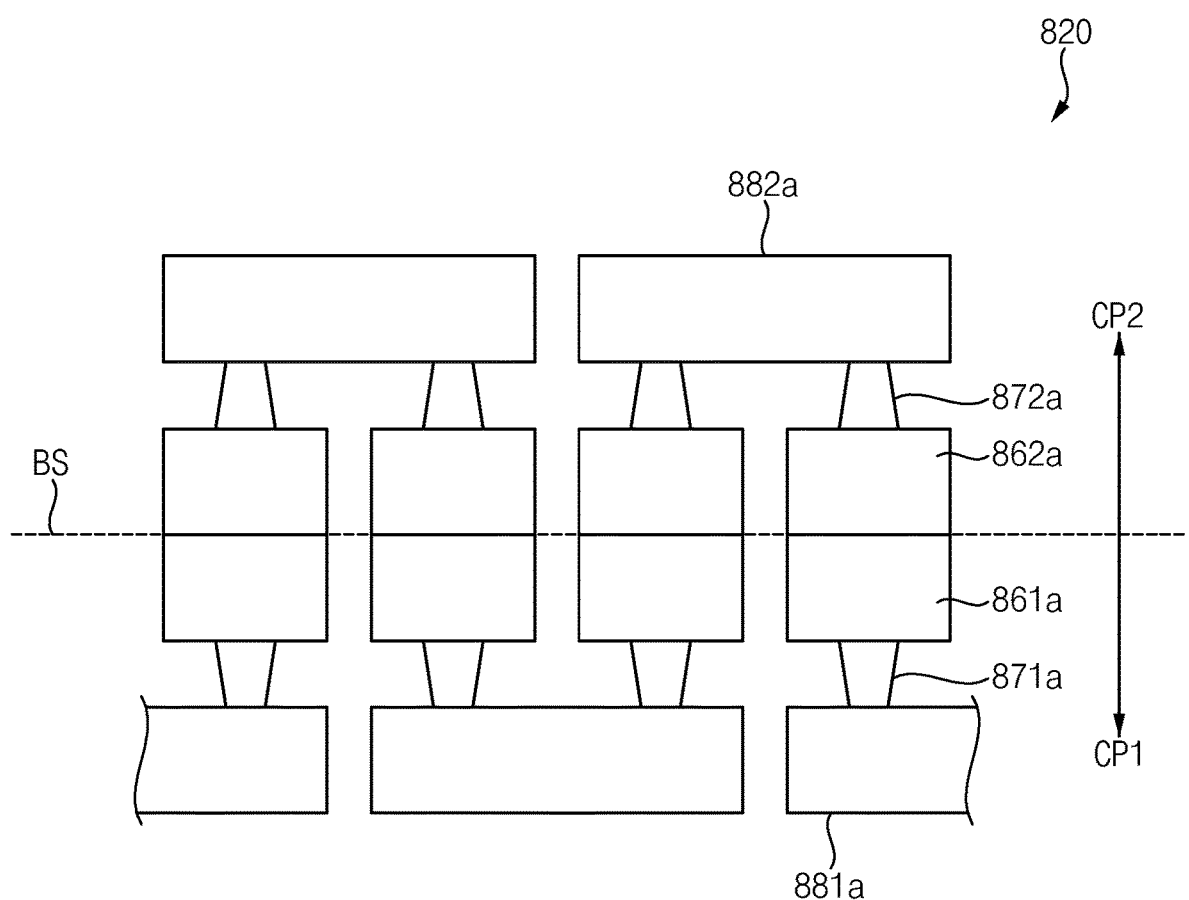
FIG. 35 is a cross-sectional view taken along a line III-III' of FIG. 34.

FIG. 33 is a plan view for explaining a semiconductor device according to example embodiments, and FIG. 34 is a plan view illustrating a semiconductor device according to example embodiments. FIG. 35 is a cross-sectional view taken along a line III-III' of FIG. 34.

In FIG. 33, a wafer WF is illustrated for describing manufacturing processes of a semiconductor device according to example embodiments. A plurality of chip regions CPR and scribe lanes SL surrounding the chip regions CPR are formed in the wafer WF. The wafer WF is cut along the scribe lanes SL and divided into a plurality of dies.

A plurality of wafers are bonded to form a plurality of semiconductor devices. A portion T in the wafer WF will be described with reference to FIG. 34 below.

FIG. 34 is an enlarged diagram of a portion T in FIG. 33 for describing a semiconductor device according to example embodiments.

Referring to FIG. 34, a semiconductor device 800 may include a chip region CPR, a scribe lane SL along an edge of the chip region CPR, a detection structure 820, a path control circuit PCC, a detection circuit 850. The semiconductor device 800 may further include a dam region DM including a dam structure 830, disposed between the chip region CPR and the scribe lane SL.

The detection structure 820 may extend from the chip region CPR to the scribe lane SL through the dam structure 830 and may be in the scribe lane SL in an annular shape. The path control circuit PCC may be electrically connected to the detection structure 820 and may be disposed in the chip region CPR. The path control circuit PCC may include a plurality of switches and may control electrical connection of the detection structure 820.

The dam region DM may isolate the chip region CPR and the scribe lane SL and may have a ring shape or a close curve in planar view. The dam structure 830 including at least one dam 831 and 832 may be disposed in the dam region DM.

The chip region CPR may be a region in which elements actually operating on a chip are formed. The detection circuit 850 may be included in the chip region CPR.

The scribe lane SL, surrounding the chip region CPR, may be a place providing a space margin in case of a damaged part when dicing the wafer WF to a chip. The scribe lane SL may have a ring shape or a rectangular ring-shape corresponding to a shape of the chip region CPR.

In the scribe lane SL, various patterns such as a mark pattern, a key pattern and patterns may be provided for fabrication monitoring and device testing.

In example embodiments, bonding metal patterns including bonding metals (861a and 862a in FIG. 35) associated with bonding chips may be formed in the scribe lane SL. The detection structure 820 may be disposed in the scribe lane SL and the bonding metal patterns may constitute the detection structure 820.

The semiconductor device 800 may have may have a chip-to-chip (C2C) structure in which a first chip CP1 is located on a second chip CP2. In FIG. 35, a bonding surface BS is illustrated at which the first chip CP1 is coupled to the second chip CP2.

Referring to FIG. 35, in the scribe lane SL, the first chip CP1 may include a first bonding metal pattern and the second chip CP2 may include a second bonding metal pattern. The first chip CP1 and the second chip CP2 may be coupled to each other by the first bonding metal and the second bonding metal being bonded to each other. When first bonding metals 861a constituting the first bonding metal pattern and second bonding metals 862a constituting the second bonding metal pattern are not properly connected to each other due to fabrication problems or cracks, electrical signals may not be transferred to the detection structure 820 in the scribe lane SL or abnormal phenomenon occurs in the electrical signals. Therefore, the detection circuit 850 may determine whether a defect is present in the scribe lane SL based on the electrical signals in the detection structure 820.

Referring to FIG. 35, the detection structure 820 disposed on the scribe lane SL may include the first bonding metals 861*a*, the second bonding metals 862*a*, first and second horizontal lines 881*a* and 882*a* and first and second contact plugs 871*a* and 871*b*. The first and second horizontal lines 881*a* and 882*a* may be electrically connected to the path control circuit PCC. The first and second contact plugs 871*a* and 871*b* may connect the first and second horizontal lines 881*a* and 882*a* to the first and second bonding metals 861*a* and 862*a*, respectively. At least one of the first and second horizontal lines 881*a* and 882*a* may be connected to connection wire structure extending from the chip region CPR to the scribe lane SL for electrical connection with the first and second bonding metals 861*a* and 862*a*. For example, the at least one of the first and second horizontal lines 881*a* and 882*a* may penetrate through the dam structure 830. The at least one of the first and second horizontal lines 881*a* and 882*a* may be insulated from the dam structure 830.

The dam structure 830 is a region that separates the chip region CPR and the scribe lane SL. The dam structure 830 may define the chip region CPR and the scribe lane SL by surrounding the chip region CPR. The dam structure 830 may separate the chip region CPR and the scribe lane SL by penetrating the first chip CP1 and the second chip CP2 vertically. The dam structure 830 may prevent a crack occurring in the scribe lane SL from entering the chip region CPR. The dam structure 830 may prevent external moisture from entering the chip region CPR.

The dam structure 830 may include at least one dam. The dam structure 830 may include an inner dam 831 and an outer dam 832. The inner dam 831 may surround the chip region CPR adjacently to the chip region CPR and the outer dam 832 may surround the inner dam 831 adjacently to the scribe lane. Each of the inner dam 831 and the outer dam 832 may have shape corresponding to a shape of the chip region CPR.

The dam structure 830 may include a THV through which the detection structure 820 passes. For example, each of the inner dam 831 and the outer dam 832 include a THV. The inner dam 831 may include a first THV TH1 and the outer dam 832 may include a second THV TH2.

The semiconductor device 800 may further include a test input pad PTI coupled to a first end of the detection structure 820 and a test output pad PTO coupled to a second end of the detection structure 820. For example, an external tester applies a test input signal to the detection structure 820 along a forward direction and a second direction through the test input pad PSI and the detection circuit 850 may determine whether a crack occurs in the scribe lane SL and a position of the crack based on a difference between a forward direction test output signal and a backward direction test output signal which are provided at the test output pad PTO.

Figure 36:
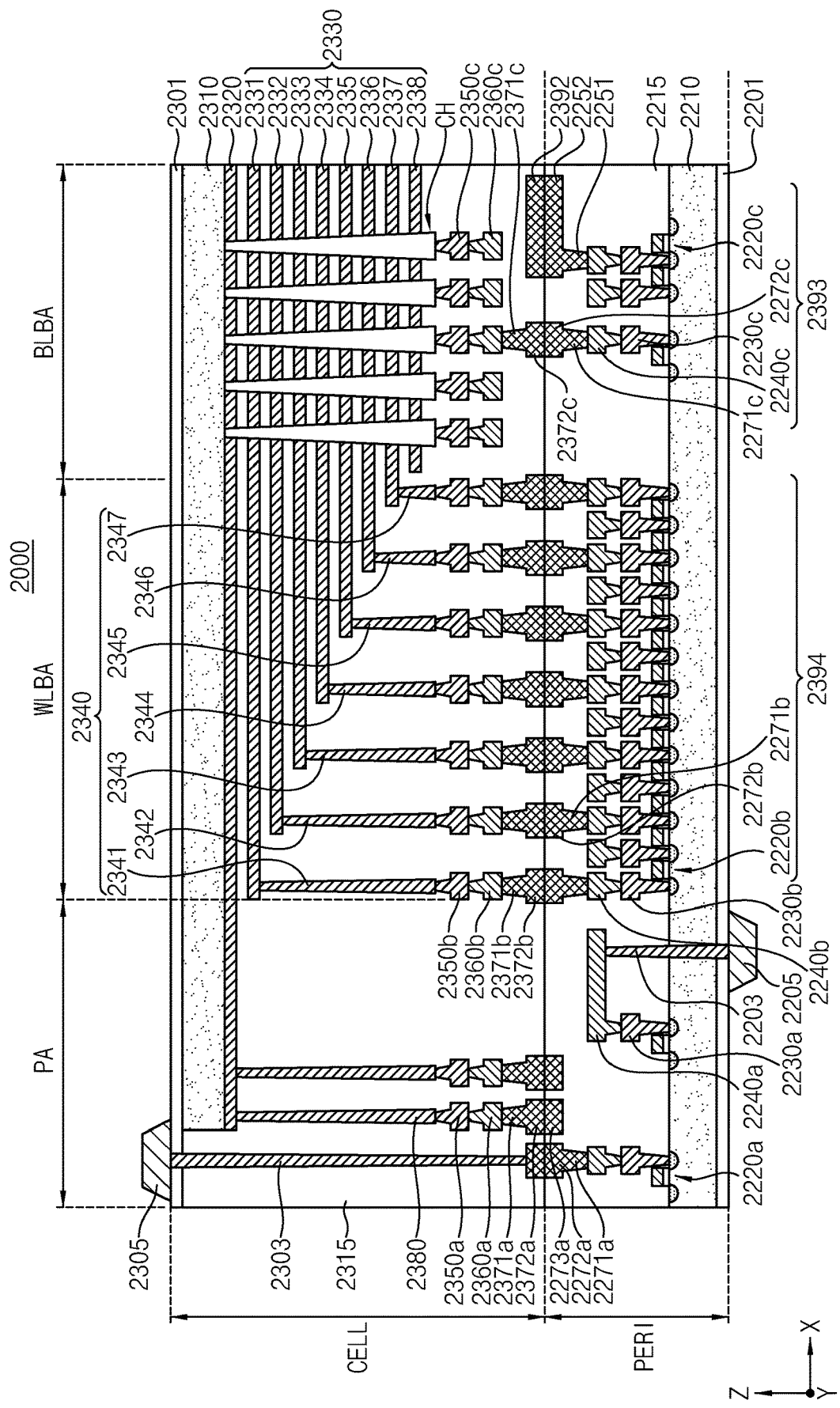
FIG. 36 is a cross-sectional view of a semiconductor device according to example embodiments.

FIG. 36 is a cross-sectional view of a semiconductor device according to example embodiments.

Referring to FIG. 36, a semiconductor device 2000 may be a nonvolatile memory device and may have a chip-to-chip (C2C) structure. Hereinafter, the semiconductor device 2000 will be referred to as a nonvolatile memory device. The C2C structure may refer to a structure formed by manufacturing an upper chip including a memory cell region or a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, when the bonding metals may include copper (Cu) using a Cu-to-Cu bonding. The example embodiment, however, may not be limited thereto. For example, the bonding metals may also be formed of aluminum (Al) or tungsten (W). The cell region CELL may correspond to the first semiconductor die SD1 in FIG. 28 and the peripheral circuit region PERI may correspond to the first semiconductor die SD2 in FIG. 28.

Each of the peripheral circuit region PERI and the cell region CELL of the nonvolatile memory device 2000 may include an external pad bonding area PA, a word-line bonding area WLBA, and a bit-line bonding area BLBA.

The peripheral circuit region PERI may include a first substrate 2210, an interlayer insulating layer 2215, a plurality of circuit elements 2220*a*, 2220*b*, and 2220*c* formed on the first substrate 2210, first metal layers 2230*a*, 2230*b*, and 2230*c* respectively connected to the plurality of circuit elements 2220*a*, 2220*b*, and 2220*c*, and second metal layers 2240*a*, 2240*b*, and 2240*c* formed on the first metal layers 2230*a*, 2230*b*, and 2230*c*. In an example embodiment, the first metal layers 2230*a*, 2230*b*, and 2230*c* may be formed of tungsten having relatively high electrical resistivity, and the second metal layers 2240*a*, 2240*b*, and 2240*c* may be formed of copper having relatively low electrical resistivity.

In an example embodiment illustrate in FIG. 22, although only the first metal layers 2230*a*, 2230*b*, and 2230*c* and the second metal layers 2240*a*, 2240*b*, and 2240*c* are shown and described, example embodiments are not limited thereto, and one or more additional metal layers may be further formed on the second metal layers 2240*a*, 2240*b*, and 2240*c*. At least a portion of the one or more additional metal layers formed on the second metal layers 2240*a*, 2240*b*, and 2240*c* may be formed of aluminum or the like having a lower electrical resistivity than those of copper forming the second metal layers 2240*a*, 2240*b*, and 2240*c*.

The interlayer insulating layer 2215 may be disposed on the first substrate 2210 and cover the plurality of circuit elements 2220*a*, 2220*b*, and 2220*c*, the first metal layers 2230*a*, 2230*b*, and 2230*c*, and the second metal layers 2240*a*, 2240*b*, and 2240*c*. The interlayer insulating layer 2215 may include an insulating material such as silicon oxide, silicon nitride, or the like.

Lower bonding metals 2271*b* and 2272*b* may be formed on the second metal layer 2240*b* in the word-line bonding area WLBA. In the word-line bonding area WLBA, the lower bonding metals 2271*b* and 2272*b* in the peripheral circuit region PERI may be electrically bonded to upper bonding metals 2371*b* and 2372*b* of the cell region CELL. The lower bonding metals 2271*b* and 2272*b* and the upper bonding metals 2371*b* and 2372*b* may be formed of aluminum, copper, tungsten, or the like. Further, the upper bonding metals 2371*b* and 2372*b* in the cell region CELL may be referred as first metal pads and the lower bonding metals 2271*b* and 2272*b* in the peripheral circuit region PERI may be referred as second metal pads.

The cell region CELL may include at least one memory block. The cell region CELL may include a second substrate 2310 and a common source line 2320. On the second substrate 2310, a plurality of word-lines 2331, 2332, 2333, 2334, 2335, 2336, 2337, and 2338 (i.e., 2330) may be stacked in a vertical direction Z (e.g., a Z-axis direction), perpendicular to an upper surface of the second substrate 2310. At least one string selection line and at least one ground selection line may be arranged on and below the plurality of word-lines 2330, respectively, and the plurality of word-lines 2330 may be disposed between the at least one string selection line and the at least one ground selection line.

In the bit-line bonding area BLBA, a channel structure CH may extend in the vertical direction Z, perpendicular to the upper surface of the second substrate 2310, and pass through the plurality of word-lines 2330, the at least one string selection line, and the at least one ground selection line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bit-line contact, and the second metal layer 2360c may be a bit-line. In an example embodiment, the bit-line 2360c may extend in a second direction Y (e.g., a Y-axis direction), parallel to the upper surface of the second substrate 2310.

In an example embodiment illustrated in FIG. 36, an area in which the channel structure CH, the bit-line 2360c, and the like are disposed may be defined as the bit-line bonding area BLBA. In the bit-line bonding area BLBA, the bit-line 2360c may be electrically connected to the circuit elements 2220c providing a page buffer 2393 in the peripheral circuit region PERI. The bit-line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the word-line bonding area WLBA, the plurality of word-lines 2330 may extend in a first direction X (e.g., an X-axis direction), parallel to the upper surface of the second substrate 2310 and perpendicular to the second direction Y, and may be connected to a plurality of cell contact plugs 2341, 2342, 2343, 2344, 2345, 2346, and 2347 (i.e., 2340). The plurality of word-lines 2330 and the plurality of cell contact plugs 2340 may be connected to each other in pads provided by at least a portion of the plurality of word-lines 2330 extending in different lengths in the first direction X. A first metal layer 2350b and a second metal layer 2360b may be connected to an upper portion of the plurality of cell contact plugs 2340 connected to the plurality of word-lines 2330, sequentially. The plurality of cell contact plugs 2340 may be connected to the peripheral circuit region PERI by the upper bonding metals 2371b and 2372b of the cell region CELL and the lower bonding metals 2271b and 2272b of the peripheral circuit region PERI in the word-line bonding area WLBA.

The plurality of cell contact plugs 2340 may be electrically connected to the circuit elements 2220b forming a row decoder 2394 in the peripheral circuit region PERI. In an example embodiment, operating voltages of the circuit elements 2220b forming the row decoder 2394 may be different than operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

Input/output pads 2205 and 2305 may be disposed in the external pad bonding area PA. A lower insulating film 2201 covering a lower surface of the first substrate 2210 may be formed below the first substrate 2210, and a first input/output pad 2205 may be formed on the lower insulating film 2201. The first input/output pad 2205 may be connected to at least one of the plurality of circuit elements 2220a, 2220b, and 2220c disposed in the peripheral circuit region PERI through a first input/output contact plug 2203, and may be separated from the first substrate 2210 by the lower insulating film 2201. In addition, a side insulating film may be disposed between the first input/output contact plug 2203 and the first substrate 2210 to electrically separate the first input/output contact plug 2203 and the first substrate 2210.

An upper insulating film 2301 covering the upper surface of the second substrate 2310 may be formed on the second substrate 2310 and a second input/output pad 2305 may be disposed on the upper insulating film 2301. The second input/output pad 2305 may be connected to at least one of the plurality of circuit elements 2220a, 2220b, and 2220c disposed in the peripheral circuit region PERI through a second input/output contact plug 2303 and/or lower bonding metals 2271a and 2272a, and the like. The second input/output pad 2305 is electrically connected to a circuit element 2220a.

According to example embodiments, the second substrate 2310 and the common source line 2320 may not be disposed in an area in which the second input/output contact plug 2303 is disposed. Also, the second input/output pad 2305 may not overlap the word-lines 2330 in the vertical direction Z. The second input/output contact plug 2303 may be separated from the second substrate 2310 in the direction, parallel to the upper surface of the second substrate 2310, and may pass through the interlayer insulating layer 2315 of the cell region CELL to be connected to the second input/output pad 2305.

According to example embodiments, the first input/output pad 2205 and the second input/output pad 2305 may be selectively formed. For example, the nonvolatile memory device 2000 may include only the first input/output pad 2205 disposed on the first substrate 2210 or the second input/output pad 2305 disposed on the second substrate 2310. Alternatively, the nonvolatile memory device 2000 may include both the first input/output pad 2205 and the second input/output pad 2305.

A metal pattern provided in an uppermost metal layer may be provided as a dummy pattern or the uppermost metal layer may be absent, in each of the external pad bonding area PA and the bit-line bonding area BLBA, respectively included in the cell region CELL and the peripheral circuit region PERI.

In the external pad bonding area PA, the nonvolatile memory device 2000 may include a lower metal pattern 2273a, corresponding to an upper metal pattern 2372a formed in an uppermost metal layer of the cell region CELL, and having the same cross-sectional shape as the upper metal pattern 2372a of the cell region CELL so as to be connected to each other, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern 2372a, corresponding to the lower metal pattern 2273*a* formed in an uppermost metal layer of the peripheral circuit region PERI, and having the same shape as a lower metal pattern 2273*a* of the peripheral circuit region PERI, may be formed in an uppermost metal layer of the cell region CELL. The upper metal pattern 2372*a* may be included in upper bonding metals 2371*a* and 2372*a*.

The lower bonding metals 2271*b* and 2272*b* may be formed on the second metal layer 2240*b* in the word-line bonding area WLBA. In the word-line bonding area WLBA, the lower bonding metals 2271*b* and 2272*b* of the peripheral circuit region PERI may be electrically connected to the upper bonding metals 2371*b* and 2372*b* of the cell region CELL by a Cu-to-Cu bonding.

Further, in the bit-line bonding area BLBA, an upper metal pattern 2392, corresponding to a lower metal pattern 2252 formed in the uppermost metal layer of the peripheral circuit region PERI, and having the same cross-sectional shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL. The lower metal pattern 2252 may be included in lower bonding metals 2251 and 2252.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. A contact may not be formed on the reinforcement metal pattern.

The word-line voltages may be applied to at least one memory block in the cell region CELL through the lower bonding metals 2271*b* and 2272*b* in the peripheral circuit region PERI and upper bonding metals 2371*b* and 2372*b* of the cell region CELL.

Figure 37:
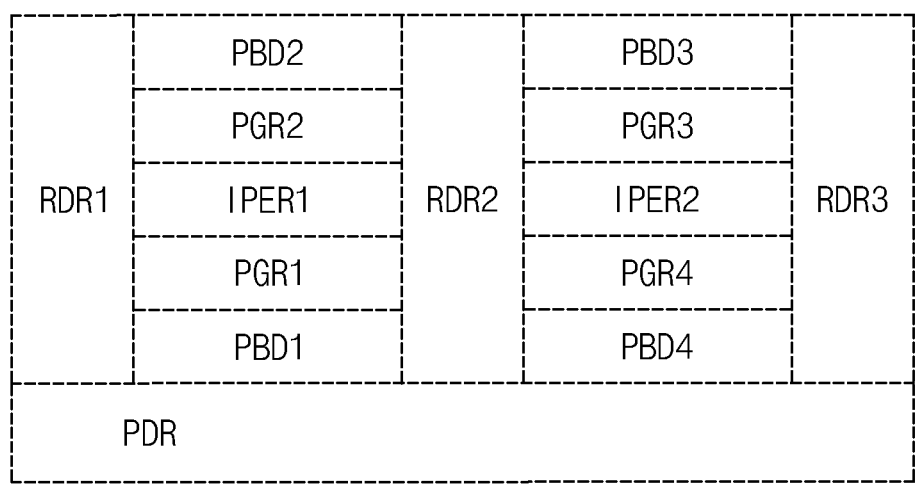
FIG. 37 is a plan view illustrating a peripheral circuit region in the semiconductor device of FIG. 36 according to example embodiments.
Figure 37:
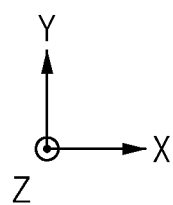

FIG. 37 is a plan view illustrating a peripheral circuit region in the semiconductor device of FIG. 36 according to example embodiments.

Referring to FIG. 37, the peripheral circuit region PERI may include row decoder regions RDR1, RDR2 and RDR3 disposed in the first direction X, a page buffer driver region PBD1, a page buffer region PGR1, an internal peripheral circuit region IPER1, a page buffer region PGR2 and a page buffer driver region PBD2 which are disposed in the second direction Y between the row decoder regions RDR1 and RDR2, a page buffer driver region PBD3, a page buffer region PGR3, an internal peripheral circuit region IPER2, a page buffer region PGR4 and a page buffer driver region PBD4 which are disposed in the second direction Y between the row decoder regions RDR2 and RDR3 and a pad region PDR adjacent to the row decoder regions RDR1, RDR2 and RDR3 in the second direction Y.

The page buffer regions PGR1 and PGR2 may be spaced apart from each other in the second direction Y and the page buffer regions PGR3 and PGR4 may be spaced apart from each other in the second direction Y. The buffer regions PGR1 and PGR2 may be spaced apart from the page buffer regions PGR3 and PGR4 in the first direction X.

A row decoder may be disposed in each of the row decoder regions RDR1, RDR2 and RDR3, a page buffer circuit including a plurality of page buffers may be disposed in the page buffer regions PGR1, PGR2, PGR3 and PGR4, a page buffer driver may be disposed in each of the page buffer driver regions PBD1, PBD2, PBD3 and PBD4 and a pump and selection circuits may be disposed in each of the internal peripheral circuit regions IPER1 and IPER2.

The row decoder regions RDR1, RDR2 and RDR3, the page buffer regions PGR1, PGR2, PGR3 and PGR4, the page buffer driver regions PBD1, PBD2, PBD3 and PBD4 and the internal peripheral circuit regions IPER1 and IPER2 may correspond to a central region of the peripheral circuit region PERI.

The page buffer regions PGR1, PGR2, PGR3 and PGR4 may be referred to as a first sub circuit region, a second sub circuit region, a third sub circuit region and a fourth sub circuit region, respectively.

The page buffer regions PGR1, PGR2, PGR3 and PGR4 may be disposed in a region corresponding to the bit-line bonding region in FIG. 36.

Figure 38:
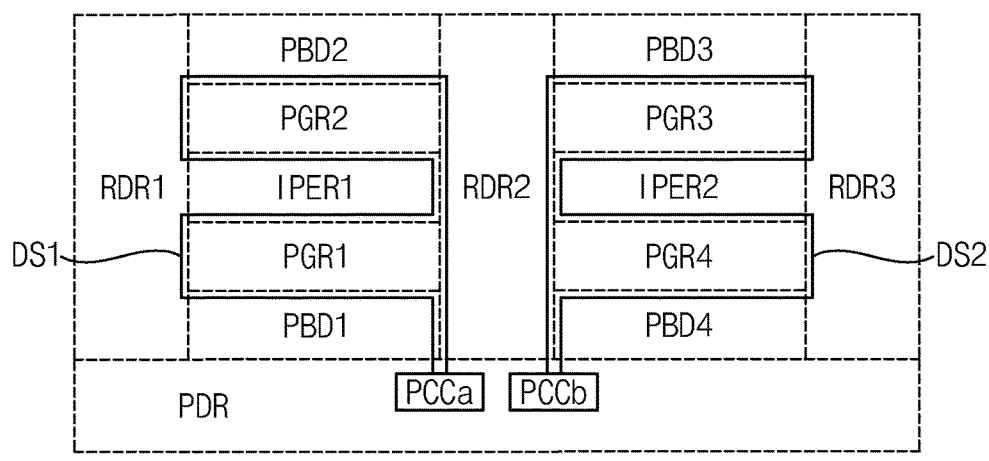
FIG. 38 illustrates that detection structures according to example embodiments are disposed in the peripheral circuit region of FIG. 37.
Figure 38:
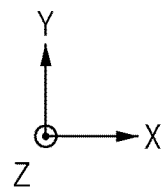

FIG. 38 illustrates that detection structures according to example embodiments are disposed in the peripheral circuit region of FIG. 37.

Referring to FIG. 38, a first detection structure DS1 may be formed to surround the page buffer regions PGR1 and PGR2 in the central region and may be connected to a first path control circuit PCCa disposed in the pad region PDR. A second detection structure DS2 may be formed to surround the page buffer regions PGR3 and PGR4 in the central region and may be connected to a second path control circuit PCCb disposed in the pad region PDR.

Each of the first path control circuit PCCa and the second path control circuit PCCb may employ the path control circuit 1100*a* in FIG. 3. In addition, each of the first path control circuit PCCa and the second path control circuit PCCb may be connected to a detection circuit such as the detection circuit 850 in FIG. 34. The detection circuit may apply test input signal to each of the first detection structure DS1 and the second detection structure DS2 along a forward direction and a second direction through each of the first path control circuit PCCa and the second path control circuit PCCb and may determine whether a defect is present in the semiconductor device 2000 of FIG. 36 based on a difference between the difference between a forward direction test output signal and a backward direction test output signal. The detection circuit may apply the test input signal to each of the first detection structure DS1 and the second detection structure DS2 along one direction through each of the first path control circuit PCCa and the second path control circuit PCCb and may determine a location of the defect in the semiconductor device 2000 based on a difference a first test output signal passing through the first detection structure DS1 and a second test output signal passing through the second detection structure DS2.

Figure 39:
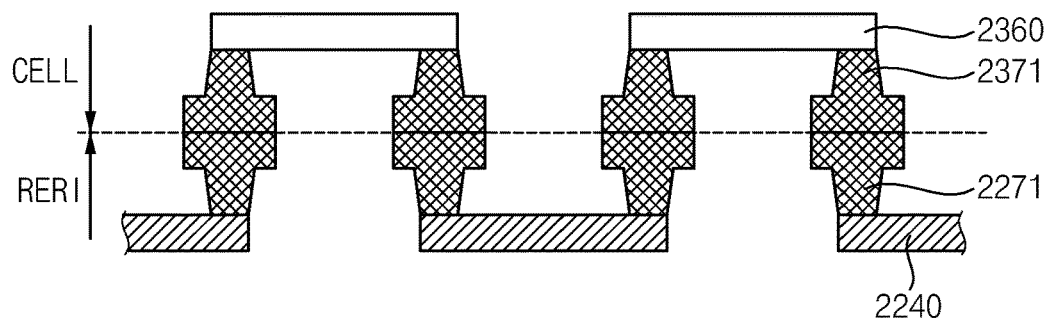
FIG. 39 illustrates a portion of the first detection structure in FIG. 38 according to example embodiments.

FIG. 39 illustrates a portion of the first detection structure in FIG. 38 according to example embodiments.

Referring to FIG. 39, the first detection structure DS1 may be provided by connecting alternatingly an upper bonding metal 2371 of the cell region CELL to an upper metal layer 2360 above the upper bonding metal 2371 in the first direction X or the second direction Y at edges of the page buffer region PGR1 (i.e., a first sub circuit region) and page buffer region PGR2 (i.e., a second sub circuit region) and by connecting alternatingly a lower bonding metal 2271 of the peripheral circuit region PERI to a lower metal layer 2240 below the lower bonding metal 2271 in the first direction X or the second direction Y at the edges of the page buffer region PGR1 (i.e., a first sub circuit region) and page buffer region PGR2 (i.e., a second sub circuit region). The first detection structure DS1 may alternatingly pass vis a boundary of the cell region CELL and the peripheral circuit region PERI such as a chain configuration. An input end node and an output end node of the first detection structure DS1 may be connected to the first path control circuit PCCa in FIG. 38.

The second detection structure DS2 may be provided by connecting alternatingly an upper bonding metal 2371 of the cell region CELL to an upper metal layer 2360 above the upper bonding metal 2371 in the first direction X or the second direction Y at edges of the page buffer region PGR3 (i.e., a third sub circuit region) and page buffer region PGR4 (i.e., a fourth sub circuit region) and by connecting alternatingly a lower bonding metal 2271 of the peripheral circuit region PERI to a lower metal layer 2240 below the lower bonding metal 2271 in the first direction X or the second direction Y at the edges of the page buffer region PGR3 (i.e., a third sub circuit region) and page buffer region PGR4 (i.e., a fourth sub circuit region). The second detection structure DS2 may alternatingly pass through a boundary of the cell region CELL and the peripheral circuit region PERI in a chain configuration. An input end node and an output end node of the second detection structure DS2 may be connected to the second path control circuit PCCb in FIG. 39.

Figure 40:
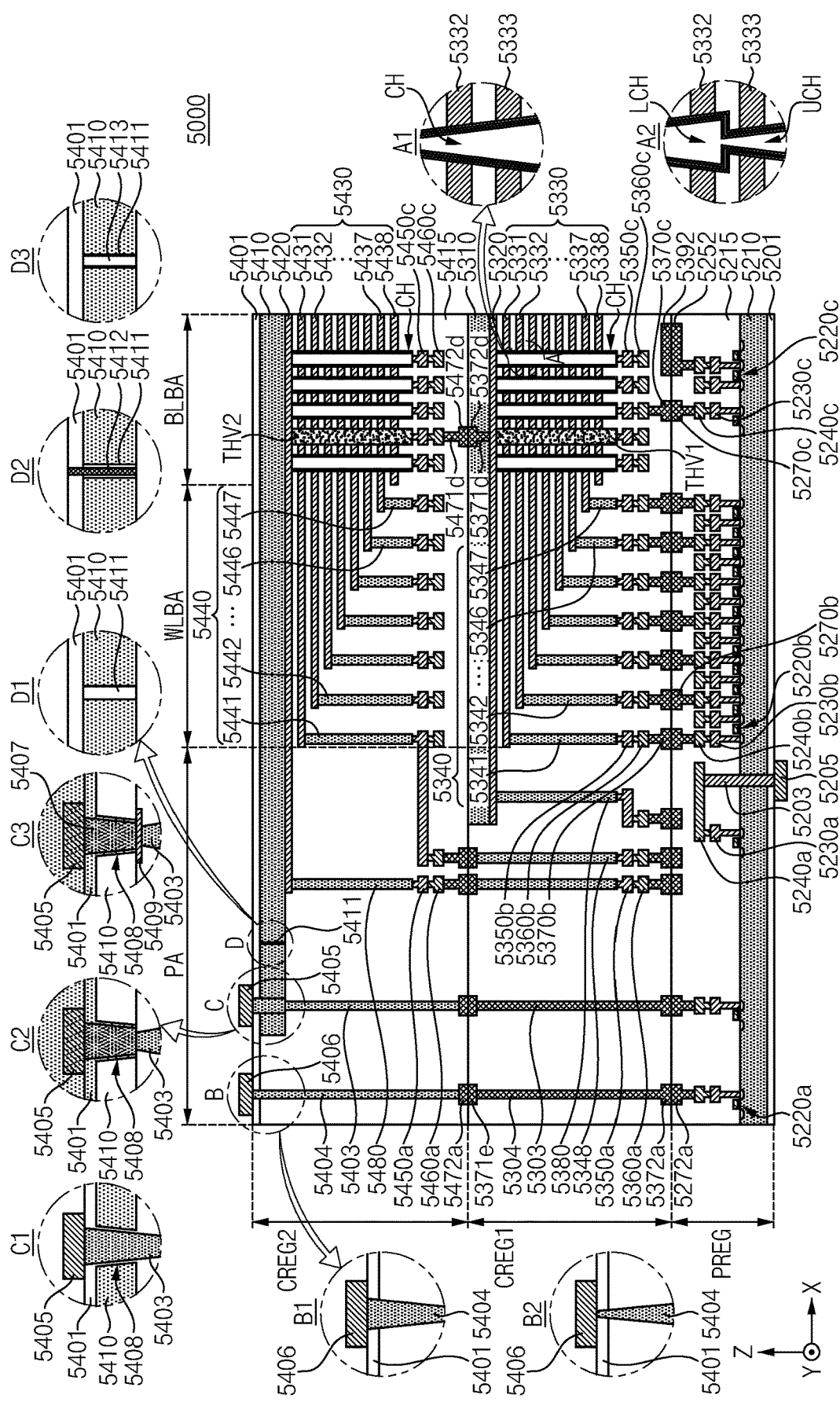
FIG. 40 is a cross-sectional view of a semiconductor device according to example embodiments.

FIG. 40 is a cross-sectional view of a semiconductor device according to example embodiments.

Referring to FIG. 40, a semiconductor device 5000 may be a nonvolatile memory device. Hereinafter, the semiconductor device 5000 will be referred to as a memory device. The memory device 5000 may have a chip-to-chip (C2C) structure. At least one upper chip including a cell region and a lower chip including a peripheral circuit region PREG may be manufactured separately, and then, the at least one upper chip and the lower chip may be connected to each other by a bonding method to realize the C2C structure. For example, the bonding method may mean a method of electrically or physically connecting a bonding metal pattern formed in an uppermost metal layer of the upper chip to a bonding metal pattern formed in an uppermost metal layer of the lower chip. For example, in a case in which the bonding metal patterns are formed of copper (Cu), the bonding method may be a Cu—Cu bonding method. Alternatively, the bonding metal patterns may be formed of aluminum (Al) or tungsten (W).

The memory device 5000 may include the at least one upper chip including the cell region. For example, as illustrated in FIG. 40, the memory device 5000 may include two upper chips. However, the number of the upper chips is not limited thereto. In the case in which the memory device 5000 includes the two upper chips, a first upper chip including a first cell region CREG1, a second upper chip including a second cell region CREG2 and the lower chip including the peripheral circuit region PREG may be manufactured separately, and then, the first upper chip, the second upper chip and the lower chip may be connected to each other by the bonding method to manufacture the memory device 5000. The first upper chip may be turned over and then may be connected to the lower chip by the bonding method, and the second upper chip may also be turned over and then may be connected to the first upper chip by the bonding method. Hereinafter, upper and lower portions of each of the first and second upper chips will be defined based on before each of the first and second upper chips is turned over. In this regard, an upper portion of the lower chip may mean an upper portion defined based on a +Z-axis direction, and the upper portion of each of the first and second upper chips may mean an upper portion defined based on a −Z-axis direction in FIG. 40. However, example embodiments of the present disclosures are not limited thereto. In some example embodiments, one of the first upper chip and the second upper chip may be turned over and then may be connected to a corresponding chip by the bonding method.

The peripheral circuit region PREG and the first and second cell regions CREG1 and CREG2 of the memory device 5000 may be referred to as a first layer, a second layer and a third layer, respectively, and the memory device 5000 may include M layers stacked in a vertical direction. Here, M is a natural number greater than two.

The detection structure according to example embodiments may be disposed in each of the M layers and the detection circuit may determine whether a defect is present in each of the M layers or in entire M layers based on a test input signal. In this case, the detection structure may include a conduction loop and the conduction loop may include bonding metals connecting a portion of top horizontal line segments of an upper layer of adjacent layers from among the M layers and a portion of bottom horizontal line segments of a lower layer of the adjacent layers.

Each of the peripheral circuit region PREG and the first and second cell regions CREG1 and CREG2 of the memory device 5000 may include an external pad bonding region PA, a word-line bonding region WLBA, and a bit-line bonding region BLBA.

The peripheral circuit region PREG may include a first substrate 5210 and a plurality of circuit elements 5220$a$, 5220$b$ and 5220$c$ formed on the first substrate 5210. An interlayer insulating layer 5215 including one or more insulating layers may be provided on the plurality of circuit elements 5220$a$, 5220$b$ and 5220$c$, and a plurality of metal lines electrically connected to the plurality of circuit elements 5220$a$, 5220$b$ and 5220$c$ may be provided in the interlayer insulating layer 5215. For example, the plurality of metal lines may include first metal lines 5230$a$, 5230$b$ and 5230$c$ connected to the plurality of circuit elements 5220$a$, 5220$b$ and 5220$c$, and second metal lines 5240$a$, 5240$b$ and 5240$c$ formed on the first metal lines 5230$a$, 5230$b$ and 5230$c$. The plurality of metal lines may be formed of at least one of various conductive materials. For example, the first metal lines 5230$a$, 5230$b$ and 5230$c$ may be formed of tungsten having a relatively high electrical resistivity, and the second metal lines 5240$a$, 5240$b$ and 5240$c$ may be formed of copper having a relatively low electrical resistivity.

Examples of the first metal lines 5230$a$, 5230$b$ and 5230$c$ and the second metal lines 5240$a$, 5240$b$ and 5240$c$ are illustrated and described. However, example embodiments of the present disclosures are not limited thereto. In some example embodiments, at least one or more additional metal lines may further be formed on the second metal lines 5240$a$, 5240$b$ and 5240$c$. In this case, the second metal lines 5240$a$, 5240$b$ and 5240$c$ may be formed of aluminum, and at least some of the additional metal lines formed on the second metal lines 5240$a$, 5240$b$ and 5240$c$ may be formed of copper having an electrical resistivity lower than that of aluminum of the second metal lines 5240$a$, 5240$b$ and 5240$c$.

The interlayer insulating layer 5215 may be disposed on the first substrate 5210 and may include an insulating material such as silicon oxide and/or silicon nitride.

Each of the first and second cell regions CREG1 and CREG2 may include at least one memory block. The first cell region CREG1 may include a second substrate 5310 and a common source line 5320. A plurality of word-lines 5330 (5331 to 5338) may be stacked on the second substrate 5310 in a direction (i.e., the Z-axis direction) perpendicular to a top surface of the second substrate 5310. String selection lines and a ground selection line may be disposed on and under the word-lines 5330, and the plurality of word-lines 5330 may be disposed between the string selection lines and the ground selection line. Likewise, the second cell region CREG2 may include a third substrate 5410 and a common source line 5420, and a plurality of word-lines 5430 (5431 to 5438) may be stacked on the third substrate 5410 in a direction (i.e., the Z-axis direction) perpendicular to a top surface of the third substrate 5410. Each of the second substrate 5310 and the third substrate 5410 may be formed of at least one of various materials and may be, for example, a silicon substrate, a silicon-germanium substrate, a germanium substrate, or a substrate having a single-crystalline epitaxial layer grown on a single-crystalline silicon substrate. A plurality of channel structures CH may be formed in each of the first and second cell regions CREG1 and CREG2.

In some example embodiments, as illustrated in a region 'A1', the channel structure CH may be provided in the bit-line bonding region BLBA and may extend in the direction perpendicular to the top surface of the second substrate 5310 to penetrate the word-lines 5330, the string selection lines, and the ground selection line. The channel structure CH may include a data storage layer, a channel layer, and a filling insulation layer. The channel layer may be electrically connected to a first metal line 5350c and a second metal line 5360c in the bit-line bonding region BLBA. For example, the second metal line 5360c may be a bit-line and may be connected to the channel structure CH through the first metal line 5350c. The bit-line 5360c may extend in a first direction (e.g., a Y-axis direction) parallel to the top surface of the second substrate 5310.

In some example embodiments, as illustrated in a region 'A2', the channel structure CH may include a lower channel LCH and an upper channel UCH, which are connected to each other. For example, the channel structure CH may be formed by a process of forming the lower channel LCH and a process of forming the upper channel UCH. The lower channel LCH may extend in the direction perpendicular to the top surface of the second substrate 5310 to penetrate the common source line 5320 and lower word-lines 5331 and 5332. The lower channel LCH may include a data storage layer, a channel layer, and a filling insulation layer and may be connected to the upper channel UCH. The upper channel UCH may penetrate upper word-lines 5333 to 5338. The upper channel UCH may include a data storage layer, a channel layer, and a filling insulation layer, and the channel layer of the upper channel UCH may be electrically connected to the first metal line 5350c and the second metal line 5360c. As a length of a channel increases, due to characteristics of manufacturing processes, it may be difficult to form a channel having a substantially uniform width. The memory device 5000 according to example embodiments may include a channel having improved width uniformity due to the lower channel LCH and the upper channel UCH which are formed by the processes performed sequentially.

In the case in which the channel structure CH includes the lower channel LCH and the upper channel UCH as illustrated in the region 'A2', a word-line located near to a boundary between the lower channel LCH and the upper channel UCH may be a dummy word-line. For example, the word-lines 5332 and 5333 adjacent to the boundary between the lower channel LCH and the upper channel UCH may be the dummy word-lines. In this case, data may not be stored in memory cells connected to the dummy word-line. Alternatively, the number of pages corresponding to the memory cells connected to the dummy word-line may be less than the number of pages corresponding to the memory cells connected to a general word-line. A level of a voltage applied to the dummy word-line may be different from a level of a voltage applied to the general word-line, and thus it is possible to reduce an influence of a non-uniform channel width between the lower and upper channels LCH and UCH on an operation of the memory device.

The number of the lower word-lines 5331 and 5332 penetrated by the lower channel LCH is less than the number of the upper word-lines 5333 to 5338 penetrated by the upper channel UCH in the region 'A2'. However, example embodiments of the present disclosures are not limited thereto. In some example embodiments, the number of the lower word-lines penetrated by the lower channel LCH may be equal to or more than the number of the upper word-lines penetrated by the upper channel UCH. In addition, structural features and connection relation of the channel structure CH disposed in the second cell region CREG2 may be substantially the same as those of the channel structure CH disposed in the first cell region CREG1.

In the bit-line bonding region BLBA, a first through-electrode THV1 may be provided in the first cell region CREG1, and a second through-electrode THV2 may be provided in the second cell region CREG2. As illustrated in FIG. 29, the first through-electrode THV1 may penetrate the common source line 5320 and the plurality of word-lines 5330. In some example embodiments, the first through-electrode THV1 may further penetrate the second substrate 5310. The first through-electrode THV1 may include a conductive material. Alternatively, the first through-electrode THV1 may include a conductive material surrounded by an insulating material. The second through-electrode THV2 may have the same shape and structure as the first through-electrode THV1.

In some example embodiments, the first through-electrode THV1 and the second through-electrode THV2 may be electrically connected to each other through a first through-metal pattern 5372d and a second through-metal pattern 5472d. The first through-metal pattern 5372d may be formed at a bottom end of the first upper chip including the first cell region CREG1, and the second through-metal pattern 5472d may be formed at a top end of the second upper chip including the second cell region CREG2. The first through-electrode THV1 may be electrically connected to the first metal line 5350c and the second metal line 5360c. A lower via 5371d may be formed between the first through-electrode THV1 and the first through-metal pattern 5372d, and an upper via 5471d may be formed between the second through-electrode THV2 and the second through-metal pattern 5472d. The first through-metal pattern 5372d and the second through-metal pattern 5472d may be connected to each other by the bonding method.

In addition, in the bit-line bonding region BLBA, an upper metal pattern 5252 may be formed in an uppermost metal layer of the peripheral circuit region PERI, and an upper metal pattern 5392 having the same shape as the upper metal pattern 5252 may be formed in an uppermost metal layer of the first cell region CREG1. The upper metal pattern 5392 of the first cell region CREG1 and the upper metal pattern 5252 of the peripheral circuit region PREG may be electrically connected to each other by the bonding method. In the bit-line bonding region BLBA, the bit-line 5360c may be electrically connected to a page buffer included in the peripheral circuit region PERI. For example, some of the circuit elements 5220c of the peripheral circuit region PREG may constitute the page buffer, and the bit-line 5360c may be electrically connected to the circuit elements 5220c constituting the page buffer through an upper bonding metal pattern 5370c of the first cell region CREG1 and an upper bonding metal pattern 5270c of the peripheral circuit region PERI.

Referring continuously to FIG. 29, in the word-line bonding region WLBA, the word-lines 5330 of the first cell region CREG1 may extend in a second direction (e.g., an X-axis direction) parallel to the top surface of the second substrate 5310 and may be connected to a plurality of cell contact plugs 5340 (5341 to 5347). First metal lines 5350b and second metal lines 5360b may be sequentially connected onto the cell contact plugs 5340 connected to the word-lines 5330. In the word-line bonding region WLBA, the cell contact plugs 5340 may be connected to the peripheral circuit region PREG through upper bonding metal patterns 5370b of the first cell region CREG1 and upper bonding metal patterns 5270b of the peripheral circuit region PERI.

The cell contact plugs 5340 may be electrically connected to a row decoder included in the peripheral circuit region PERI. For example, some of the circuit elements 5220b of the peripheral circuit region PREG may constitute the row decoder, and the cell contact plugs 5340 may be electrically connected to the circuit elements 5220b constituting the row decoder through the upper bonding metal patterns 5370b of the first cell region CREG1 and the upper bonding metal patterns 5270b of the peripheral circuit region PERI. In some example embodiments, an operating voltage of the circuit elements 5220b constituting the row decoder may be different from an operating voltage of the circuit elements 5220c constituting the page buffer. For example, the operating voltage of the circuit elements 5220c constituting the page buffer may be greater than the operating voltage of the circuit elements 5220b constituting the row decoder.

Likewise, in the word-line bonding region WLBA, the word-lines 5430 of the second cell region CREG2 may extend in the second direction (e.g., the X-axis direction) parallel to the top surface of the third substrate 5410 and may be connected to a plurality of cell contact plugs 5440 (5441 to 5447). The cell contact plugs 5440 may be connected to the peripheral circuit region PREG through an upper metal pattern of the second cell region CREG2 and lower and upper metal patterns and a cell contact plug 5348 of the first cell region CREG1.

In the word-line bonding region WLBA, the upper bonding metal patterns 5370b may be formed in the first cell region CREG1, and the upper bonding metal patterns 5270b may be formed in the peripheral circuit region PERI. The upper bonding metal patterns 5370b of the first cell region CREG1 and the upper bonding metal patterns 5270b of the peripheral circuit region PREG may be electrically connected to each other by the bonding method. The upper bonding metal patterns 5370b and the upper bonding metal patterns 5270b may be formed of aluminum, copper, or tungsten.

In the external pad bonding region PA, a lower metal pattern 5371e may be formed in a lower portion of the first cell region CREG1, and an upper metal pattern 5472a may be formed in an upper portion of the second cell region CREG2. The lower metal pattern 5371e of the first cell region CREG1 and the upper metal pattern 5472a of the second cell region CREG2 may be connected to each other by the bonding method in the external pad bonding region PA. Likewise, an upper metal pattern 5372a may be formed in an upper portion of the first cell region CREG1, and an upper metal pattern 5272a may be formed in an upper portion of the peripheral circuit region PERI. The upper metal pattern 5372a of the first cell region CREG1 and the upper metal pattern 5272a of the peripheral circuit region PREG may be connected to each other by the bonding method.

Common source line contact plugs 5380 and 5480 may be disposed in the external pad bonding region PA. The common source line contact plugs 5380 and 5480 may be formed of a conductive material such as a metal, a metal compound, and/or doped polysilicon. The common source line contact plug 5380 of the first cell region CREG1 may be electrically connected to the common source line 5320, and the common source line contact plug 5480 of the second cell region CREG2 may be electrically connected to the common source line 5420. A first metal line 5350a and a second metal line 5360a may be sequentially stacked on the common source line contact plug 5380 of the first cell region CREG1, and a first metal line 5450a and a second metal line 5460a may be sequentially stacked on the common source line contact plug 5480 of the second cell region CREG2.

Input/output pads 5205, 5405 and 5406 may be disposed in the external pad bonding region PA. Referring to FIG. 29, a lower insulating layer 5201 may cover a bottom surface of the first substrate 5210, and a first input/output pad 5205 may be formed on the lower insulating layer 5201. The first input/output pad 5205 may be connected to at least one of a plurality of the circuit elements 5220a disposed in the peripheral circuit region PREG through a first input/output contact plug 5203 and may be separated from the first substrate 5210 by the lower insulating layer 5201. In addition, a side insulating layer may be disposed between the first input/output contact plug 5203 and the first substrate 5210 to electrically isolate the first input/output contact plug 5203 from the first substrate 5210.

An upper insulating layer 5401 covering a top surface of the third substrate 5410 may be formed on the third substrate 5410. A second input/output pad 5405 and/or a third input/output pad 5406 may be disposed on the upper insulating layer 5401. The second input/output pad 5405 may be connected to at least one of the plurality of circuit elements 5220a disposed in the peripheral circuit region PREG through second input/output contact plugs 5403 and 5303, and the third input/output pad 5406 may be connected to at least one of the plurality of circuit elements 5220a disposed in the peripheral circuit region PREG through third input/output contact plugs 5404 and 5304.

In some example embodiments, the third substrate 5410 may not be disposed in a region in which the input/output contact plug is disposed. For example, as illustrated in a region 'B', the third input/output contact plug 5404 may be separated from the third substrate 5410 in a direction parallel to the top surface of the third substrate 5410 and may penetrate an interlayer insulating layer 5415 of the second cell region CREG2 so as to be connected to the third input/output pad 5406. In this case, the third input/output contact plug 5404 may be formed by at least one of various processes.

In some example embodiments, as illustrated in a region 'B1', the third input/output contact plug 5404 may extend in a third direction (e.g., the Z-axis direction), and a diameter of the third input/output contact plug 5404 may become progressively greater toward the upper insulating layer 5401. In this regard, a diameter of the channel structure CH described in the region 'A1' may become progressively less toward the upper insulating layer 5401, but the diameter of the third input/output contact plug 5404 may become progressively greater toward the upper insulating layer 5401. For example, the third input/output contact plug 5404 may be formed after the second cell region CREG2 and the first cell region CREG1 are bonded to each other by the bonding method.

In some example embodiments, as illustrated in a region 'B2', the third input/output contact plug 5404 may extend in the third direction (e.g., the Z-axis direction), and a diameter of the third input/output contact plug 5404 may become progressively less toward the upper insulating layer 5401. In this regard, like the channel structure CH, the diameter of the third input/output contact plug 5404 may become progressively less toward the upper insulating layer 5401. For example, the third input/output contact plug 5404 may be formed together with the cell contact plugs 5440 before the second cell region CREG2 and the first cell region CREG1 are bonded to each other.

In some example embodiments, the input/output contact plug may overlap with the third substrate 5410. For example, as illustrated in a region 'C', the second input/output contact plug 5403 may penetrate the interlayer insulating layer 5415 of the second cell region CREG2 in the third direction (e.g., the Z-axis direction) and may be electrically connected to the second input/output pad 5405 through the third substrate 5410. In this case, a connection structure of the second input/output contact plug 5403 and the second input/output pad 5405 may be realized by various methods.

In some example embodiments, as illustrated in a region 'C1', an opening 5408 may be formed to penetrate the third substrate 5410, and the second input/output contact plug 5403 may be connected directly to the second input/output pad 5405 through the opening 5408 formed in the third substrate 5410. In this case, as illustrated in the region 'C1', a diameter of the second input/output contact plug 5403 may become progressively greater toward the second input/output pad 5405. However, example embodiments of the present disclosures are not limited thereto, and in some example embodiments, the diameter of the second input/output contact plug 5403 may become progressively less toward the second input/output pad 5405.

In some example embodiments, as illustrated in a region 'C2', the opening 5408 penetrating the third substrate 5410 may be formed, and a contact 5407 may be formed in the opening 5408. An end of the contact 5407 may be connected to the second input/output pad 5405, and another end of the contact 5407 may be connected to the second input/output contact plug 5403. Thus, the second input/output contact plug 5403 may be electrically connected to the second input/output pad 5405 through the contact 5407 in the opening 5408. In this case, as illustrated in the region 'C2', a diameter of the contact 5407 may become progressively greater toward the second input/output pad 5405, and a diameter of the second input/output contact plug 5403 may become progressively less toward the second input/output pad 5405. For example, the second input/output contact plug 5403 may be formed together with the cell contact plugs 5440 before the second cell region CREG2 and the first cell region CREG1 are bonded to each other, and the contact 5407 may be formed after the second cell region CREG2 and the first cell region CREG1 are bonded to each other.

In some example embodiments illustrated in a region 'C3', a stopper 5409 may further be formed on a bottom end of the opening 5408 of the third substrate 5410, as compared with the embodiments of the region 'C2'. The stopper 5409 may be a metal line formed in the same layer as the common source line 5420. Alternatively, the stopper 5409 may be a metal line formed in the same layer as at least one of the word-lines 5430. The second input/output contact plug 5403 may be electrically connected to the second input/output pad 5405 through the contact 5407 and the stopper 5409.

Like the second and third input/output contact plugs 5403 and 5404 of the second cell region CREG2, a diameter of each of the second and third input/output contact plugs 5303 and 5304 of the first cell region CREG1 may become progressively less toward the lower metal pattern 5371*e* or may become progressively greater toward the lower metal pattern 5371*e*.

In some embodiments, a slit 5411 may be formed in the third substrate 5410. For example, the slit 5411 may be formed at a certain position of the external pad bonding region PA. For example, as illustrated in a region 'D', the slit 5411 may be located between the second input/output pad 5405 and the cell contact plugs 5440 when viewed in a plan view. Alternatively, the second input/output pad 5405 may be located between the slit 5411 and the cell contact plugs 5440 when viewed in a plan view.

In some embodiments, as illustrated in a region 'D1', the slit 5411 may be formed to penetrate the third substrate 5410. For example, the slit 5411 may be used to prevent the third substrate 5410 from being finely cracked when the opening 5408 is formed. However, embodiments of the present disclosures are not limited thereto, and in some example embodiments, the slit 5411 may be formed to have a depth ranging from about 60% to about 70% of a thickness of the third substrate 5410.

In some example embodiments, as illustrated in a region 'D2', a conductive material 5412 may be formed in the slit 5411. For example, the conductive material 5412 may be used to discharge a leakage current occurring in driving of the circuit elements in the external pad bonding region PA to the outside. In this case, the conductive material 5412 may be connected to an external ground line.

In some example embodiments, as illustrated in a region 'D3', an insulating material 5413 may be formed in the slit 5411. For example, the insulating material 5413 may be used to electrically isolate the second input/output pad 5405 and the second input/output contact plug 5403 disposed in the external pad bonding region PA from the word-line bonding region WLBA. Since the insulating material 5413 is formed in the slit 5411, it is possible to prevent a voltage provided through the second input/output pad 5405 from affecting a metal layer disposed on the third substrate 5410 in the word-line bonding region WLBA.

In some example embodiments, the first to third input/output pads 5205, 5405 and 5406 may be selectively formed. For example, the memory device 5000 may be realized to include only the first input/output pad 5205 disposed on the first substrate 5210, to include only the second input/output pad 5405 disposed on the third substrate 5410, or to include only the third input/output pad 5406 disposed on the upper insulating layer 5401.

In some embodiments, at least one of the second substrate 5310 of the first cell region CREG1 or the third substrate 5410 of the second cell region CREG2 may be used as a sacrificial substrate and may be completely or partially removed before or after a bonding process. An additional layer may be stacked after the removal of the substrate. For example, the second substrate 5310 of the first cell region CREG1 may be removed before or after the bonding process of the peripheral circuit region PREG and the first cell region CREG1, and then, an insulating layer covering a top surface of the common source line 5320 or a conductive layer for connection may be formed. Likewise, the third substrate 5410 of the second cell region CREG2 may be removed before or after the bonding process of the first cell region CREG1 and the second cell region CREG2, and then, the upper insulating layer 5401 covering a top surface of the common source line 5420 or a conductive layer for connection may be formed.

A detection structure according to example embodiments may be may be applied to any electronic devices and systems formed using semiconductor dies. For example, the present disclosure may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, an automotive, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims.

What is claimed is:

1. A semiconductor device comprising:
   a semiconductor die comprising a central region in which a semiconductor integrated circuit is provided and an external region surrounding the central region;
   a detection structure provided in the external region;
   a path control circuit comprising a plurality of switches configured to control electrical connections of the detection structure; and
   a detection circuit configured to determine whether a defect is present in the semiconductor die and a location of the defect based on a difference signal, the difference signal corresponding to a difference between a forward direction test output signal and a backward direction test output signal obtained by propagating a test input signal through the detection structure in a forward direction and a backward direction, respectively, via the path control circuit.

2. The semiconductor device of claim 1, wherein the detection structure comprises:
   a first conduction segment connected to the path control circuit through an input end node and extending through a left-bottom corner region of the external region;
   a second conduction segment connected to the first conduction segment at a first node and extending through a left-upper corner region of the external region;
   a third conduction segment connected to the second conduction segment at a second node and extending through a right-upper corner region of the external region; and
   a fourth conduction segment connected to the third conduction segment at a third node and extending through a right-bottom corner region of the external region, the fourth conduction segment being connected to the path control circuit through an output end node.

3. The semiconductor device of claim 2, wherein the detection circuit is further configured to determine that the defect is present in one of the first conduction segment and the second conduction segment based on the difference signal having a positive value.

4. The semiconductor device of claim 3, wherein the detection circuit is further configured to:
   determine that the defect is present in the first conduction segment based on the difference signal having a first value greater than zero; and
   determine that the defect is present in the second conduction segment based on the difference signal having a second value that is between zero and the first value.

5. The semiconductor device of claim 2, wherein the detection circuit is further configured to determine that the defect is present in one of the third conduction segment and the fourth conduction segment based on the difference signal having a negative value.

6. The semiconductor device of claim 5, wherein the detection circuit is further configured to:
   determine that the defect is present in the third conduction segment based on the difference signal having a first value less than zero; and
   determine that the defect is present in the fourth conduction segment based on the difference signal having a second value that is between zero and the first value.

7. The semiconductor device of claim 2, wherein the path control circuit comprises:
   a first input switch connected between a test input pad configured to receive the test input signal and the input end node;
   a second input switch connected to the test input pad in parallel with the first input switch;
   a first output switch connected between the second input switch and a test output pad at which the forward direction test output signal and the backward direction test output signal are output; and
   a second output switch connected between the first input switch and the test output pad, and
   wherein the detection circuit is further configured to apply a first selection signal to the first input switch and the second input switch, and apply a second selection signal to the first output switch and the second output switch.

8. The semiconductor device of claim 2, wherein the detection structure further comprises:
   a fifth conduction segment connected between the input end node and the first node in parallel with the first conduction segment;
   a sixth conduction segment connected between the output end node and the third node in parallel with the fourth conduction segment;
   a seventh conduction segment connected between the input end node and the second node in parallel with the first conduction segment and the second conduction segment; and
   an eighth conduction segment connected between the output end node and the second node in parallel with the fourth conduction segment and the third conduction segment; and
   wherein the path control circuit comprises:
   a first input switch connected between a test input pad receiving the test input signal and the input end node;
   a second input switch connected to the test input pad in parallel with the first input switch;
   a first output switch connected between the second input switch and a test output pad at which the forward direction test output signal and the backward direction test output signal are output;

a second output switch connected between the first input switch and the test output pad;

a plurality of additional input switches connected to the test input pad, the fifth conduction segment and the seventh conduction segment; and a plurality of additional output switches connected to the test output pad, the sixth conduction segment and the eighth conduction segment.

9. The semiconductor device of claim 8, wherein the detection circuit is further configured to:

determine whether the defect is present in a first region comprising the first conduction segment by propagating the test input signal through the first conduction segment, the first node and the fifth conduction segment;

determine whether the defect is present in a second region comprising the second conduction segment by propagating the test input signal through the seventh conduction segment, the second node, the second conduction segment, the first node and the fifth conduction segment;

determine whether the defect is present in a third region comprising the third conduction segment by propagating the test input signal through the eighth conduction segment, the second node, the third conduction segment, the third node and the fourth conduction segment; and determine whether the defect is present in a fourth region comprising the fourth conduction segment by propagating the test input signal through the fourth conduction segment, the third node and the sixth conduction segment.

10. The semiconductor device of claim 1, wherein the detection structure is a three-dimensional detection structure provided in an annular shape in the external region to surround the central region, and extending in a vertical direction.

11. The semiconductor device of claim 10, wherein the semiconductor die comprises a first conduction layer and a second conduction layer below the first conduction layer, wherein the three-dimensional detection structure comprises a conduction loop that extends in the vertical direction through the first conduction layer and the second conduction layer, wherein the conduction loop comprises:

a plurality of top horizontal line segments provided in the first conduction layer;

a plurality of bottom horizontal line segments provided in the second conduction layer; and a plurality of vertical line segments connecting the plurality of top horizontal line segments and the plurality of bottom horizontal line segments to form the conduction loop, and wherein the detection circuit is further configured to determine whether the defect is present in the first conduction layer and the second conduction layer.

12. The semiconductor device of claim 10, wherein the semiconductor die comprises M layers stacked in the vertical direction, M being a natural number greater than two, wherein each of the M layers comprises a first conduction layer and a second conduction layer below the first conduction layer, wherein the detection structure comprises a conduction loop that extends in the vertical direction through the first conduction layer and the second conduction layer of the M layers, wherein the conduction loop comprises:

a plurality of top horizontal line segments provided in the first conduction layer;

a plurality of bottom horizontal line segments provided in the second conduction layer;

a plurality of vertical line segments connecting the plurality of top horizontal line segments and the plurality of bottom horizontal line segments to form the conduction loop;

bonding metals connecting a portion of top horizontal line segments of an upper layer of adjacent layers from among the M layers and a portion of bottom horizontal line segments of a lower layer of the adjacent layers, and wherein the detection circuit is further configured to determine whether the defect is present in the M layers.

13. The semiconductor device of claim 1, wherein the test input signal is generated inside the semiconductor device or outside of the semiconductor device and is applied to the detection structure via the path control circuit, wherein the test input signal comprises at least one of a pulse and a direct current (DC) voltage, and wherein the difference signal comprises one of a difference of propagation delay of the pulse, a difference of an amplitude of the DC voltage, a difference of propagation delay of the pulse based on operating of the semiconductor device and a difference of an amplitude of the DC voltage based on the operating of the semiconductor device.

14. The semiconductor device of claim 1, wherein the defect comprises at least one of a short circuit, a crack, a progressive fault, a bonding fault and a separation phenomenon, and wherein the semiconductor device comprises one of a volatile memory device and a nonvolatile memory device.

15. A semiconductor device comprising:

a first semiconductor die stacked on a second semiconductor die, each of the first semiconductor die and the second semiconductor die comprising a central region and an external region surrounding the central region;

a memory cell structure provided in the central region of the first semiconductor die;

a peripheral circuit provided in the central region of the second semiconductor die and extending in a first direction and a second direction;

a first detection structure provided in the central region of the second semiconductor die and surrounding each of a first sub circuit region and a second sub circuit region which are spaced apart from each other in the second direction in the peripheral circuit;

a first path control circuit comprising a plurality of first switches configured to control electrical connections of the first detection structure; and a detection circuit configured to determine whether a defect is present in the semiconductor device based on a difference signal, the difference signal corresponding to a difference between a forward direction test output signal and a backward direction test output signal obtained by propagating a test input signal through the first detection structure in a forward direction and a backward direction, respectively, via the first path control circuit.

16. The semiconductor device of claim 15, further comprising:

a second detection structure provided in the central region of the second semiconductor die and surrounding each of a third sub circuit region and a fourth sub circuit region, which are spaced apart from the first sub circuit region and the second sub circuit region in the first direction, in the peripheral circuit; and a second path control circuit comprising a plurality of second switches configured to control electrical connection of the second detection structure, wherein the third sub circuit region and the fourth sub circuit region are spaced apart from each other in the second direction, and wherein the detection circuit is further configured to determine a location of the defect in the semiconductor device based on a difference between a first test output signal and a second direction test output signal obtained by propagating the test input signal through the first detection structure and the second detection structure, respectively.

17. The semiconductor device of claim 15, wherein the first detection structure is provided by:

connecting alternatingly an upper bonding metal of the first semiconductor die to an upper metal layer above the upper bonding metal in the first direction or the second direction at edges of the first sub circuit region and the second sub circuit region; and connecting alternatingly a lower bonding metal of the second semiconductor die to a lower metal layer below the lower bonding metal in the first direction or the second direction at the edges of the first sub circuit region and the second sub circuit region.

18. The semiconductor device of claim 17, wherein the first semiconductor die is provided in a first semiconductor wafer, wherein the second semiconductor die is provided in a second semiconductor wafer, and wherein the semiconductor device is provided after bonding the first semiconductor wafer and the second semiconductor wafer and cutting the bonded first and second semiconductor wafers.

19. A semiconductor device comprising a plurality of chips are bonded to each other, the semiconductor device comprising:

a chip region;

a scribe lane along an edge of the chip region;

a dam structure between the chip region and the scribe lane;

a detection structure extending from the chip region to the scribe lane through the dam structure, the detection structure forming an annular shape in the scribe lane;

a path control circuit comprising a plurality of switches configured to control electrical connections of the detection structure; and a detection circuit provided in the chip region, wherein the detection circuit is configured to determine whether a defect is present in the scribe lane and a location of the defect based on a difference signal corresponding to a difference between a forward direction test output signal and a backward direction test output signal obtained by propagating a test input signal through the detection structure in a forward direction and a backward direction, respectively, via the path control circuit.

20. The semiconductor device of claim 19, wherein the plurality of chips comprises a first chip and a second chip on the first chip, the first chip having a first bonding metal pattern and the second chip having a second bonding metal pattern corresponding to the first bonding metal pattern, wherein the first bonding metal pattern and the second bonding metal pattern are bonded to each other such that the first chip and the second chip are connected to each other, and wherein in the scribe lane, the detection structure comprises the first bonding metal pattern and the second bonding metal pattern.

* * * * *